US012751026B2

(12) United States Patent
Gatto

(10) Patent No.: US 12,751,026 B2
(45) Date of Patent: Sep. 29, 2026

(54) SEMICONDUCTOR DEVICE, SEMICONDUCTOR DEVICE CONTROL METHOD, AND SEMICONDUCTOR DEVICE MANUFACTURING METHOD TO INCREASE ALLOWABLE RANGE OF TRANSITION TIME DIFFERENCE BETWEEN TWO SIGNALS

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 392 days.

(21) Appl. No.: 18/414,423

(22) Filed: Jan. 16, 2024

(65) Prior Publication Data

US 2024/0313094 A1 Sep. 19, 2024

(30) Foreign Application Priority Data

Mar. 15, 2023 (JP) ................................ 2023-040222

(51) Int. Cl.
*H10D 12/00* (2025.01)
*H10D 12/01* (2025.01)
*H10P 30/20* (2026.01)

(52) U.S. Cl.
CPC ......... *H10D 12/481* (2025.01); *H10D 12/038* (2025.01); *H10P 30/204* (2026.01); *H10P 30/21* (2026.01)

(58) Field of Classification Search
CPC .. H10D 12/481; H10D 12/038; H10P 30/204; H10P 30/21

(Continued)

(56) References Cited

U.S. PATENT DOCUMENTS 9,023,692 B2 * 5/2015 Yoshida ............... H10D 12/038 257/172
9,502,546 B2 * 11/2016 Naito ................... H10D 12/481
(Continued)

FOREIGN PATENT DOCUMENTS

JP 2016-154218 A 8/2016
JP 2019-186318 A 10/2019
JP 2021-048337 A 3/2021

OTHER PUBLICATIONS

"Notice of Reasons for Refusal" Office Action issued in JP 2023-040222; mailed by the Japanese Patent Office on Feb. 3, 2026.

*Primary Examiner* — Jami Valentine Miller
(74) *Attorney, Agent, or Firm* — Studebaker Brackett PLLC

(57) ABSTRACT

A semiconductor device includes: a semiconductor substrate; a first semiconductor layer and a second semiconductor layer located in a surface layer of the semiconductor substrate to be excluded from each other; a third semiconductor layer located on an opposite side of the first semiconductor layer and the second semiconductor layer from the semiconductor substrate; a fourth semiconductor layer and a fifth semiconductor layer located on an opposite side of the third semiconductor layer from the semiconductor substrate to be excluded from each other; and a first electrode, a second electrode, and a third electrode each having an insulating surface, and the first electrode extends through the fifth semiconductor layer, and the third semiconductor layer to reach the first semiconductor layer.

19 Claims, 36 Drawing Sheets

(58) Field of Classification Search
USPC .......................................................... 257/139
See application file for complete search history.

(56) References Cited

U.S. PATENT DOCUMENTS

| | | | | |
|---|---|---|---|---|
| 10,439,056 | B2 * | 10/2019 | Arai | H10D 12/481 |
| 11,437,508 | B2 * | 9/2022 | Kobayashi | H10D 62/153 |
| 2016/0190123 | A1 | 6/2016 | Laven et al. | |
| 2018/0166539 | A1 * | 6/2018 | Chun | H10D 62/8325 |
| 2019/0109215 | A1 * | 4/2019 | Yamashita | H10D 62/111 |
| 2019/0165162 | A1 * | 5/2019 | Kobayashi | H10D 30/668 |
| 2019/0312113 | A1 | 10/2019 | Chen | |
| 2020/0083369 | A1 * | 3/2020 | Kobayashi | H10D 30/668 |
| 2021/0091193 | A1 | 3/2021 | Iwakaji et al. | |
| 2021/0111743 | A1 * | 4/2021 | Tsuchida | H04B 1/04 |
| 2022/0123133 | A1 * | 4/2022 | Kubouchi | H10D 8/422 |
| 2022/0149191 | A1 * | 5/2022 | Shirakawa | H10D 8/422 |
| 2024/0297214 | A1 * | 9/2024 | Hu | H10D 62/111 |

* cited by examiner

SEMICONDUCTOR DEVICE, SEMICONDUCTOR DEVICE CONTROL METHOD, AND SEMICONDUCTOR DEVICE MANUFACTURING METHOD TO INCREASE ALLOWABLE RANGE OF TRANSITION TIME DIFFERENCE BETWEEN TWO SIGNALS

BACKGROUND OF THE INVENTION

Field of the Invention

Technology disclosed herein relates to semiconductor devices.

Description of the Background Art

An insulated gate bipolar transistor (hereinafter referred to as an "IGBT") is known as a semiconductor device. In the IGBT, an impurity layer is disposed in an upper surface of a semiconductor substrate, for example. For example, trenches extending through the impurity layer are arranged periodically. Dielectric layers are provided on side surfaces and bottom surfaces of the trenches. Conductors are provided in the trenches to be surrounded by the dielectric layers. For example, the impurity layer serves as a channel layer, and the semiconductor substrate serves as a drift layer.

The IGBT sometimes uses two types of trenches differing in depth (see Japanese Patent Application Laid-Open No. 2016-154218, for example). For example, a deep trench reaches the semiconductor substrate that is the drift layer, and a shallow trench does not reach the drift layer.

Signals to control operation of the semiconductor device are provided separately to a conductor provided in the deep trench and to a conductor provided in the shallow trench. These signals control a carrier concentration of the channel layer around each of the trenches.

As an example of operation when the IGBT having the above-mentioned configuration is turned off, a sequence described below is envisioned. A first signal is provided to the conductor provided in the shallow trench, and a second signal is provided to the conductor provided in the deep trench: off transition of the second signal is earlier than off transition of the first signal. Herein, "off transition" is transition of a voltage acting to reduce the above-mentioned carrier concentration.

Due to such a sequence, a carrier concentration on a side of the impurity layer of the semiconductor substrate is reduced in advance by off transition of the second signal, and then the semiconductor device is turned off by off transition of the first signal. Such a sequence reduces time spent to turn off the semiconductor device and thereby reduces turn-off loss after off transition of the first signal. On the other hand, reduction in carrier concentration of the semiconductor substrate increases a forward voltage of the semiconductor device and increases forward conduction loss from off transition of the second signal to off transition of the first signal.

A case where the increase in such forward conduction loss exceeds the reduction in turn-off loss after off transition of the first signal is envisioned. In this case, a total amount of loss produced after off transition of the second signal might be larger than that in a case where off transition of the first signal and off transition of the second signal occur in parallel.

As technology to minimize the total amount, optimization of a time difference from off transition of the second signal to off transition of the first signal can be considered. An allowable range of the time difference is narrow, and problems of a variation of the above-mentioned total amount of loss and difficulty in controlling off transition to optimize the time difference are assumed.

SUMMARY

Technology disclosed herein has been conceived in view of such problems, and it is an object to increase an allowable range of a time difference between transition of a first signal and transition of a second signal.

A semiconductor device as a first aspect of technology according to the present disclosure includes: a semiconductor substrate of a first conductivity type; a first semiconductor layer of the first conductivity type located in a surface layer of the semiconductor substrate; a second semiconductor layer of the first conductivity type located in the surface layer of the semiconductor substrate to be excluded from the first semiconductor layer, the second semiconductor layer having a higher peak impurity concentration than the semiconductor substrate; a third semiconductor layer of a second conductivity type located on an opposite side of the first semiconductor layer and the second semiconductor layer from the semiconductor substrate; a fourth semiconductor layer of the second conductivity type selectively located on an opposite side of the third semiconductor layer from the semiconductor substrate, the fourth semiconductor layer having a higher peak impurity concentration than the third semiconductor layer; a fifth semiconductor layer of the first conductivity type located on an opposite side of the third semiconductor layer from the semiconductor substrate to be excluded from the fourth semiconductor layer, the fifth semiconductor layer having a higher peak impurity concentration than the second semiconductor layer; a sixth semiconductor layer of the second conductivity type located on an opposite side of the semiconductor substrate from the first semiconductor layer, the second semiconductor layer, the third semiconductor layer, the fourth semiconductor layer, and the fifth semiconductor layer; a first electrode extending through the fifth semiconductor layer and the third semiconductor layer to reach the first semiconductor layer at a position farther from the sixth semiconductor layer than a boundary between the second semiconductor layer and the semiconductor substrate is, the first electrode having an insulating surface; a second electrode extending through the second semiconductor layer, the fourth semiconductor layer, and the third semiconductor layer or through the second semiconductor layer, the fifth semiconductor layer, and the third semiconductor layer, to reach the semiconductor substrate, the second electrode being closer to the sixth semiconductor layer than the first semiconductor layer and the second semiconductor layer are, the second electrode having an insulating surface; and a third electrode extending through the fourth semiconductor layer and the third semiconductor layer to reach the semiconductor substrate, the third electrode being closer to the sixth semiconductor layer than the first semiconductor layer and the second semiconductor layer are, the third electrode separating the first semiconductor layer from the second semiconductor layer, the third electrode and the second electrode sandwiching the second semiconductor layer, the third electrode having an insulating surface.

A semiconductor device control method as a second aspect of technology according to the present disclosure is a semiconductor device control method according to the present disclosure, wherein a first signal is provided to the first electrode, a second signal is provided to the second electrode, and when the semiconductor device is turned off by transition of each of the first signal and the second signal, the first signal transitions later than the second signal.

According to the semiconductor device and the semiconductor device control method according to the present disclosure, an allowable range of a time difference by which off transition of the first signal provided to the first electrode is delayed from off transition of the second signal provided to the second electrode increases.

These and other objects, features, aspects and advantages relating to technology disclosed herein will become more apparent from the following detailed description when taken in conjunction with the accompanying drawings.

BRIEF DESCRIPTION OF THE DRAWINGS

FIG. 19 is a waveform diagram illustrating operation when the semiconductor device according to Embodiment 1 is turned on;

FIG. 20 is a waveform diagram illustrating operation when the semiconductor device according to Embodiment 1 is turned on;

FIG. 22 is a waveform diagram illustrating operation when the semiconductor device according to Embodiment 2 is turned on;

DESCRIPTION OF THE PREFERRED EMBODIMENTS

Embodiments will be described below with reference to the accompanying drawings. In the embodiments described below, detailed features and the like are shown for description of technology but are examples, and not all of them are necessary features to implement the embodiments.

Even in a case where terms meaning particular positions or directions, such as "upper", "lower", "left", "right", "side", "bottom", "front", and "back", are used in description made herein, these terms are used for the sake of convenience to facilitate understanding of the embodiments and have nothing to do with positions or directions when the embodiments are implemented.

The presence or absence of signs "+" and "−" to the right of signs "N" and "P" each representing a conductivity type of a semiconductor indicates a relative magnitude of an impurity concentration, for example, a peak impurity concentration. For example, an N+ type semiconductor has a higher N type impurity concentration than an N type semiconductor, and the N type semiconductor has a higher N type impurity concentration than an N− type semiconductor. A P+ type semiconductor has a higher P type impurity concentration than a P type semiconductor, and the P type semiconductor has a higher P type impurity concentration than a P− type semiconductor. The magnitude of the impurity concentration is relative, and, if different semiconductors are all described to be N type semiconductors, for example, it does not mean that these semiconductors have an equal impurity concentration.

Embodiment 1

Figure 1:
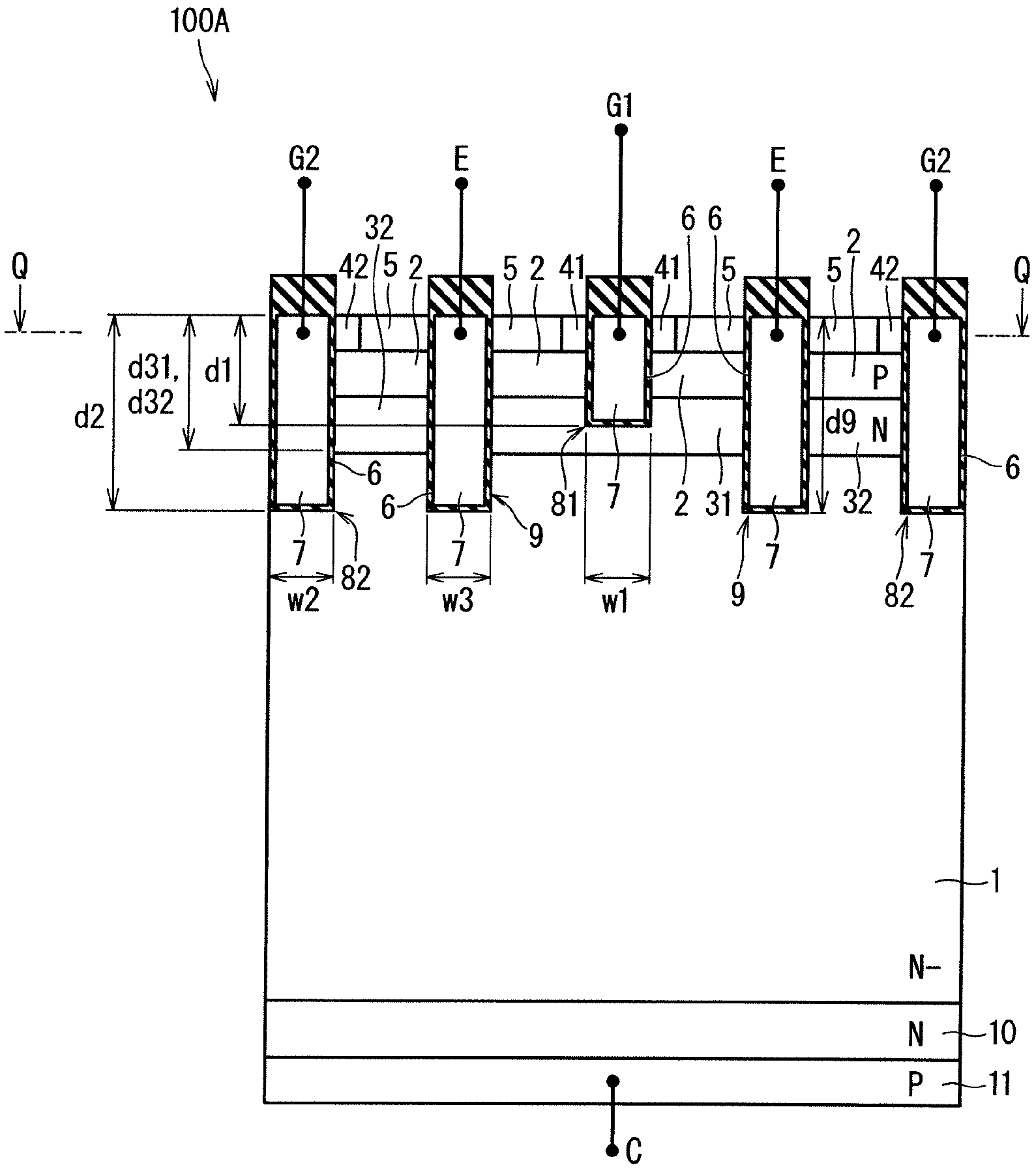
FIG. 1 is a cross-sectional view illustrating one example of a configuration of a semiconductor device according to Embodiment 1.
Figure 2:
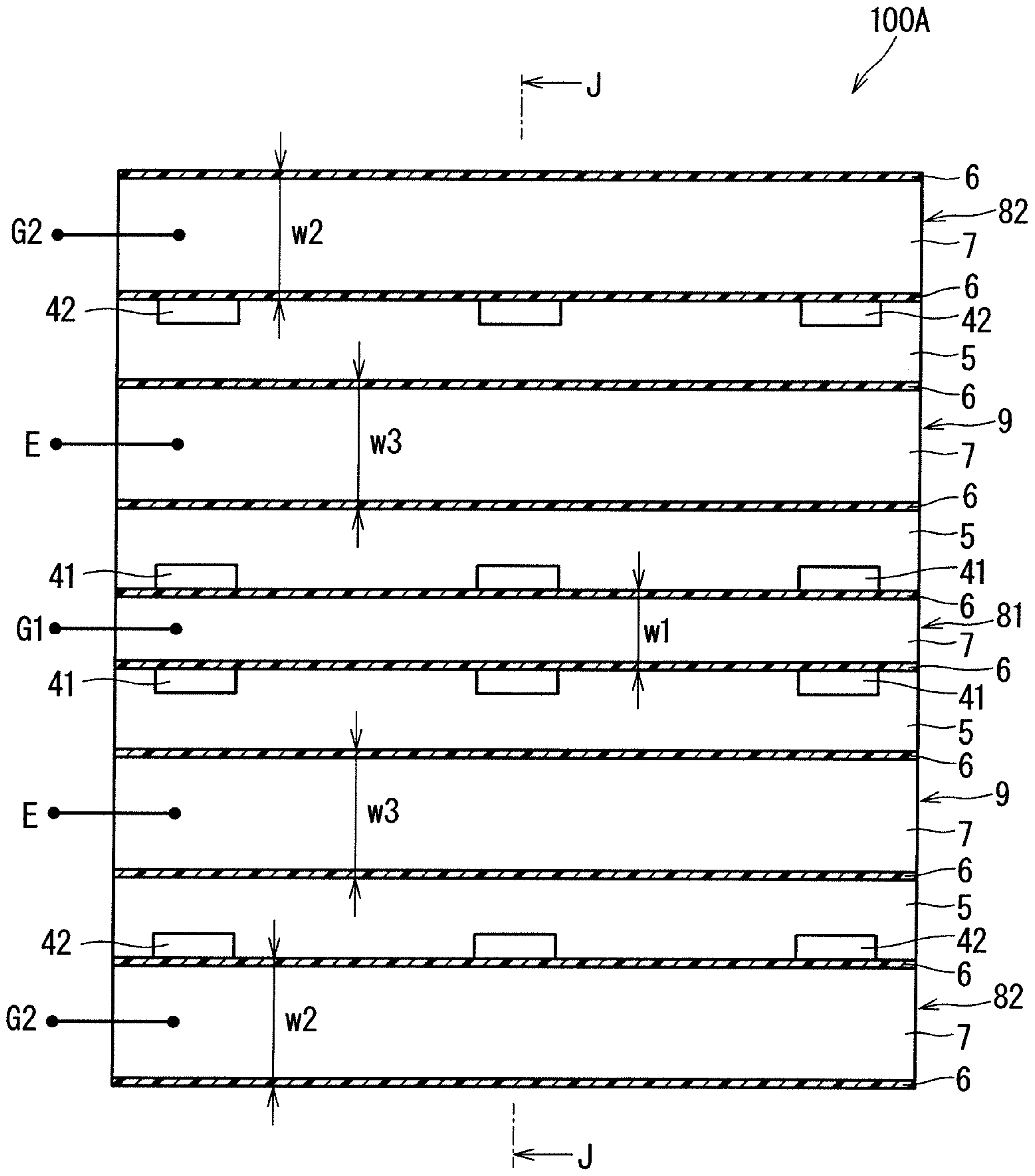
FIG. 2 is a cross-sectional view illustrating another example of the configuration of the semiconductor device according to Embodiment 1.

FIG. 1 is a cross-sectional view illustrating a configuration of a semiconductor device 100A according to Embodiment 1. FIG. 2 is a cross-sectional view illustrating one example of the configuration of the semiconductor device 100A, and FIG. 3 is a cross-sectional view illustrating another example of the configuration of the semiconductor device 100A.

Figure 3:
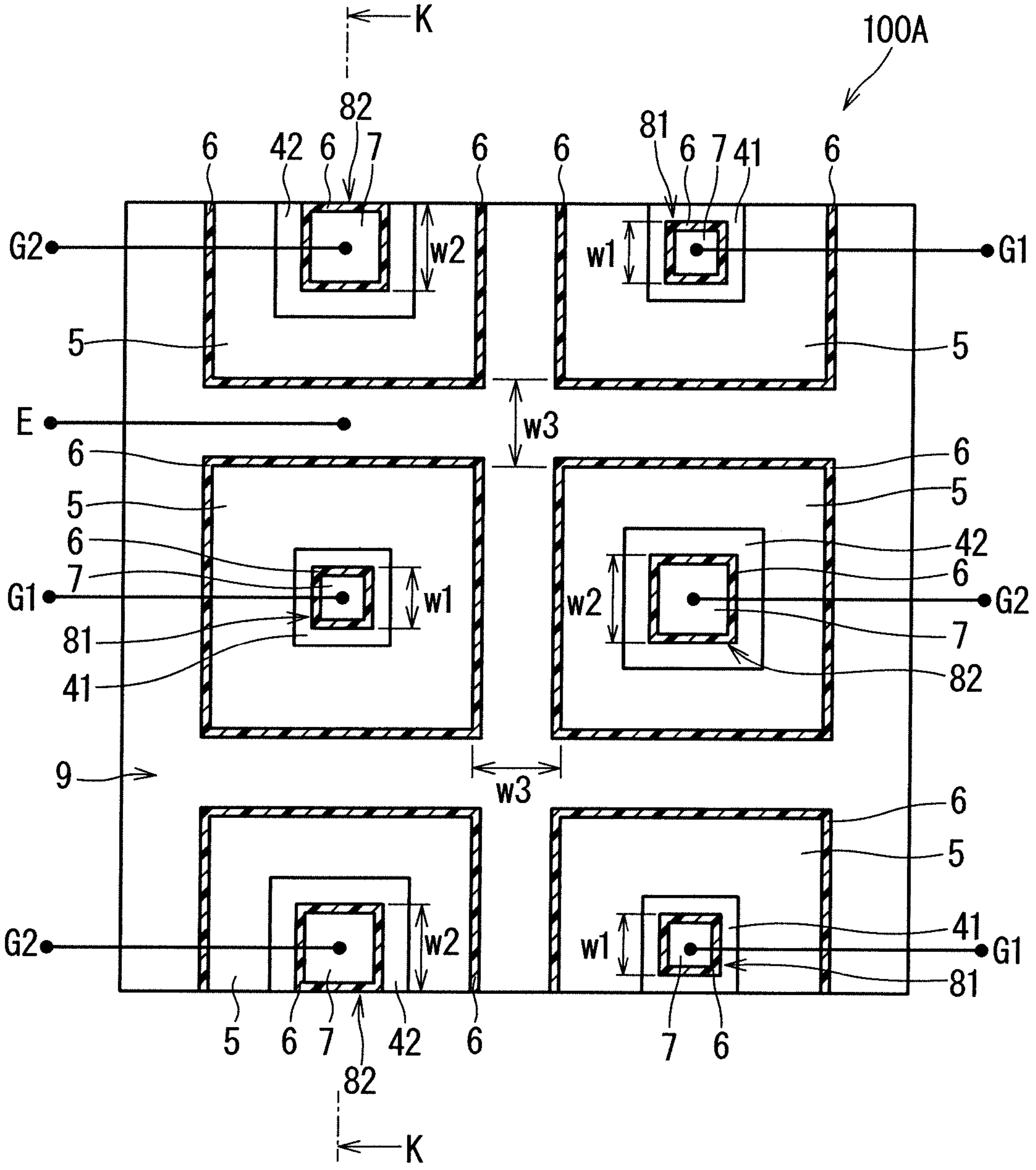
FIG. 3 is a cross-sectional view illustrating yet another example of the configuration of the semiconductor device according to Embodiment 1.

A cross section illustrated in FIG. 2 and a cross section illustrated in FIG. 3 are each taken along the line QQ of FIG. 1. A cross section illustrated in FIG. 1 is a cross section taken along the line JJ of FIG. 2 and is a cross section taken along the line KK of FIG. 3. The configuration illustrated in FIG. 2 contributes to suppression of multilayering of wiring including polysilicon, for example, and further to improvement in productivity.

The semiconductor device 100A includes a semiconductor substrate 1, semiconductor layers 2, 31, 32, 41, 42, 5, 10, and 11 and trench electrodes 81, 82, and 9. The "trench electrodes" are provisional names indicating electrodes extending like grooves in a direction of the thickness of the semiconductor substrate 1, and a specific configuration thereof will be described below.

The semiconductor substrate 1 is achieved by N-type silicon, for example. The semiconductor device 100A is typically an IGBT, and the semiconductor substrate 1 serves as a drift layer, for example.

The semiconductor layers 31 and 32 are located in a surface layer of the semiconductor substrate 1 to be excluded from each other. The semiconductor layers 31 and 32 are achieved by N type silicon, for example. The semiconductor layers 31 and 32 serve as carrier storage layers, for example. For example, the semiconductor layers 31 and 32 have an equal peak impurity concentration in the present embodiment.

In Embodiment 3 described below, a case where the semiconductor layer 31 and the semiconductor substrate 1 have an equal impurity concentration will be described, and the semiconductor layer 31 is considered as a portion of the semiconductor substrate 1. In Embodiment 4 described below, a case where the semiconductor layer 31 has a lower peak impurity concentration than the semiconductor layer 32 will be described.

The semiconductor layer 2 is located on an opposite side of the semiconductor layers 31 and 32 from the semiconductor substrate 1. The semiconductor layer 2 has an opposite conductivity type from the semiconductor substrate 1 and the semiconductor layers 31 and 32 and is achieved by P type silicon, for example. The semiconductor layer 2 serves as a channel layer of the IGBT, for example.

The semiconductor layer 5 is selectively located on an opposite side of the semiconductor layer 2 from the semiconductor substrate 1. The semiconductor layer 5 has the same conductivity type as the semiconductor layer 2, has a higher peak impurity concentration than the semiconductor layer 2, and is achieved by P+ type silicon, for example. The semiconductor layer 5 serves as an emitter layer of the IGBT, for example.

The semiconductor layers 41 and 42 are located on an opposite side of the semiconductor layer 2 from the semiconductor substrate 1 to be excluded from the semiconductor layer 5. The semiconductor layers 41 and 42 have the same conductivity type as the semiconductor substrate 1 and the semiconductor layers 31 and 32, have a higher peak impurity concentration than the semiconductor layer 32, and are achieved by N+ type silicon, for example. The semiconductor layers 41 and 42 serve as emitter layers of the IGBT, for example.

The semiconductor layer 11 is located on an opposite side of the semiconductor substrate 1 from the semiconductor layers 2, 31, 32, 41, 42, and 5. The semiconductor layer 11 has the same conductivity type as the semiconductor layer 2 and is achieved by P type silicon, for example. The semiconductor layer 11 serves as a collector layer of the IGBT, for example. The semiconductor layer 11 is electrically connected to a collector electrode C of the IGBT by an unillustrated structure, for example.

The semiconductor layer 10 is located between the semiconductor substrate 1 and the semiconductor layer 11 to be in contact with both of them. The semiconductor layer 10 has the same conductivity type as the semiconductor substrate 1, has a higher peak impurity concentration than the semiconductor substrate 1, and is achieved by N type silicon, for example. The semiconductor layer 10 serves as a buffer layer of the IGBT, for example.

The trench electrode 81 extends through the semiconductor layers 41 and 2 and reaches the semiconductor layer 31 at a position farther from the semiconductor layer 11 than a boundary between the semiconductor layer 32 and the semiconductor substrate 1 is (upward away in the page of FIG. 1). A surface, specifically, a surface opposite the semiconductor layers 41, 2, and 31 of the trench electrode 81 is insulating. The trench electrode 81 is electrically connected to a gate electrode G1 of the IGBT by an unillustrated structure, for example.

Each of the trench electrodes 82 extends through the semiconductor layers 2, 42, and 32 to reach the semiconductor substrate 1. The trench electrode 82 is closer to the semiconductor layer 11 than the semiconductor layers 31 and 32 are. A surface, specifically, a surface opposite the semiconductor substrate 1 and the semiconductor layers 42, 2, and 32 of the trench electrode 82 is insulating. The trench electrode 82 is electrically connected to a gate electrode G2 of the IGBT by an unillustrated structure, for example.

Each of the trench electrodes 9 extends through the semiconductor layers 5 and 2 to reach the semiconductor substrate 1. When the semiconductor layers 31 and 32 are taken together, it can be said that the trench electrodes 9 and 82 each extend through the semiconductor layers 31 and 32. The trench electrode 9 is closer to the semiconductor layer 11 than the semiconductor layers 31 and 32 are. The trench electrode 9 separates the semiconductor layer 31 from the semiconductor layer 32. The trench electrode 9 and the trench electrode 82 sandwich the semiconductor layer 32. A surface, specifically, a surface opposite the semiconductor substrate 1 and the semiconductor layers 2, 31, 32, and 5 of the trench electrode 9 is insulating. The trench electrode 9 is electrically connected to an emitter electrode E of the IGBT together with the semiconductor layers 41, 42, and 5, for example. The trench electrode 9 can be seen as a dummy electrode in terms of being connected to none of the gate electrodes G1 and G2 and not serving as a gate.

The trench electrodes 81, 82, and 9 each include a dielectric film 6 and a conductor 7. The conductor 7 is achieved by polysilicon, for example. The dielectric film 6 is responsible for the above-mentioned insulation of each of the trench electrodes 81, 82, and 9 and is achieved by silicon oxide, for example. The trench electrodes 81, 82, and 9 are each surrounded by the dielectric film 6 within a groove but each can be seen as an electrode electrically connectable to an outside.

The trench electrodes 81, 82, and 9 are located periodically as viewed along the direction of the thickness of the semiconductor substrate 1. For example, the trench electrodes 81 and 82 are located alternately along one direction, and the trench electrode 9 is located between the trench electrodes 81 and 82 (see FIG. 2). For example, the trench electrodes 81 and 82 are located alternately along two directions, and the trench electrode 9 is located between the trench electrodes 81 and 82 in a grid (see FIG. 3).

The semiconductor layer 41 may be formed continuously as illustrated in FIG. 3 or intermittently around the trench electrode 81. The semiconductor layer 42 may be formed continuously as illustrated in FIG. 3 or intermittently around the trench electrode 82.

Figure 4:
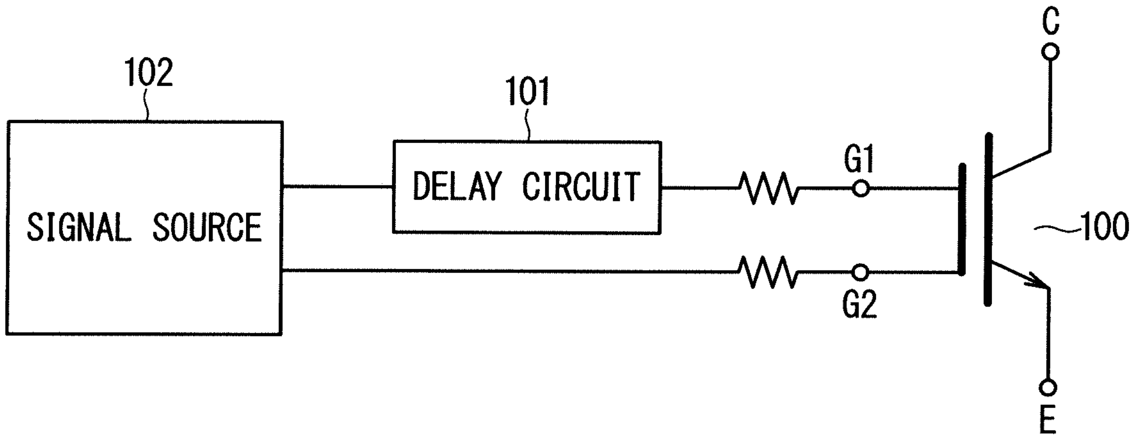
FIG. 4 is a circuit diagram illustrating a circuit that applies two types of gate voltages to an IGBT.

FIG. 4 is a circuit diagram illustrating a circuit that applies two types of gate voltages to an IGBT 100. The semiconductor device 100A can be used as the IGBT 100 that includes the gate electrodes G1 and G2, the emitter electrode E, and the collector electrode C.

The two types of gate voltages control on/off of the IGBT 100. The gate electrode G1 is connected to a signal source 102 via a delay circuit 101 and a resistor. The resistor may be achieved by being included in the signal source 102 or may be achieved by being included in the delay circuit 101.

The gate electrode G2 is connected to the signal source 102 via a resistor. The resistor may be achieved by being included in the signal source 102.

Figure 5:
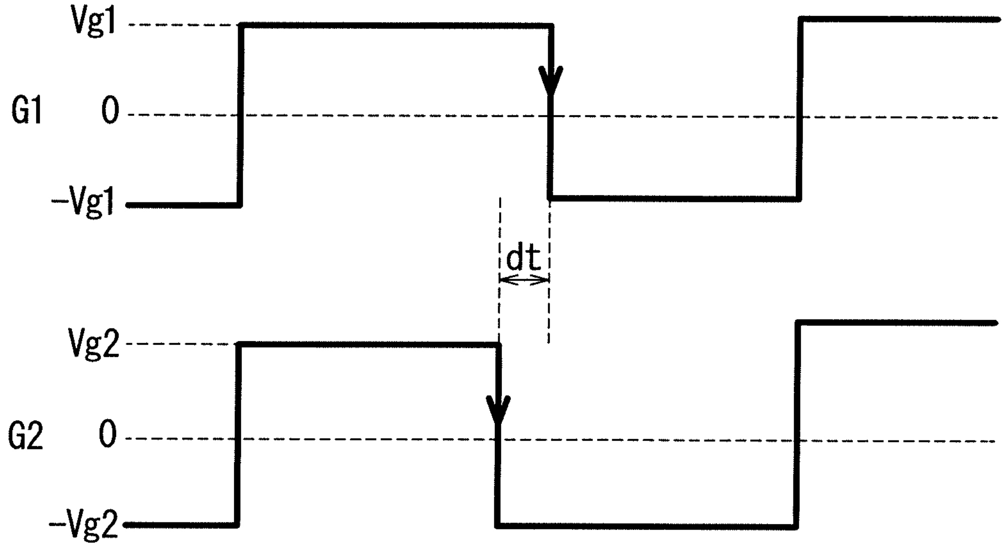
FIG. 5 is a waveform diagram illustrating sequences of the two types of gate voltages.

FIG. 5 is a waveform diagram illustrating sequences of the above-mentioned two types of gate voltages. Based on a potential of the emitter electrode E, a voltage applied to the gate electrode G1 (hereinafter provisionally referred to as a "first gate voltage": corresponding to the above-mentioned first signal) transitions between a value Vg1 (>0) and a value (−Vg1), and a voltage applied to the gate electrode G2 (hereinafter provisionally referred to as a "second gate voltage": corresponding to the above-mentioned second signal) transitions between a value Vg2 (>0) and a value (−Vg2). A fall of the first gate voltage and a fall of the second gate voltage each correspond to off transition.

The delay circuit 101 at least has a function of delaying the fall of the first gate voltage from the fall of the second gate voltage by a time difference dt. For example, the second gate voltage is input into the delay circuit 101, and the first gate voltage is obtained from the delay circuit 101. Alternatively, the delay circuit 101 is omitted, and the first gate voltage and the second gate voltage are obtained from the signal source 102.

Since the first gate voltage is applied to the gate electrode G1, it can be said that the first signal is provided to the trench electrode 81. Since the second gate voltage is applied to the gate electrode G2, it can be said that the second signal is provided to the trench electrode 82. As a method of controlling turn-off of the semiconductor device 100A used as the IGBT 100, the first gate voltage and the second gate voltage are each caused to transition, and the first gate voltage is caused to transition later than the second gate voltage. The same applies to control of semiconductor devices 100B, 100C, and 100D described below.

Figure 6:
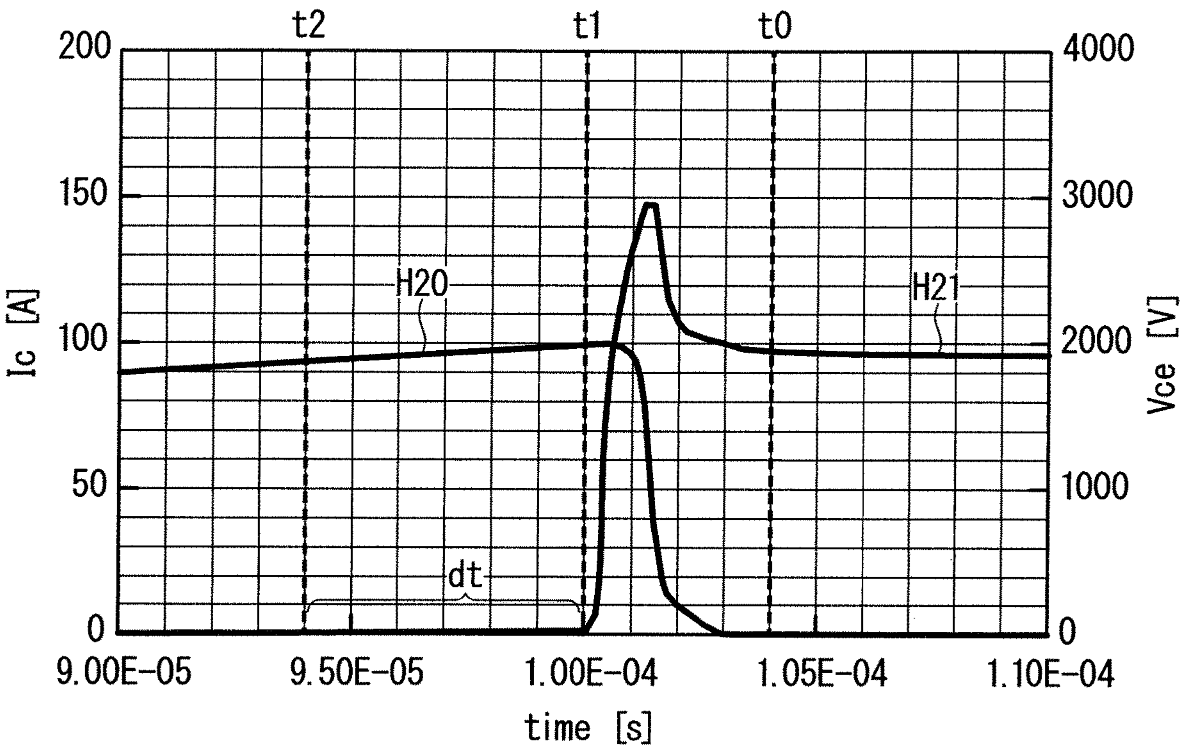
FIG. 6 is a waveform diagram illustrating operation to turn off the IGBT.

FIG. 6 is a waveform diagram illustrating operation to turn off the IGBT 100. In FIG. 6, a left vertical axis represents a collector current Ic [A], and a right vertical axis represents a collector voltage Vce [V] based on an emitter potential. A horizontal axis represents time [s]. A waveform H20 represents a waveform of the collector current Ic, and a waveform H21 represents a waveform of the collector voltage Vce.

The second gate voltage transitions to off at time t2, and the first gate voltage transitions to off at time t1. A difference between the time t1 and the time t2 is the above-mentioned time difference dt. The collector current Ic stops flowing at time to. A total amount of loss of the IGBT 100 during a time period from the time t2 to the time to is treated as a total amount of loss Eoff below.

Figure 7:
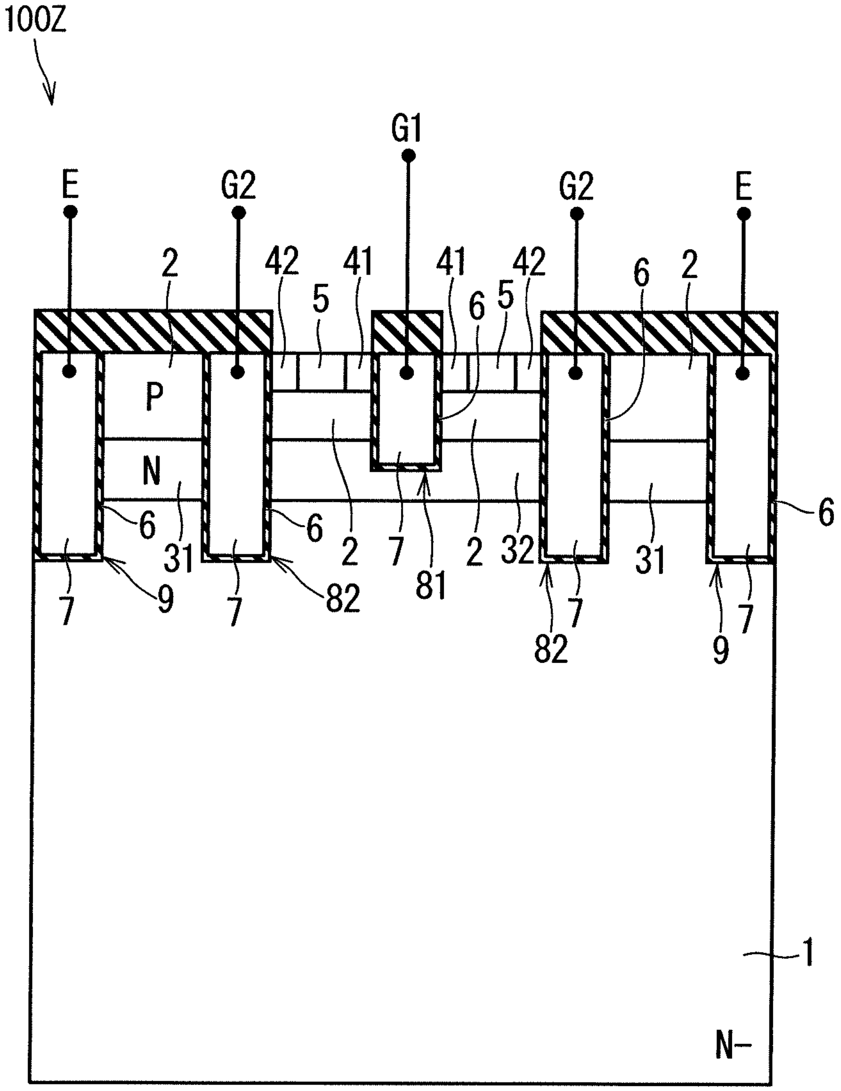
FIG. 7 is a cross-sectional view illustrating a configuration of a semiconductor device according to a comparative example.

FIG. 7 is a cross-sectional view illustrating a structure of a semiconductor device 100Z as a comparative example compared with the semiconductor device 100A. The structure of the semiconductor device 100Z roughly differs from the structure of the semiconductor device 100A in order in which the trench electrodes 81, 82, and 9 are arranged. The trench electrode 9 is interposed between the trench electrodes 81 and 82 in the semiconductor device 100A, but the trench electrode 9 is not interposed between the trench electrodes 81 and 82, and the trench electrodes 81 and 82 are sandwiched by the trench electrodes 9 in the semiconductor device 100Z.

More specifically, when the semiconductor layers 31 and 32 are taken together in each of the semiconductor devices 100A and 100Z, it can be said that the trench electrodes 82 and 9 extend through the semiconductor layers 31 and 32. It can be said that the trench electrode 81 extends through the semiconductor layer 41 to reach the semiconductor layers 31 and 32 in each of the semiconductor devices 100A and 100Z.

In the semiconductor device 100Z, the trench electrode 82 is opposite the semiconductor substrate 1 and the semiconductor layers 42, 2, and 32 as in the semiconductor device 100A. In the semiconductor device 100Z, the trench electrode 82 is also opposite the semiconductor layer 31, and a surface opposite the semiconductor layer 31 is insulating.

In the semiconductor device 100Z, the trench electrode 81 is opposite the semiconductor layers 41 and 2 as in the semiconductor device 100A. In the semiconductor device 100Z, the trench electrode 81 is also opposite the semiconductor layer 32, and a surface opposite the semiconductor layer 32 is insulating.

In the semiconductor device 100Z, the trench electrode 9 is opposite the semiconductor substrate 1 and the semiconductor layers 31 and 2 as in the semiconductor device 100A. The trench electrode 9 is opposite the semiconductor layer 5 in the semiconductor device 100A, whereas the trench electrode 9 is not opposite the semiconductor layer 5 in the semiconductor device 100Z.

In the semiconductor device 100Z, the semiconductor layers 41, 42, and 5 are arranged between the trench electrodes 81 and 82 without the trench electrode 9 being interposed therebetween.

Figure 8:
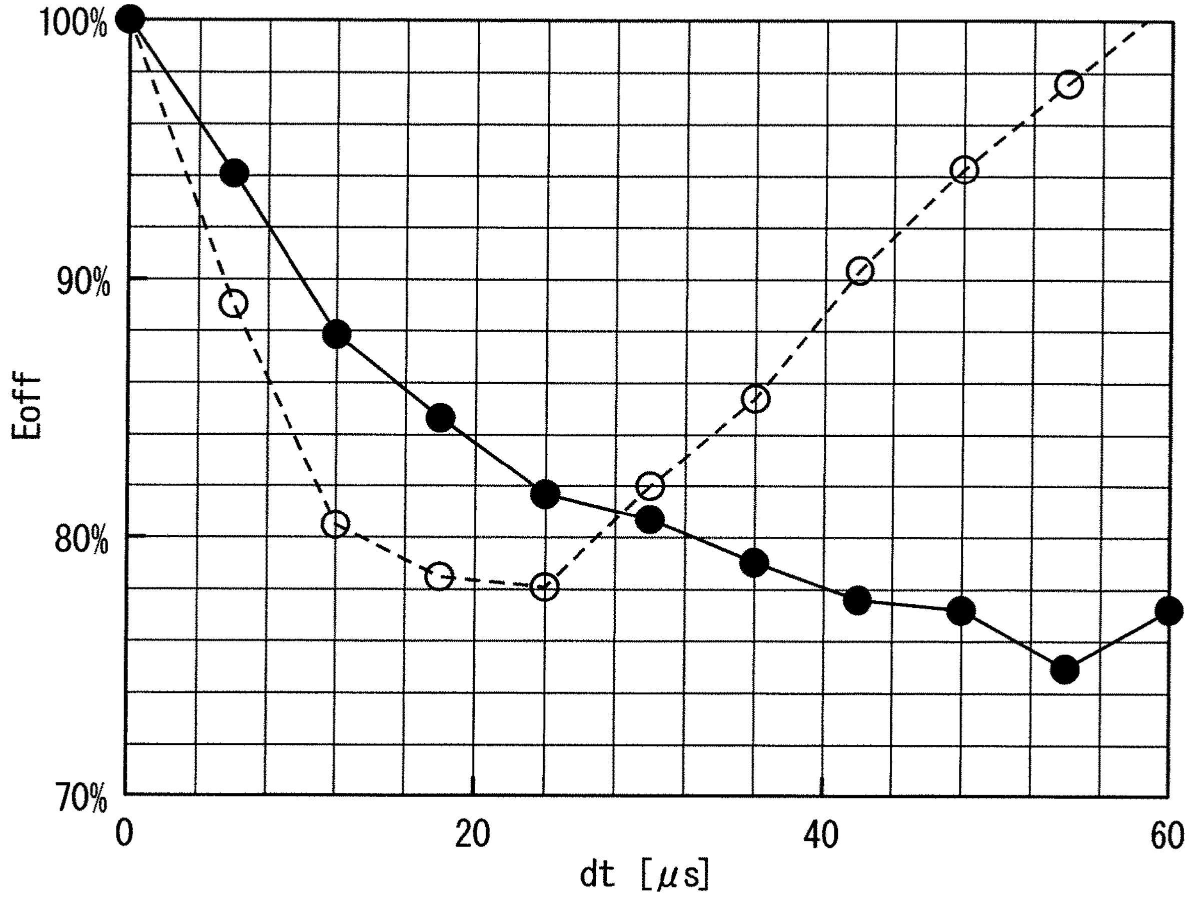
FIG. 8 is a graph showing dependence of a total amount of loss on a time difference.

FIG. 8 is a graph showing dependence of the total amount of loss Eoff [%] on the time difference dt. The total amount of loss Eoff is shown in percentage with a value when the time difference dt is zero being 100%. White circles represent data in the comparative example, specifically, in a case where the semiconductor device 100Z is used as the IGBT 100 and are connected by a dashed line. Black circles represent data in the present embodiment, specifically, in a case where the semiconductor device 100A is used as the IGBT 100 and are connected by a solid line.

In a case of the comparative example, the total amount of loss Eoff tends to decrease once and then increase with increasing time difference dt. Specifically, the total amount of loss Eoff has a minimum value when the time difference dt has a value of approximately 20 μs.

In a case of the present embodiment, the total amount of loss Eoff tends to decrease substantially monotonically with increasing time difference dt and tends to be substantially stabilized when the time difference dt is greater than approximately 35 μs.

It is understood from the above-mentioned graph that an allowable range of the time difference dt to reduce loss, that is, an allowable range of the time difference dt by which off transition of the first gate voltage is delayed from off transition of the second gate voltage increases in the present embodiment compared with that in the comparative example.

Figure 9:
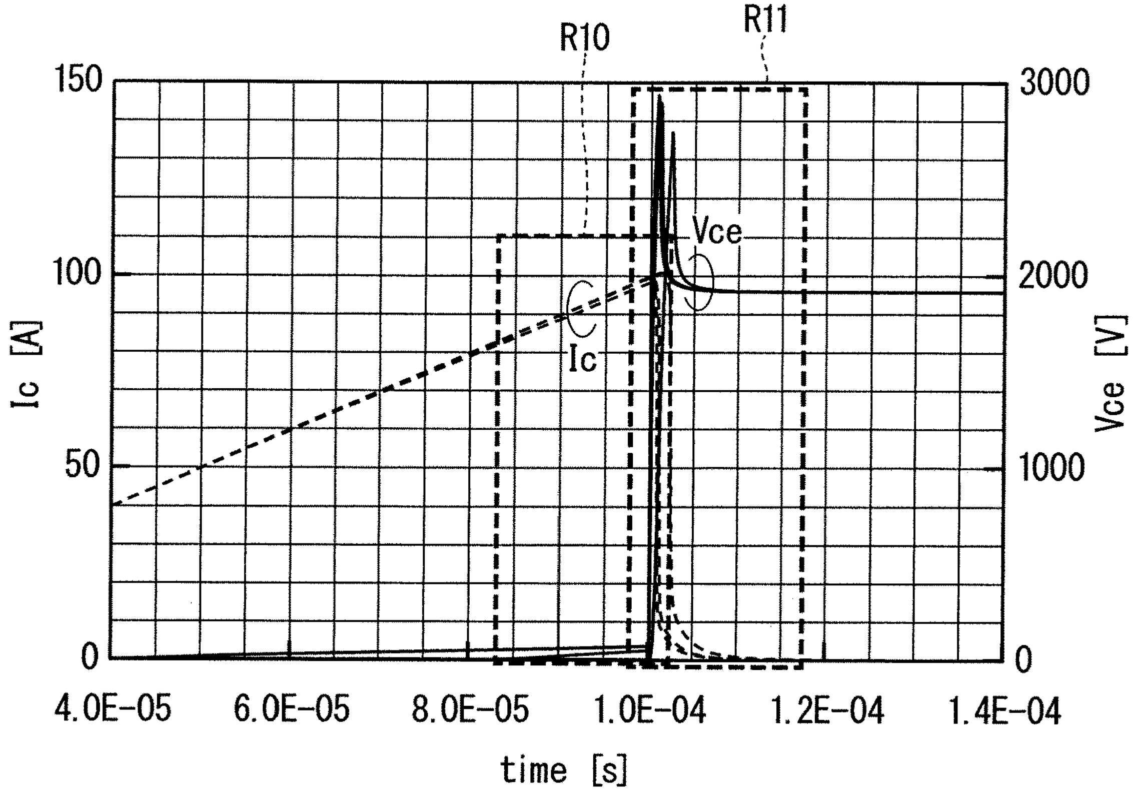
FIG. 9 is a waveform diagram illustrating operation to turn off the IGBT in the comparative example.

FIG. 9 is a waveform diagram illustrating operation to turn off the IGBT 100 in the comparative example. In FIG. 9, a left vertical axis represents the collector current Ic [A], and a right vertical axis represents the collector voltage Vce [V] based on the emitter potential. A horizontal axis represents the time [s]. Waveforms in dashed lines represent waveforms of the collector current Ic, and waveforms in solid lines represent waveforms of the collector voltage Vce. Cases where the time difference dt has values of 0 μs, 18 μs, and 60 μs are shown for each of the collector current Ic and the collector voltage Vce. For each of the values of the time difference dt, the first gate voltage transitions to off at time 100 μs (shown as "1.0E-04" in the figure).

Figure 10:
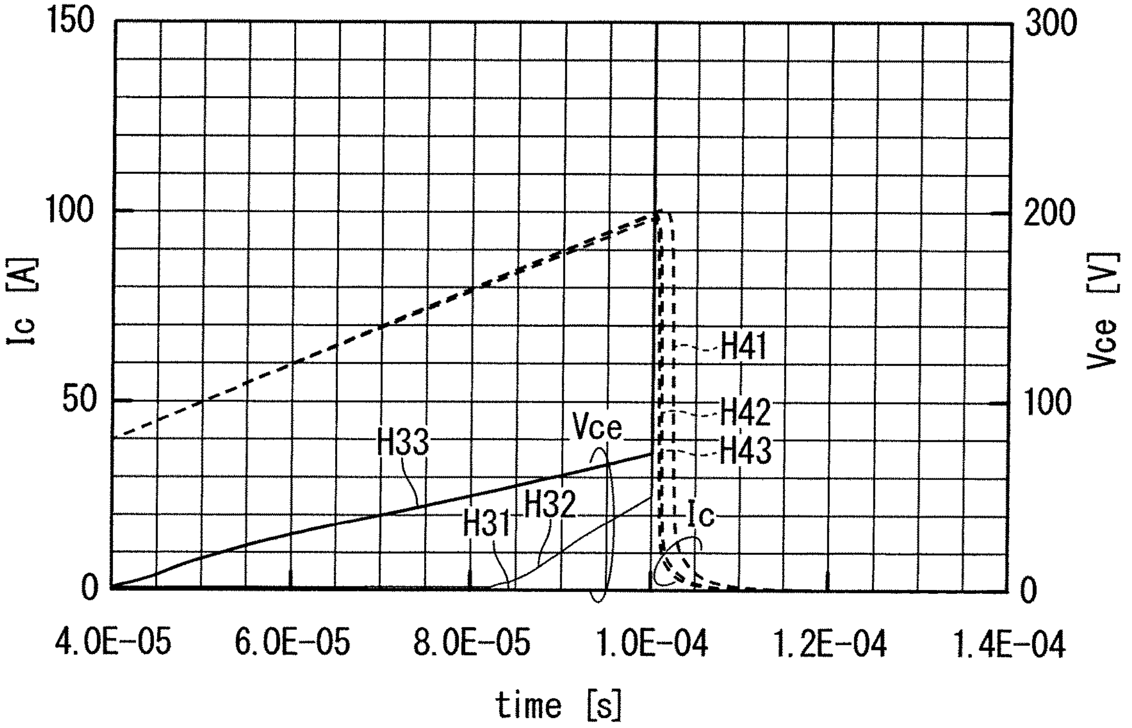
FIG. 10 is a waveform diagram showing an enlarged view of a region R10 in FIG. 9.
Figure 11:
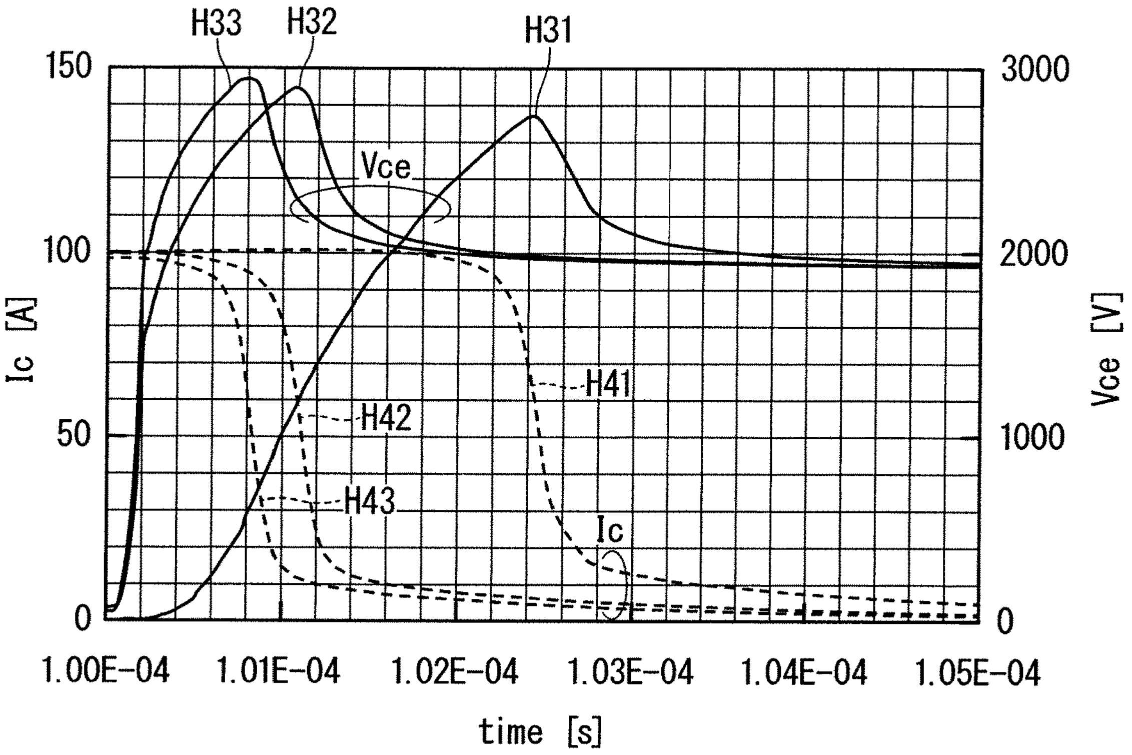
FIG. 11 is a waveform diagram showing an enlarged view of a region R11 in FIG. 9.

FIG. 10 is a waveform diagram showing an enlarged view of a region R10 in FIG. 9. FIG. 11 is a waveform diagram showing an enlarged view of a region R11 in FIG. 9.

Waveforms H31, H32, and H33 in solid lines represent waveforms of the collector voltage Vce in the comparative example. Waveforms H41, H42, and H43 in dashed lines represent waveforms of the collector current Ic in the comparative example.

The waveforms H31 and H41 represent waveforms in a case where the time difference dt has a value of 0 μs. The waveforms H32 and H42 represent waveforms in a case where the time difference dt has a value of 18 μs. The waveforms H33 and H43 represent waveforms in a case where the time difference dt has a value of 60 μs.

Figure 12:
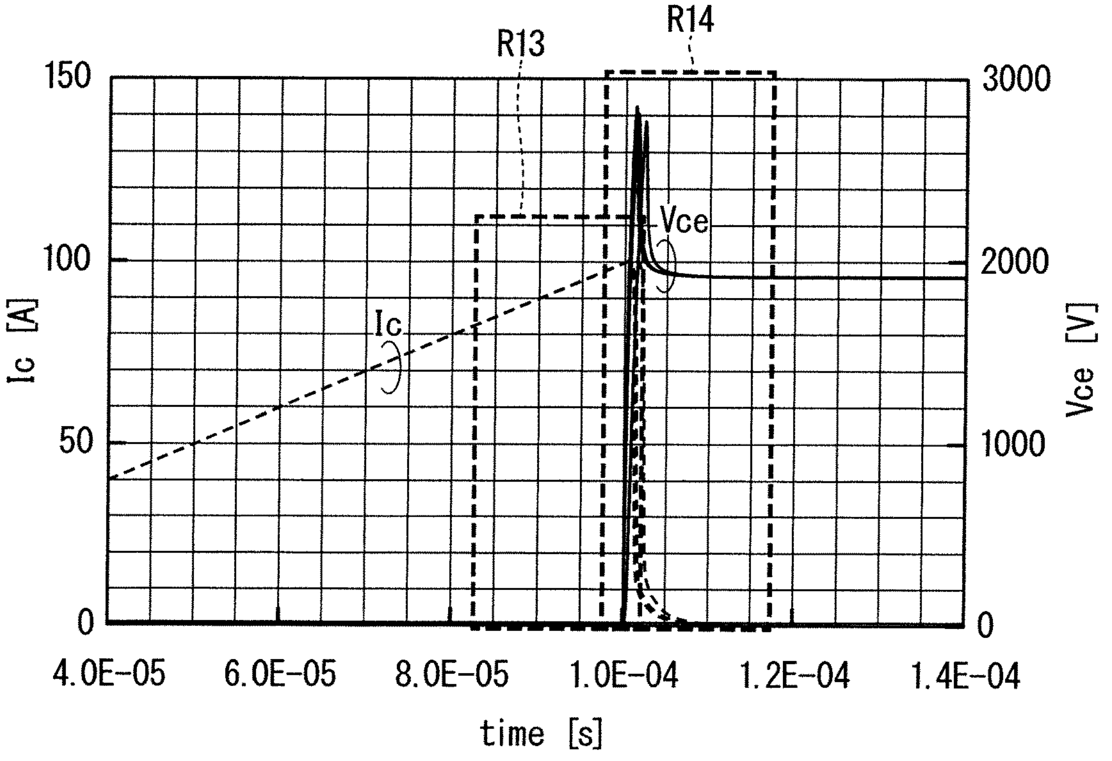
FIG. 12 is a waveform diagram illustrating operation to turn off the IGBT in Embodiment 1.

FIG. 12 is a waveform diagram illustrating operation to turn off the IGBT 100 in the present embodiment. In FIG. 12, a left vertical axis represents the collector current Ic [A], and a right vertical axis represents the collector voltage Vce [V] based on the emitter potential. A horizontal axis represents the time [s]. Waveforms in dashed lines represent waveforms of the collector current Ic, and waveforms in solid lines represent waveforms of the collector voltage Vce. Cases where the time difference dt has values of 0 μs, 18 μs, and 60 μs are shown for each of the collector current Ic and the collector voltage Vce. For each of the values of the time difference dt, the first gate voltage transitions to off at the time 100 μs (shown as "1.0E-04" in the figure).

Figure 13:
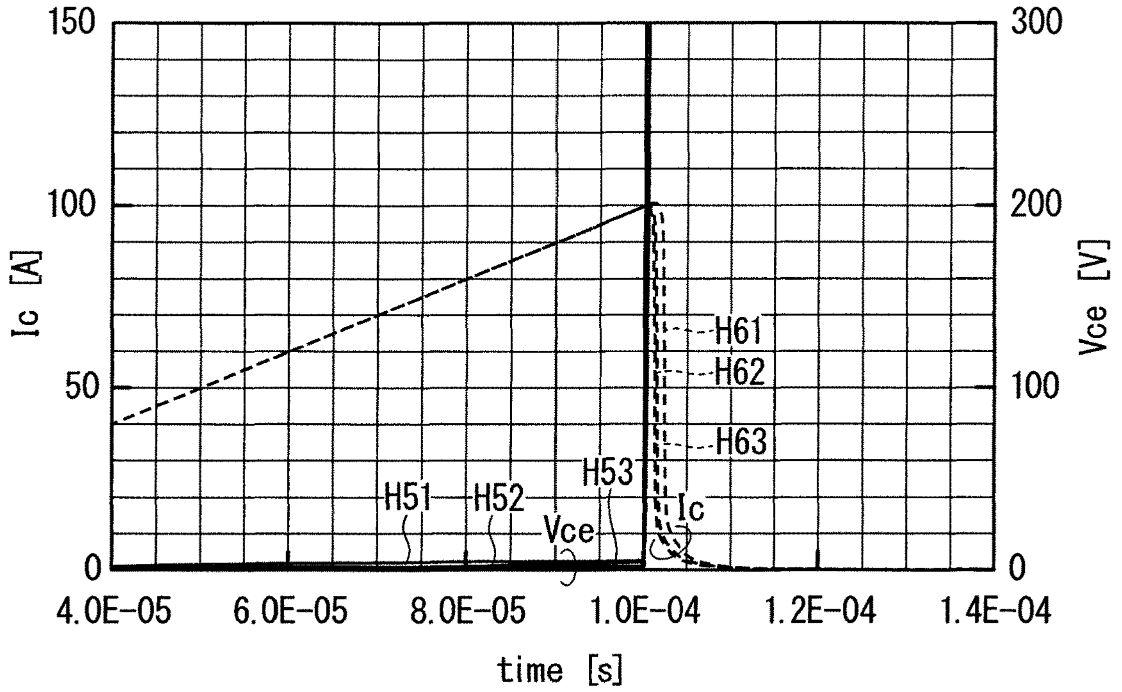
FIG. 13 is a waveform diagram showing an enlarged view of a region R13 in FIG. 12.
Figure 14:
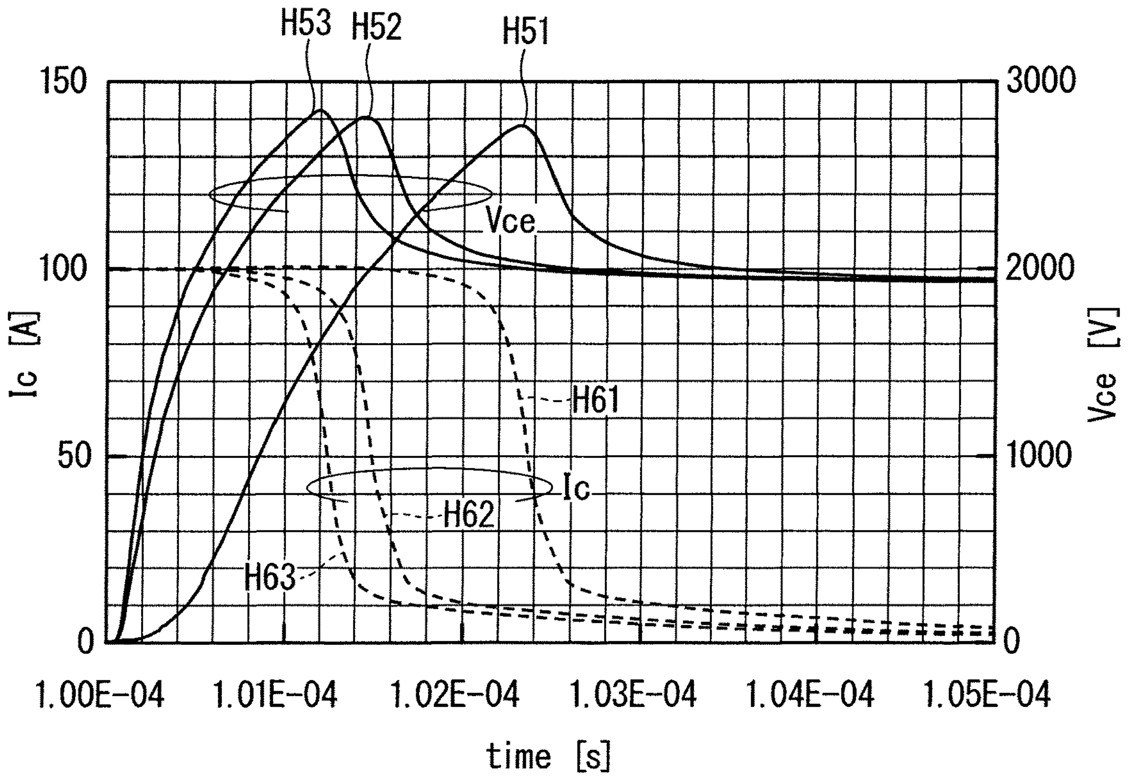
FIG. 14 is a waveform diagram showing an enlarged view of a region R14 in FIG. 12.

FIG. 13 is a waveform diagram showing an enlarged view of a region R13 in FIG. 12. FIG. 14 is a waveform diagram showing an enlarged view of a region R14 in FIG. 12.

Waveforms H51, H52, and H53 in solid lines represent waveforms of the collector voltage Vce in the present embodiment. Waveforms H61, H62, and H63 in dashed lines represent waveforms of the collector current Ic in the present embodiment.

The waveforms H51 and H61 represent waveforms in a case where the time difference dt has a value of 0 μs. The waveforms H52 and H62 represent waveforms in a case where the time difference dt has a value of 18 μs. The waveforms H53 and H63 represent waveforms in a case where the time difference dt has a value of 60 μs.

It is understood from FIGS. 10 and 13 that an increase in collector voltage Vce after off transition of the second gate voltage is suppressed more in the present embodiment than in the comparative example. The increase in collector voltage Vce increases loss during conduction of the IGBT 100. The increase in total amount of loss Eoff with increasing time difference dt in the comparative example shown in FIG. 8 is considered to be because of the increase in collector voltage Vce.

It is understood from FIGS. 11 and 14 that the speed of the increase in collector voltage Vce is suppressed more in the present embodiment than in the comparative example. A large time difference dt results in distortion of a waveform of the collector voltage Vce in the comparative example.

In each of the semiconductor devices 100A and 100Z, the semiconductor layers 2, 31, 32, and 5 are considered as emitter regions of the IGBT. In each of the semiconductor devices 100A and 100Z, a current flowing due to operation thereof passes through the emitter regions.

The number of electrons stored in the semiconductor layers 31 and 32 due to a potential of the trench electrode 82 is reduced by off transition of the second gate voltage. The reduction leads to reduction in number of electrons injected from the semiconductor layers 31 and 32 into the semiconductor substrate 1 and further leads to reduction in carriers on a side of the semiconductor layers 31 and 32 of the semiconductor substrate 1. The reduction results in expansion of a depletion layer extending from a boundary between the semiconductor substrate 1 and the semiconductor layers 31 and 32.

In the semiconductor device 100Z, the trench electrodes 81 and 82 are adjacent to each other, and the emitter regions are shared between the trench electrodes 81 and 82. In the semiconductor device 100Z, a Hall current flows only through the depletion layer. A resistive component of the depletion layer is high, and expansion of the depletion layer leads to an increase in voltage to turn on the semiconductor device 100Z. As the time difference dt increases, the depletion layer expands, and forward conduction loss increases.

As the time difference dt increases (off transition of the second gate voltage is earlier than off transition of the first gate voltage), the collector voltage Vce increases (see the waveforms H31, H32, and H33 in FIG. 10). At a time point of off transition of the first gate voltage, the depletion layer has already expanded in the emitter regions, and the collector voltage Vce increases at a high speed (see the waveforms H32 and H33 in FIG. 11).

In the semiconductor device 100A, the emitter regions are not shared between the trench electrodes 81 and 82. Specifically, the semiconductor layer 31 that the trench electrode 81 is opposite and the semiconductor layer 32 that the trench electrode 82 is opposite are separated by the trench electrode 9.

Even when the depletion layer expanding from the semiconductor layer 32 expands in the semiconductor substrate 1 due to off transition of the second gate voltage, almost no depletion layer is present at a boundary between the semiconductor layer 31 that the trench electrode 81 is opposite and the semiconductor substrate 1 until off transition of the first gate voltage. Compared with the emitter regions including the semiconductor layers 2, 32, and 5 in which the depletion layer expands, the emitter regions including the semiconductor layers 2, 31, and 5 in which almost no depletion layer is present have a small resistive component. The Hall current flows through the latter in the semiconductor device 100A.

These two types of emitter regions are parallel to each other in the semiconductor device 100A, and a voltage to turn on the semiconductor device 100A is almost independent of the time difference dt (see the waveforms H51, H52, and H53 in FIG. 13). At a time point of off transition of the first gate voltage, almost no depletion layer is present near the boundary between the semiconductor layer 31 and the semiconductor substrate 1, and the speed of the increase in collector voltage Vce is suppressed (see the waveforms H51, H52, and H53 in FIG. 14).

Figure 15:
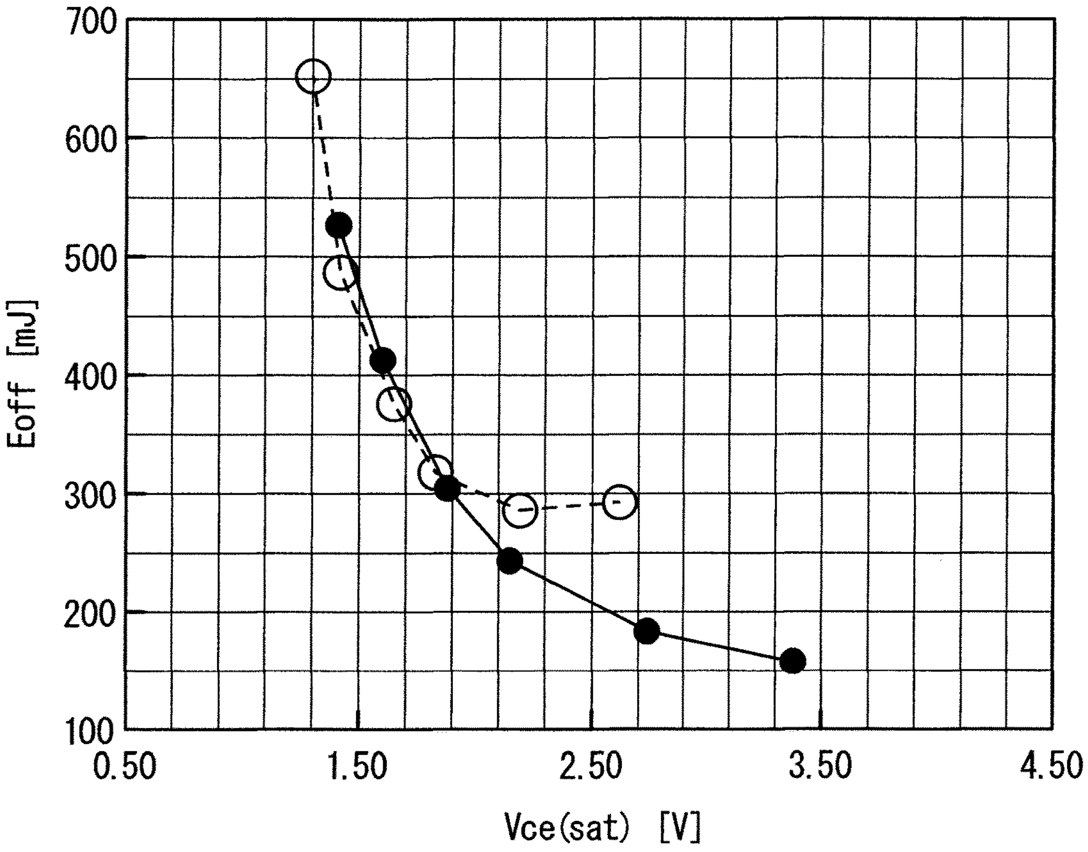
FIG. 15 is a graph showing dependence of the total amount of loss on a saturation voltage.

FIG. 15 is a graph illustrating dependence of the total amount of loss Eoff on a saturation voltage Vce(sat) for the collector voltage Vce. In FIG. 15, a vertical axis represents the total amount of loss Eoff [mJ], and a horizontal axis represents the saturation voltage Vce(sat) [V].

White circles represent data in the comparative example, specifically, in a case where the semiconductor device 100Z is used as the IGBT 100 and are connected by a dashed line. Black circles represent data in the present embodiment, specifically, in a case where the semiconductor device 100A is used as the IGBT 100 and are connected by a solid line. The total amount of loss Eoff having a minimum value for the time difference dt is used as the data in the comparative example.

A trade-off between the saturation voltage Vce(sat) and the total amount of loss Eoff is observed in each of the comparative example and the present embodiment. A tendency toward an increase in saturation voltage Vce(sat) with decreasing total amount of loss Eoff is observed.

There is a range of the saturation voltage Vce(sat) (hereinafter provisionally referred to as a "low speed side") in which an approximately equal trade-off is observed in the comparative example and the present embodiment. There is a range of the saturation voltage Vce(sat) (hereinafter provisionally referred to as a "high speed side") in which the total amount of loss Eoff is smaller in the present embodiment than in the comparative example. The saturation voltage Vce(sat) is higher on the high speed side than on the low speed side.

A carrier concentration in the semiconductor substrate 1 is lower on the high speed side than on the low speed side in each of the comparative example and the present embodiment, that is, in each of the semiconductor devices 100A and 100Z. In the comparative example, as the time difference dt increases, the depletion layer is more likely to expand on a side of the emitter regions of the semiconductor substrate 1, the forward conduction loss after off transition of the second gate voltage until off transition of the first gate voltage increases, and the total amount of loss Eoff is less likely to be suppressed. In the present embodiment, the increase in forward conduction loss due to expansion of the depletion layer is suppressed, and the total amount of loss Eoff is suppressed more than that 5 in the comparative example.

Examples of Ranges of Peak Impurity Concentrations

Examples of peak impurity concentrations used for the semiconductor substrate 1 and the semiconductor layers 2, 31, 32, 41, 42, and 5 will be described below.

A peak impurity concentration of the semiconductor substrate 1 has a lower limit of $1\times10^{12}$ cm$^{-3}$ and an upper limit of $1\times10^{14}$ cm$^{-3}$, for example. The peak impurity concentration of the semiconductor substrate 1 satisfying the upper limit and the lower limit is preferable in terms of a large breakdown voltage of the semiconductor device 100A compared with the peak impurity concentration not satisfying the upper limit and the lower limit.

A peak impurity concentration of the semiconductor layer 2 has a lower limit of $1\times10^{16}$ cm$^{-3}$ and an upper limit of $1\times10^{17}$ cm$^{-3}$, for example. The peak impurity concentration of the semiconductor layer 2 satisfying the upper limit is preferable in terms of a large turn-off blocking capability of the semiconductor device 100A compared with the peak impurity concentration not satisfying the upper limit. The peak impurity concentration of the semiconductor layer 2 satisfying the lower limit is preferable in terms of a large blocking capability at short-circuit compared with the peak impurity concentration not satisfying the lower limit.

A peak impurity concentration of each of the semiconductor layers 31 and 32 has an upper limit of $1\times10^{16}$ cm$^{-3}$, for example. The peak impurity concentration of each of the semiconductor layers 31 and 32 satisfying the upper limit is preferable in terms of a large breakdown voltage of the semiconductor device 100A compared with the peak impurity concentration not satisfying the upper limit.

A peak impurity concentration of each of the semiconductor layers 41, 42, and 5 has a lower limit of $1\times10^{18}$ cm$^{-3}$, for example. The peak impurity concentration of each of the semiconductor layers 41, 42, and 5 satisfying the lower limit is preferable in terms of a small contact resistance therein compared with the peak impurity concentration not satisfying the lower limit.

Another Example of Second Gate Voltage

Figure 16:
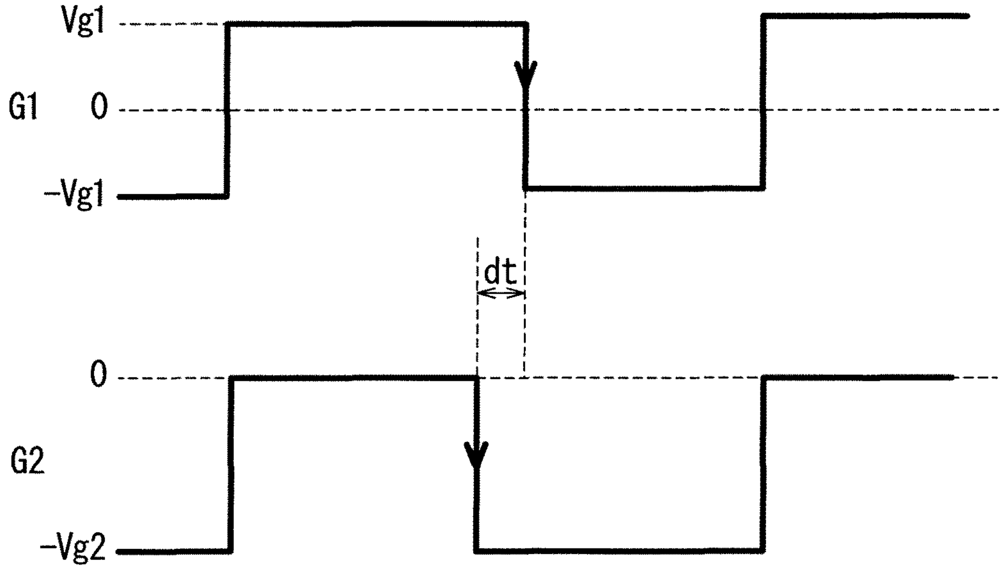
FIG. 16 is a waveform diagram showing another example of the sequences of the two types of gate voltages.

FIG. 16 is a waveform diagram showing another example of the sequences of the two types of gate voltages. The first gate voltage transitions between the value Vg1 and the value (−Vg1) as in an example of FIG. 5. The second gate voltage transitions between a value 0 and the value (−Vg2) in contrast to the example of FIG. 5. The second gate voltage transitions at a potential equal to or less than zero.

In the semiconductor device 100A, the conductivity type of each of the semiconductor layers 31 and 32 and the semiconductor layers 41 and 42 is an N type, the conductivity type of the semiconductor layer 2 is a P type, and two types of N-channel type metal-oxide-semiconductor field effect transistors (MOSFETs) are formed. Specifically, a MOSFET (hereinafter provisionally referred to as a "first MOSFET") including the semiconductor layers 41, 2, and 31 and a MOSFET (hereinafter provisionally referred to as a "second MOSFET") including the semiconductor layers 42, 2, and 32 are connected in parallel in the semiconductor device 100A.

The first MOSFET is turned on when the first gate voltage exceeds a predetermined positive value. The second MOSFET is turned on when the second gate voltage exceeds a predetermined positive value.

The first gate voltage and the second gate voltage shown in FIG. 5 exceed predetermined positive values upon a rise to turn on the semiconductor device 100A. When the second MOSFET is turned on later than the first MOSFET, a waveform of a current (the collector current Ic) flowing when the semiconductor device 100A is turned on is disturbed.

Figure 17:
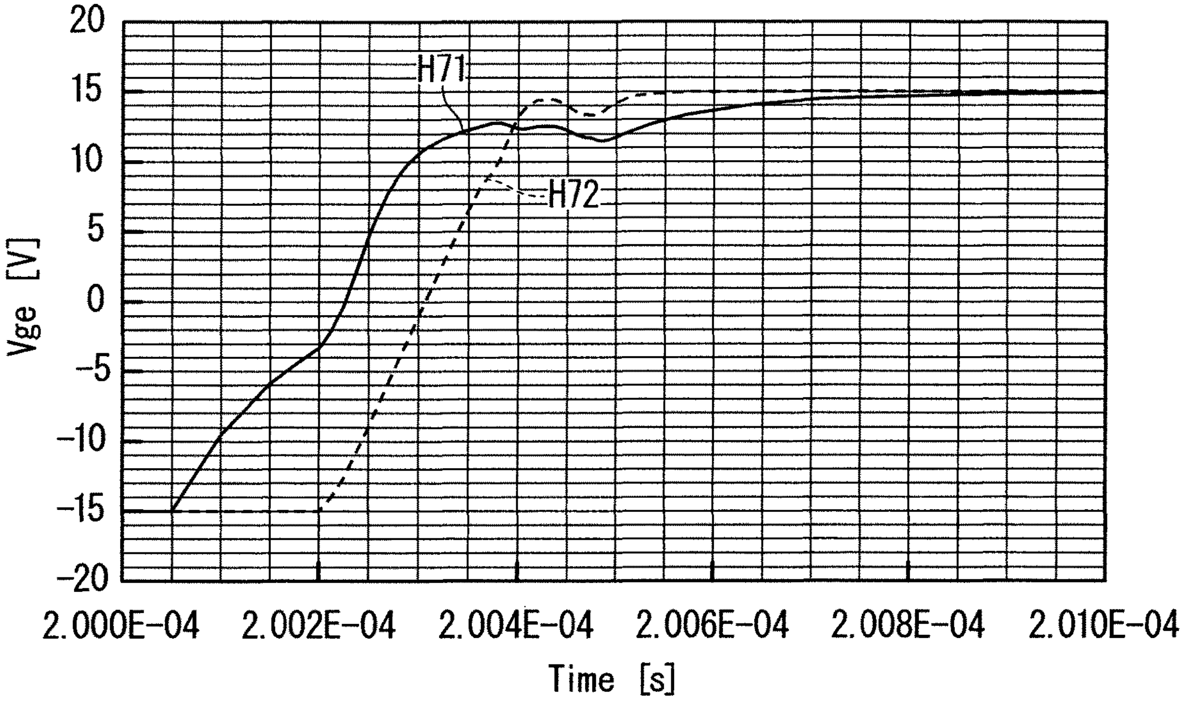
FIG. 17 is a waveform diagram illustrating on transition of the two types of gate voltages.
Figure 18:
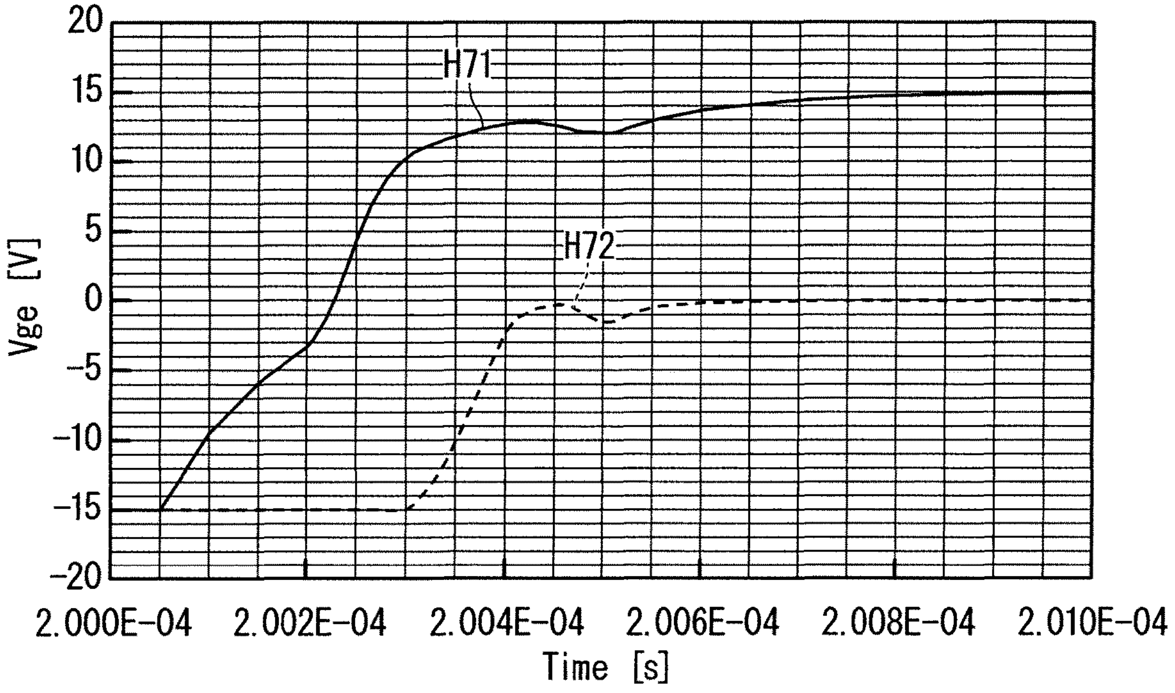
FIG. 18 is a waveform diagram illustrating on transition of the two types of gate voltages.

FIGS. 17 and 18 are waveform diagrams illustrating on transition of the two types of gate voltages. In each of FIGS. 17 and 18, a vertical axis represents a gate voltage Vge [V] commonly used for the first gate voltage and the second gate voltage, and a horizontal axis represents the time [s]. A waveform H71 represents the first gate voltage, and a waveform H72 represents the second gate voltage. FIGS. 17 and 18 each show a case where the second gate voltage rises later than the first gate voltage by 0.15 μs.

FIG. 17 shows a case where the second gate voltage transitions from −15 V to 15 V as with the first gate voltage and corresponds to the sequences of the two types of gate voltages shown in FIG. 5 except for the delay in the rise. FIG. 18 shows a case where the first gate voltage transitions from −15 V to 15 V and the second gate voltage transitions from 0 V to 15 V, and corresponds to the sequences of the two types of gate voltages shown in FIG. 16 except for the delay in the rise.

Figure 19:
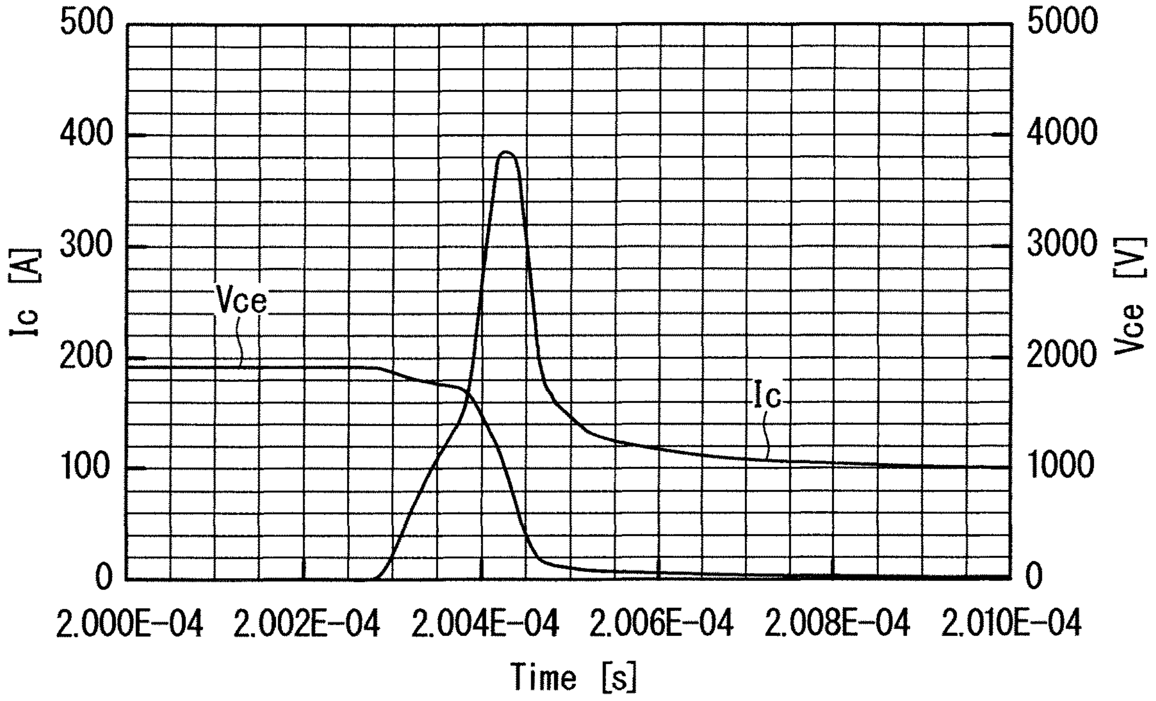
Figure 20:
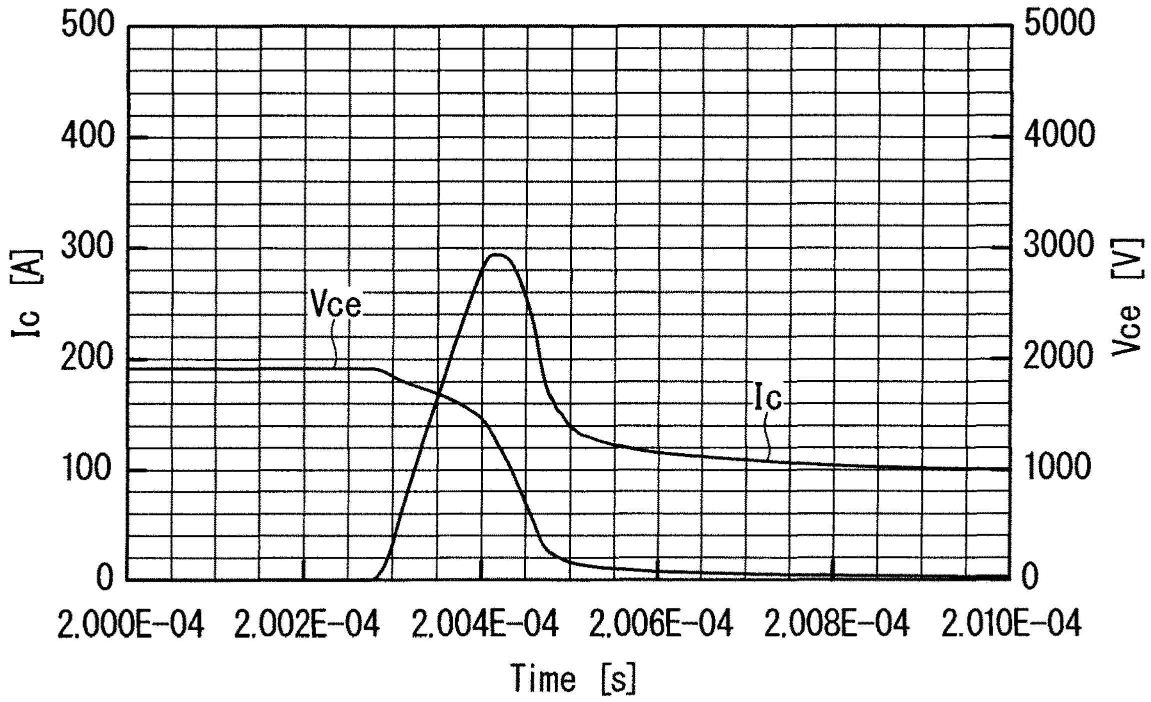

FIG. 19 is a waveform diagram illustrating operation when the semiconductor device 100A is turned on in a case where transition illustrated in FIG. 17 occurs. FIG. 20 is a waveform diagram illustrating operation when the semiconductor device 100A is turned on in a case where transition illustrated in FIG. 18 occurs. In each of FIGS. 19 and 20, a left vertical axis represents the collector current Ic [A], and a right vertical axis represents the collector voltage Vce [V] based on the emitter potential. A horizontal axis represents the time [s].

A waveform of the collector current Ic shown in FIG. 19 is distorted to be pointed near a maximum value thereof. Such distortion does not appear in a waveform of the collector current Ic shown in FIG. 20. When the second gate voltage shown in FIG. 16 is used, the second gate voltage does not reach the predetermined positive value upon transition, and the second MOSFET is not turned on. In this case, the second MOSFET is not turned on after turn-on of the first MOSFET, so that the above-mentioned distortion does not appear in the waveform of the collector current Ic.

When the conductivity type of each of the semiconductor substrate 1 and the semiconductor layers 31, 32, 41 and 42 is the N type, distortion of the collector current Ic flowing through the semiconductor device 100A is suppressed by transition of the second gate voltage at a voltage equal to or less than zero as described above. When the conductivity type of each of the semiconductor substrate 1 and the semiconductor layers 31, 32, 41 and 42 is the P type, distortion of the collector current Ic flowing through the semiconductor device 100A is suppressed by transition of the second gate voltage at a voltage equal to or more than zero.

Embodiment 2

As already described in <Another Example of Second Gate Voltage>, the second MOSFET not being turned on contributes to suppression of distortion of the collector current Ic. For example, the second MOSFET not being formed contributes to suppression of distortion of the collector current Ic.

Figure 21:
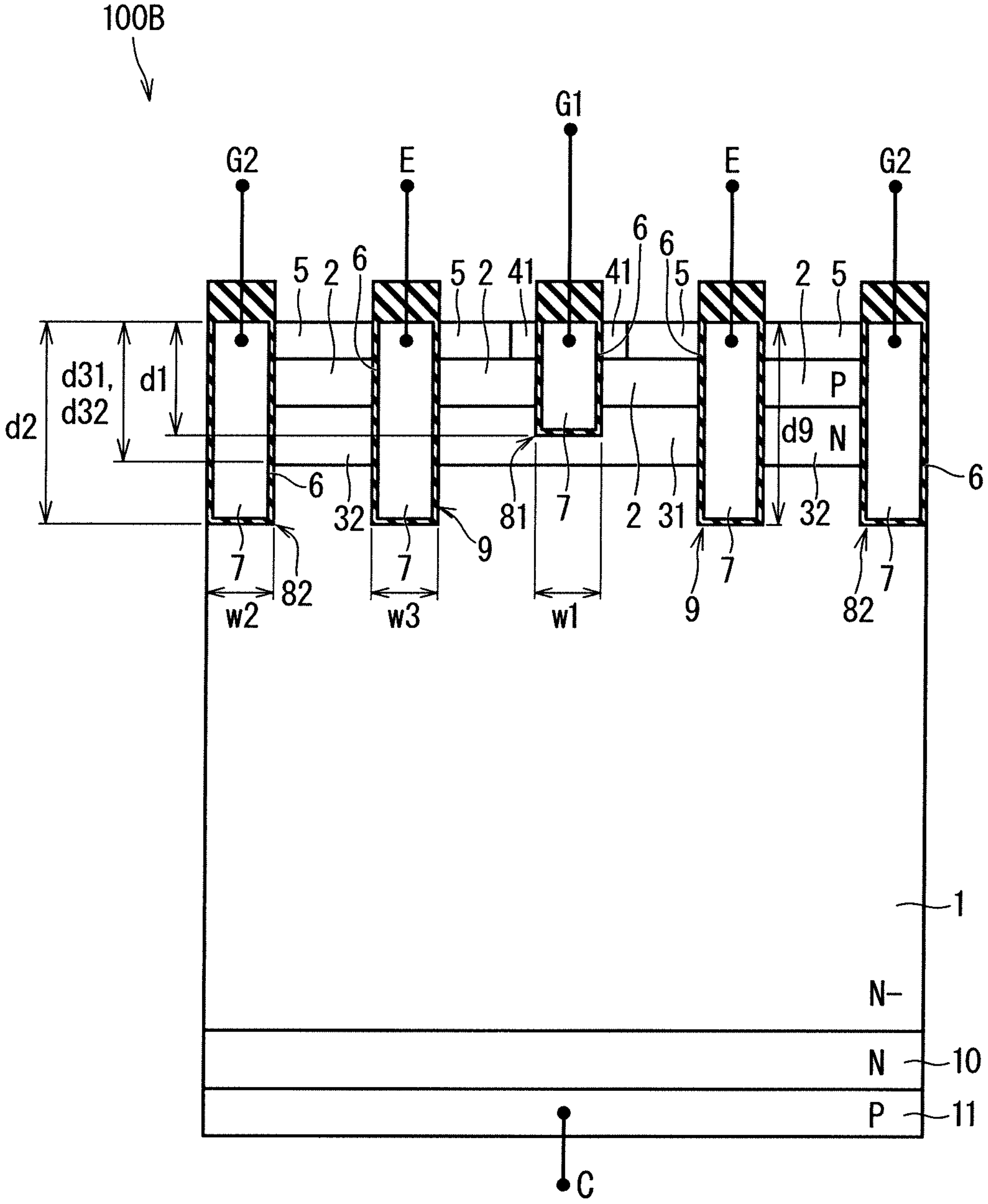
FIG. 21 is a cross-sectional view illustrating a configuration of a semiconductor device according to Embodiment 2.

FIG. 21 is a cross-sectional view illustrating a configuration of the semiconductor device 100B according to Embodiment 2. Compared with the semiconductor device 100A, the semiconductor device 100B does not include the semiconductor layer 42, and the semiconductor layers 2, 5, and 32 are provided between the trench electrodes 82 and 9.

The trench electrode 82 of the semiconductor device 100A extends through the semiconductor layers 2, 42, and 32 to reach the semiconductor substrate 1. The trench electrode 82 of the semiconductor device 100B extends through the semiconductor layers 2, 5, and 32 to reach the semiconductor substrate 1. A surface, specifically, a surface opposite the semiconductor layers 5, 2, and 32 of the trench electrode 82 is insulating.

The semiconductor device 100B does not include the semiconductor layer 42 of the semiconductor device 100A, and the second MOSFET is not formed.

Figure 22:
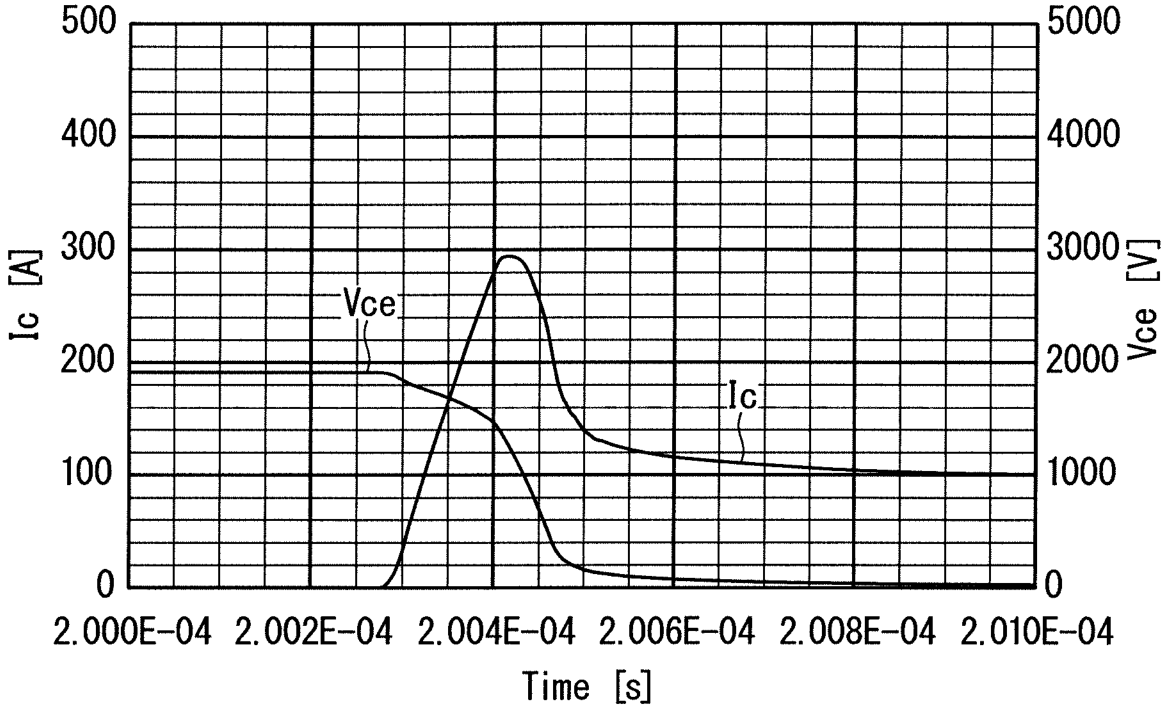

FIG. 22 is a waveform diagram illustrating operation when the semiconductor device 100B is turned on in a case where transition illustrated in FIG. 17 occurs. In FIG. 22, a left vertical axis represents the collector current Ic [A], and a right vertical axis represents the collector voltage Vce [V] based on the emitter potential. A horizontal axis represents the time [s].

Even in a case where the second gate voltage applied to the semiconductor device 100B transitions between a positive value and a negative value as shown in FIG. 17 and rises later than the rise of the first gate voltage, distortion of the collector current Ic does not appear as in a case where the second gate voltage transitions at the voltage equal to or less than zero as shown in FIG. 18.

In the semiconductor device 100B, the trench electrode 9 separates the semiconductor layer 31 from the semiconductor layer 32 as in the semiconductor device 100A, so that the allowable range of the time difference dt by which off transition of the first gate voltage is delayed from off transition of the second gate voltage increases.

Embodiment 3

In a case where the semiconductor layer 31 and the semiconductor substrate 1 have an equal impurity concentration, the semiconductor layer 31 can be considered as a portion of the semiconductor substrate 1, and a portion of the semiconductor substrate 1 on a side of the semiconductor layer 2 can be considered as the semiconductor layer 31.

Figure 23:
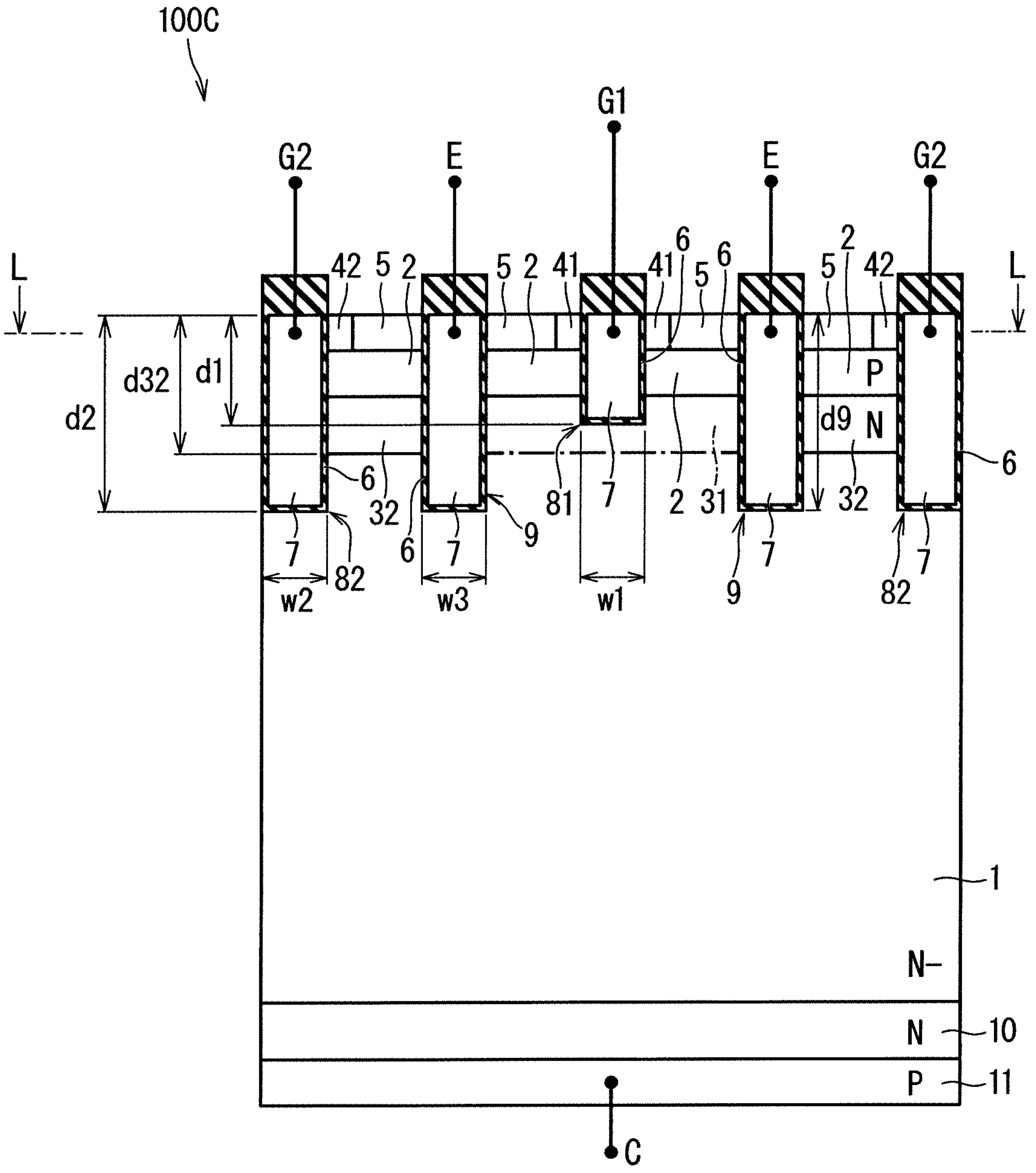
FIG. 23 is a cross-sectional view illustrating a configuration of a semiconductor device according to Embodiment 3.

FIG. 23 is a cross-sectional view illustrating a configuration of the semiconductor device 100C according to Embodiment 3. A region of the semiconductor substrate 1 of the semiconductor device 100C corresponding to a region of the semiconductor layer 31 of the semiconductor device 100A is virtually separated and illustrated as the semiconductor layer 31. In the semiconductor device 100C, it can be said that the semiconductor layer 31 and the semiconductor substrate 1 have an equal impurity concentration.

The cross section illustrated in FIG. 2 and the cross section illustrated in FIG. 3 are each taken along the line LL of FIG. 23. It can be said that FIG. 2 is a cross-sectional view illustrating one example of the configuration of the semiconductor device 100C, and FIG. 3 is a cross-sectional view illustrating another example of the configuration of the semiconductor device 100C.

It can be said that the semiconductor layer 31 has a lower peak impurity concentration in the semiconductor device 100C than in the semiconductor device 100A. Reduction in peak impurity concentration of the semiconductor layer 31 increases the saturation voltage Vce(sat) and contributes to reduction in total amount of loss Eoff (see FIG. 15). As understood from description made using the comparative example in Embodiment 1, the total amount of loss Eoff is greatly affected by operation of the first MOSFET including the semiconductor layer 31 and is little affected by operation of the second MOSFET. The trade-off between the saturation voltage Vce(sat) and the total amount of loss Eoff is thus improved in the semiconductor device 100C compared with that in the semiconductor device 100A.

Embodiment 4

As described in Embodiment 3, reduction in peak impurity concentration of the semiconductor layer 31 contributes to improvement in trade-off between the saturation voltage Vce(sat) and the total amount of loss Eoff. For example, the semiconductor layer 31 has a higher peak impurity concentration than the semiconductor substrate 1 of the semiconductor device 100A and has a lower peak impurity concentration than the semiconductor layer 32.

Figure 24:
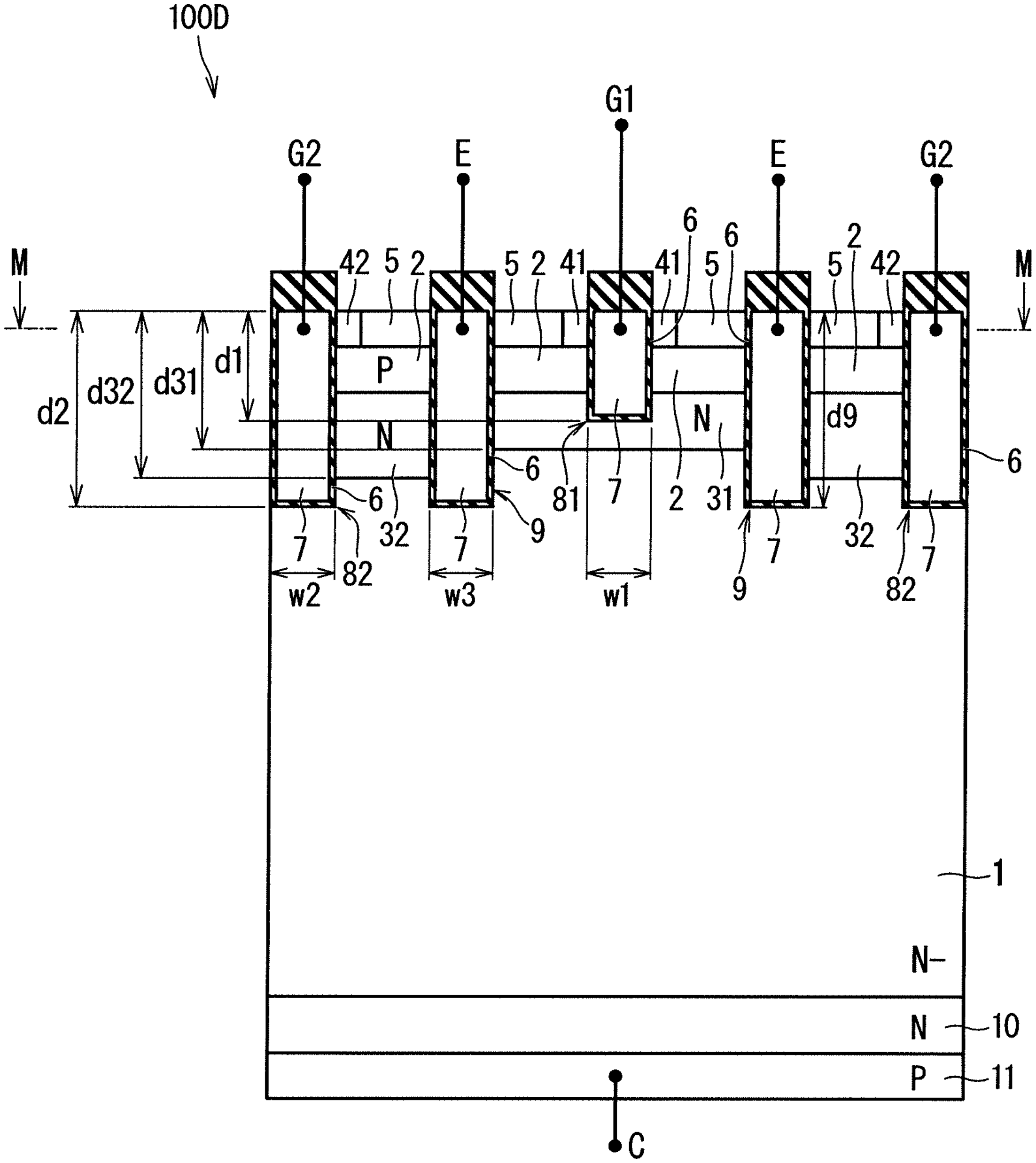
FIG. 24 is a cross-sectional view illustrating a configuration of a semiconductor device according to Embodiment 4.

FIG. 24 is a cross-sectional view illustrating a configuration of the semiconductor device 100D according to Embodiment 4. The cross section illustrated in FIG. 2 and the cross section illustrated in FIG. 3 are each taken along the line MM of FIG. 24. It can be said that FIG. 2 is a cross-sectional view illustrating one example of the configuration of the semiconductor device 100D, and FIG. 3 is a cross-sectional view illustrating another example of the configuration of the semiconductor device 100D.

In the semiconductor device 100A, the semiconductor layer 31 has substantially the same peak impurity concentration as the semiconductor layer 32, for example. In the semiconductor device 100D, the semiconductor layer 31 has a lower peak impurity concentration than the semiconductor layer 32. The trade-off between the saturation voltage Vce (sat) and the total amount of loss Eoff is improved in the semiconductor device 100D compared with that in the semiconductor device 100A.

<Positional Relationship between Depths of Trench Electrodes 81, 82, and 9 and Bottoms of Semiconductor Layers 31 and 32>

FIG. 24 shows depths d1, d2, d9, d31, and d32 defined in the semiconductor device 100D. The depths d1, d2, d9, d31, and d32 are similarly shown in each of the semiconductor device 100A (see FIG. 1) and the semiconductor device 100B (see FIG. 21). The depths d1, d2, d9, and d32 are similarly shown in the semiconductor device 100C (see FIG. 23) (the depth d31 is not shown as the semiconductor layer 31 is a portion of the semiconductor substrate 1 in the semiconductor device 100C).

As a position (hereinafter provisionally referred to as a "reference position") based on which the depths d1, d2, d9, d31, and d32 are defined, a position of surfaces (hereinafter provisionally referred to as "semiconductor device surfaces") of the semiconductor layers 41, 42, and 5 farther from the semiconductor layer 11 is used. For example, the semiconductor device surfaces of the semiconductor layers 41, 42, and 5 are located to be substantially co-planar. For example, the position of the semiconductor device surface of the semiconductor layer 5 is used as the reference position.

As will be described below, the semiconductor layers 41, 42, and 5 are formed over one main surface of the semiconductor substrate 1 and, the semiconductor substrate 1 remains on a side of the semiconductor layer 11 relative to the semiconductor layers 41, 42, and 5. Since the trench electrodes 81, 82, and 9 each extend through any of the semiconductor layers 41, 42, and 5 as described above, it can be said that openings thereof are located at the semiconductor device surfaces as ends on an opposite side from the semiconductor layer 11 (ends on an opposite side from "bottoms" described below).

The depth d1 is a depth of the bottom (a portion closest to the semiconductor layer 11: the same applies to the following) of the trench electrode 81, the depth d2 is a depth of the bottom of the trench electrode 82, and the depth d9 is a depth of the bottom of the trench electrode 9. For example, the depth d2 and the depth d9 matching each other allow for parallel formation of trenches used for the trench electrodes 82 and 9 in manufacturing steps (described below), contributing to simplification of formation processing.

The trench electrode 82 can be seen to protrude from the semiconductor layer 32 to the semiconductor substrate 1 in a direction of extension of the trench electrode 82 (the direction of the thickness of the semiconductor substrate 1). The trench electrode 9 can be seen to protrude from the semiconductor layer 32 to the semiconductor substrate 1 in a direction of extension of the trench electrode 9 (the direction of the thickness of the semiconductor substrate 1).

For example, a length by which the trench electrode 82 protrudes from the semiconductor layer 32 in the direction of extension thereof and a length by which the trench electrode 9 protrudes from the semiconductor layer 32 in the direction of extension thereof are equal to each other. When the lengths of the protrusions are equal to each other as described above, and the semiconductor device surfaces of the semiconductor layers 41, 42, and 5 are located to be substantially co-planar, the depth d2 and the depth d9 match each other.

The depth d31 is a depth of the bottom of the semiconductor layer 31, and the depth d32 is a depth of the bottom of the semiconductor layer 32. In each of the semiconductor devices 100A and 100B, the depths d31 and d32 are equal to each other as illustrated in each of FIGS. 1 and 21, for example.

As described above, the semiconductor layers 31 and 32 serve as the carrier storage layers. It can be said that the depths d31 and d32 indicate boundaries of the carrier storage layers on a side of the collector layer.

The trench electrode 81 extends and reaches the semiconductor layer 31 at a position farther from the semiconductor layer 11 than the boundary between the semiconductor layer 32 and the semiconductor substrate 1 is. The trench electrode 81 does not extend through the semiconductor layer 31 in terms of the semiconductor layer 31 serving as a carrier storage layer of the first MOSFET, for example. The positional relationship is expressed using the depths d1 and d32 by an inequality d1<d32. Furthermore, the semiconductor devices 100A, 100B, and 100D each have a positional relationship expressed using the depth d31 by an inequality d1<d31.

The semiconductor device 100D further has a relationship expressed by an inequality d31<d32, and the semiconductor layer 31 is thinner than the semiconductor layer 32, for example. The relationship contributes to simplification of a process to obtain the semiconductor layers 31 and 32, specifically, processing to diffuse impurities in the manufacturing steps (described below).

Extension of the trench electrodes 9 and 82 through the semiconductor layers 31 and 32 to a side of the semiconductor layer 11 to reach the semiconductor substrate 1 (d31<d2, d32<d2, d31<d9, and d32<d9) relieves electric field concentration in the semiconductor layers 31 and 32 when each of the semiconductor devices 100A, 100B, and 100D operates and contributes to improvement in breakdown voltage.

Extension of the trench electrodes 9 and 82 through the semiconductor layer 32 to a side of the semiconductor layer 11 to reach the semiconductor substrate 1 (d32<d2 and d32<d9) relieves electric field concentration in the semiconductor layer 32 when the semiconductor device 100C operates and contributes to improvement in breakdown voltage.

<Spacing between Trench Electrodes 81, 82, and 9>

Figure 25:
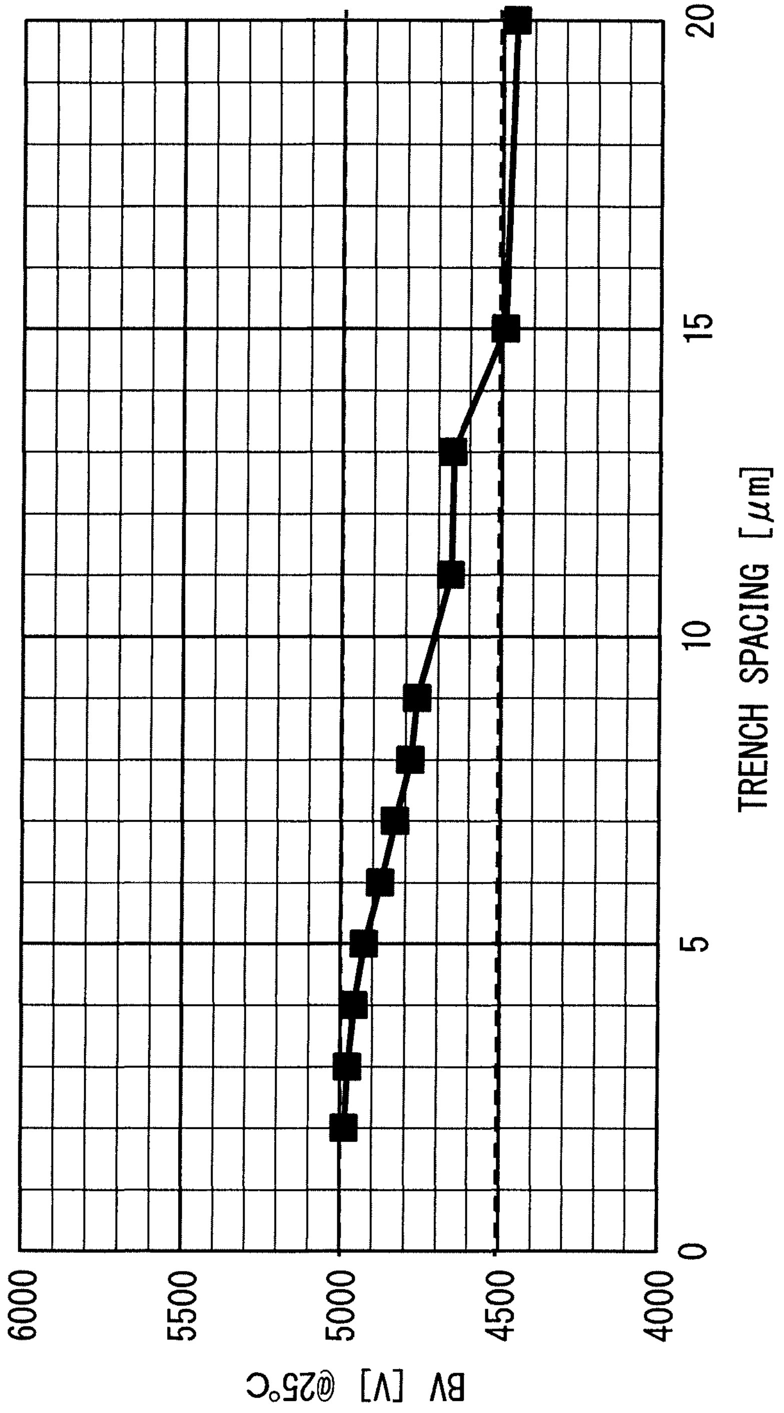
FIG. 25 is a graph illustrating a relationship between a breakdown voltage of the semiconductor device and spacing between trench electrodes.

FIG. 25 is a graph illustrating a relationship between the breakdown voltage of each of the semiconductor devices 100A, 100B, 100C, and 100D and spacing between the trench electrodes 81, 82, and 9. In FIG. 25, a vertical axis represents a breakdown voltage BV [V] at 25° C., and a horizontal axis represents trench spacing [μm]. The trench spacing herein corresponds to spacing between the trench electrode 82 and the trench electrode 9 adjacent to each other along a direction in which they are arranged. The trench electrode 9 is located on each of one side and the other side of the trench electrode 81 in a direction in which the trench electrode 9 and the trench electrode 81 are arranged (see FIGS. 1, 21, 23, and 24). Spacing between the trench electrodes 9 adjacent to each other via the trench electrode 81 also corresponds to the trench spacing.

Reduction in breakdown voltage with increasing trench spacing is observed in FIG. 25. For example, in a case where the semiconductor layers 31 and 32 each have the same peak impurity concentration as the semiconductor substrate 1, and the trench spacing is 15 μm, the breakdown voltage is approximately 90% of a target breakdown voltage.

Narrow trench spacing enhances a field plate effect between the trench electrodes 9 and 82, relieves electric field concentration near the bottom of the trench electrode 82, and further contributes to improvement in breakdown voltage.

A higher peak impurity concentration of each of the semiconductor layers 31 and 32 than the semiconductor substrate 1 makes dependence of the breakdown voltage on the trench spacing noticeable. The above-mentioned semiconductor devices 100A, 100B, 100C and 100D each include the N-type semiconductor substrate 1 and the N type semiconductor layer 32. In this case, trench spacing of less than 15 μm contributes to the breakdown voltage of each of the semiconductor devices 100A, 100B, 100C, and 100D that is 90% or more of the target breakdown voltage.

<First Method of Manufacturing Semiconductor Device 100A>

FIGS. 26 to 37 are cross-sectional views illustrating part of a first method of manufacturing the semiconductor device 100A according to Embodiment 1, in particular, steps of manufacturing the trench electrodes 81, 82, and 9 in order of the steps.

Figure 26:
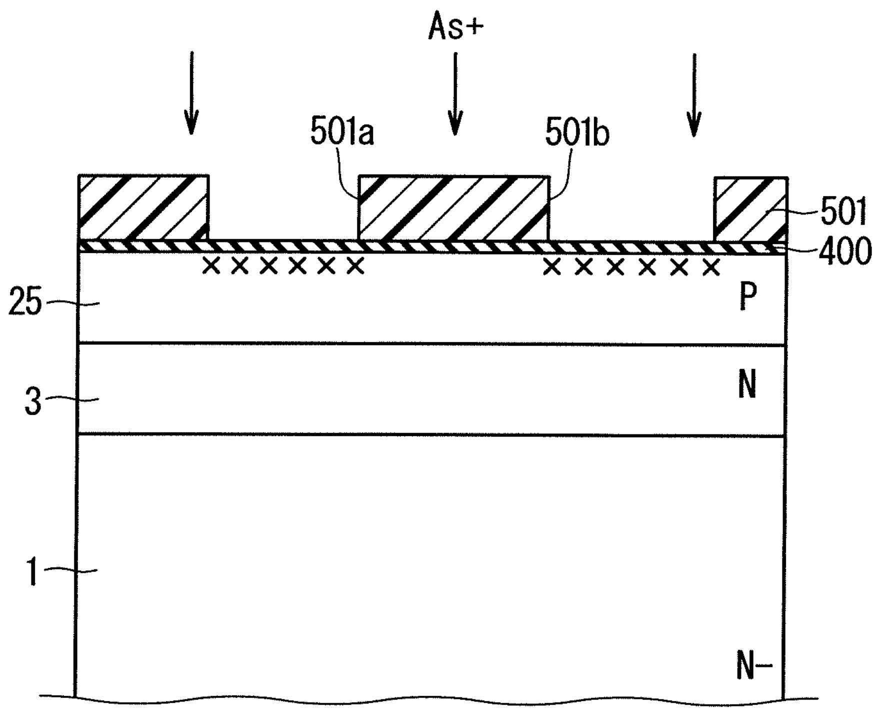
FIGS. 26 to 37 are cross-sectional views illustrating part of a first method of manufacturing the semiconductor device according to Embodiment 1 in order of steps.

FIG. 26 illustrates a step of introducing N type impurities into a structure in which semiconductor layers 25 and 3 are already formed using the semiconductor substrate 1. The semiconductor layer 3 later becomes the semiconductor layers 31 and 32. The semiconductor layers 2 and 5 are collectively shown as the semiconductor layer 25.

A configuration of the semiconductor substrate 1 on an opposite side from the semiconductor layers 25 and 3 is omitted. For example, the semiconductor layers 10 and 11 are already provided on an opposite side of the semiconductor substrate 1 from the semiconductor layers 25 and 3. The semiconductor layers 10 and 11 are not shown in description of the manufacturing method herein and description of manufacturing methods below.

Before introduction of the N type impurities, the semiconductor substrate 1, the semiconductor layer 3, the semiconductor layer 25, a dielectric film 400, and a mask 501 are stacked in this order along a direction from the bottom to the top of the page of FIG. 26.

The dielectric film 400 is achieved by an oxide film obtained by oxidation of the semiconductor substrate 1 before the semiconductor layers 25 and 3 are provided, for example. When silicon is used as a material for the semiconductor substrate 1, the dielectric film 400 is a silicon oxide film, for example.

The mask 501 has openings 501*a* and 501*b*. The openings 501*a* and 501*b* are formed in the mask 501 to correspond to positions at which the semiconductor layers 41 and 42 (see FIG. 1) are formed. A patterned photoresist film is used as the mask 501, for example. The openings 501*a* and 501*b* are formed in the photoresist film by a photolithography technique, for example.

As the N type impurities, arsenic (As) is introduced, for example. FIG. 26 illustrates a case where ion implantation using arsenic ions (As+: a sign "+" herein does not indicate the magnitude of the impurity concentration but indicates that the ions are positive ions) is used in introduction of the N type impurities. Cross signs in the semiconductor layer 25 schematically show positions at which the N type impurities are introduced.

Figure 27:
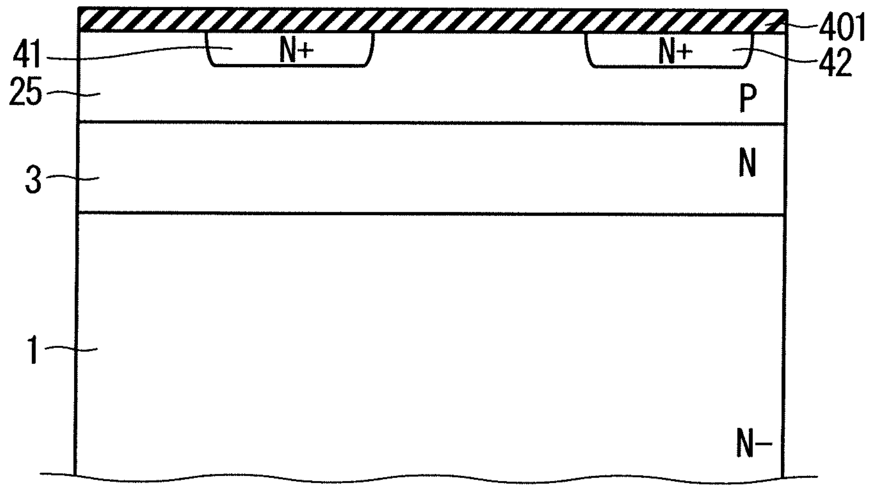

After introduction of the N type impurities, the mask 501 is removed by known technology to expose the dielectric film 400. After exposure of the dielectric film 400, at least near the semiconductor layer 25, the structure as a whole for example is heated to diffuse the introduced N type impurities (so-called "drive-in"). Due to diffusion, the semiconductor layers 41 and 42 are formed as illustrated in FIG. 27. When the dielectric film 400 is the silicon oxide film, the dielectric film 400 increases in thickness to be a dielectric film 401 by the drive-in, for example.

Figure 28:
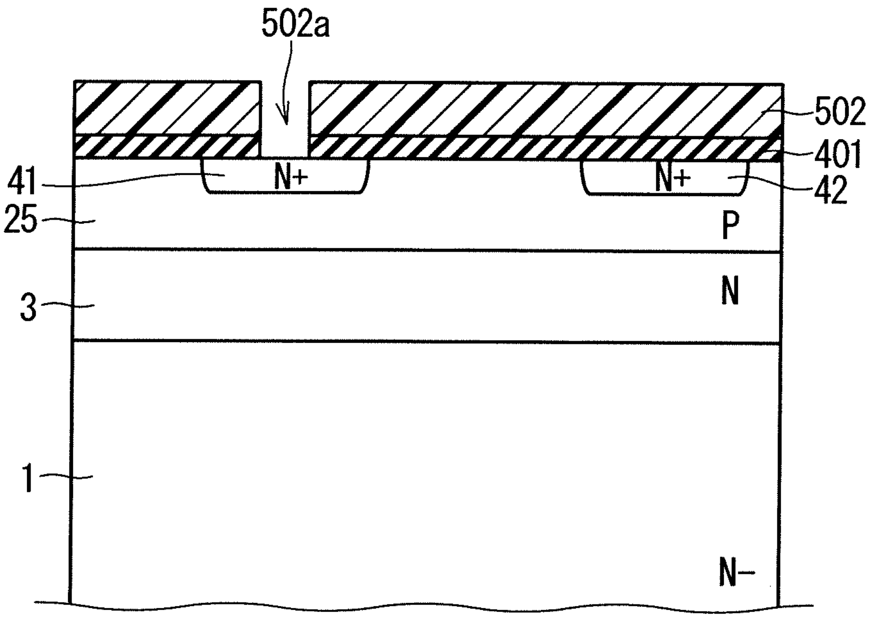

A mask 502 is provided on an opposite side of the dielectric film 401 from the semiconductor substrate 1 (FIG. 28). The mask 502 has an opening 502*a*. The opening 502*a* is formed in the mask 502 to correspond to a position at which the trench electrode 81 (see FIG. 1) is formed. A patterned photoresist film is used as the mask 502, for example. The opening 502*a* is formed in the photoresist film by a photolithography technique, for example. By etching of the dielectric film 401 via the mask 502, a hole corresponding to the opening 502*a* is formed in the dielectric film 401 to partially expose the semiconductor layer 41.

Figure 29:
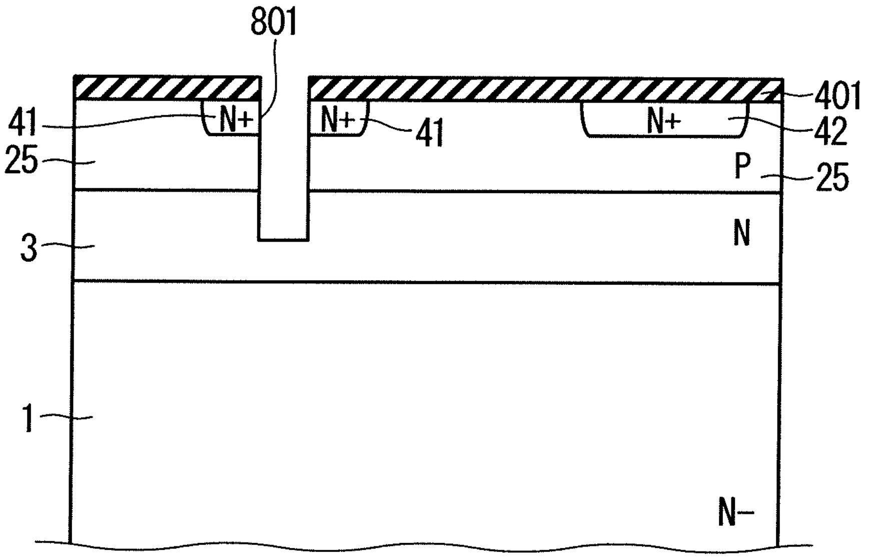

The semiconductor layers 41, 25, and 3 are selectively etched using the mask 502 and the dielectric film 401 opening as described above as a mask to form a trench 801 extending through the semiconductor layers 41 and 25 to reach the semiconductor layer 3 (FIG. 29). A position of the trench 801 corresponds to a position at which the trench electrode 81 is provided.

Figure 30:
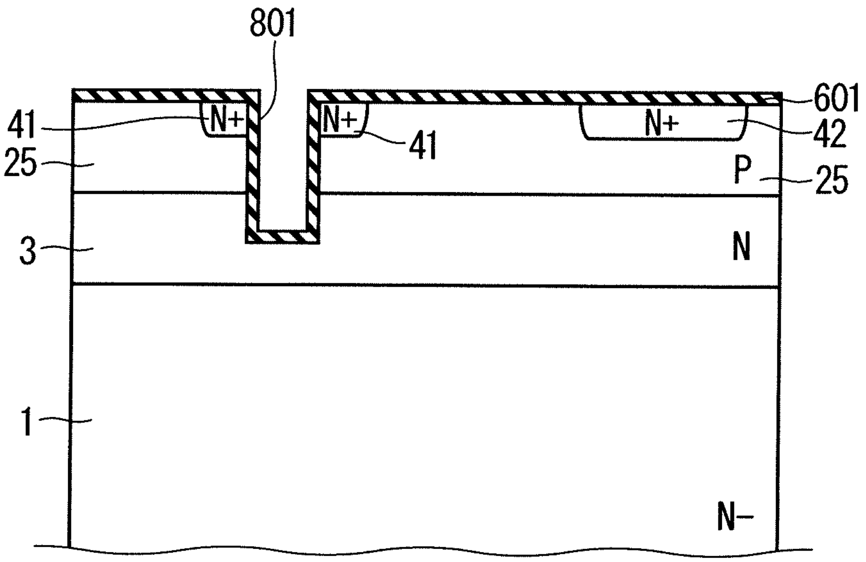

The dielectric film 401 is removed by known technology, such as etching. An dielectric film 601 is formed on portions of the semiconductor layers 41, 25, and 3 exposed at an inner wall of the trench 801 and portions of the semiconductor layers 41, 42, and 25 exposed by removal (FIG. 30). The dielectric film 601 in the trench 801 later becomes the dielectric film 6 responsible for insulation at the surface of the trench electrode 81. Thermal oxidation is used for formation of the dielectric film 601, for example.

Figure 31:
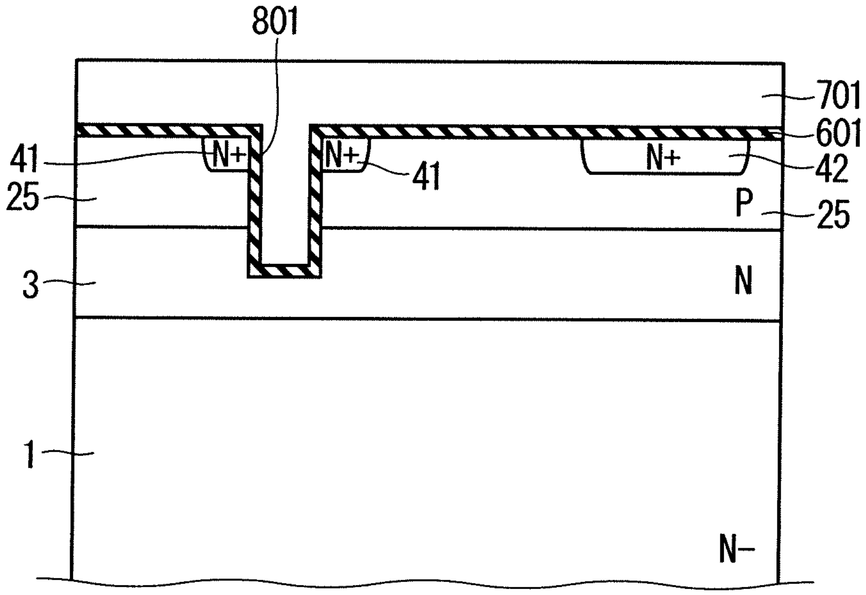

A conductor 701 is provided on an opposite side of the dielectric film 601 from the semiconductor substrate 1 including the interior of the trench 801 (FIG. 31). The trench 801 is filled with the dielectric film 601 and the conductor 701. Polysilicon doped at a high impurity concentration is used as the conductor 701, for example.

Figure 32:
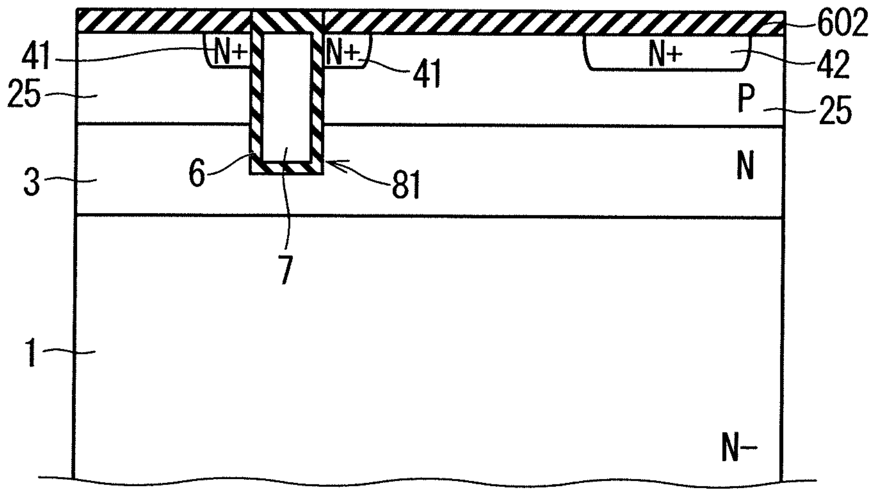

The conductor 701 is etched from an opposite side from the semiconductor substrate 1 to remain only in the trench 801 (so-called "etch back") and becomes the conductor 7 to be exposed (FIG. 32). A surface of the conductor 7 exposed in the trench 801 is then oxidized, for example, by oxidation processing to obtain the trench electrode 81. The dielectric film 601 increases in thickness due to the oxidation processing to obtain a dielectric film 602. It can be said that the trench electrode 81 is embedded in the trench 801 in view of the above-mentioned manufacturing steps.

Figure 33:
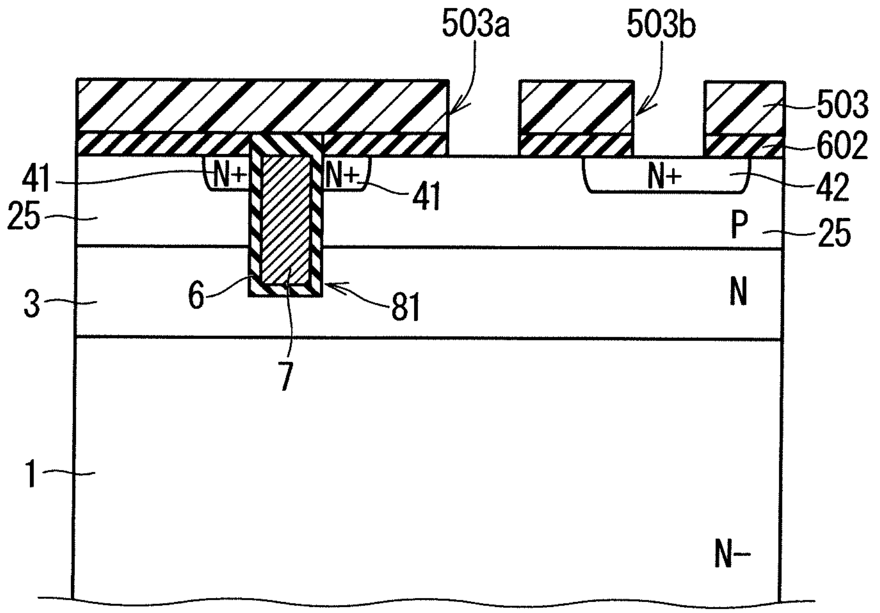

A mask 503 is provided on an opposite side of the dielectric film 602 from the semiconductor substrate 1 (FIG. 33). The mask 503 has openings 503*a* and 503*b*. The openings 503*a* and 503*b* are formed in the mask 503 to correspond to positions at which the trench electrodes 9 and 82 (see FIG. 1) are formed. A patterned photoresist film is used as the mask 503, for example. The openings 503*a* and 503*b* are formed in the photoresist film by a photolithography technique, for example. By etching of the dielectric film 602 via the mask 503, holes corresponding to the openings 503*a* and 503*b* are formed in the dielectric film 602 to partially expose the semiconductor layer 42.

The semiconductor layers 25 and 3 and the semiconductor substrate 1 are selectively etched using the mask 503 and the dielectric film 602 opening as described above as a mask to form trenches 90 and 802 (FIG. 34).

A position of the trench 90 corresponds to a position at which the trench electrode 9 is provided. The trench 90 extends through the semiconductor layers 25 and 3 to reach the semiconductor substrate 1. A position of the trench 802 corresponds to a position at which the trench electrode 81 is provided. The trench 802 extends through the semiconductor layers 42, 25, and 3 to reach the semiconductor substrate 1. The semiconductor layer 3 is divided into the semiconductor layers 31 and 32 by formation of the trenches 90 and 802.

Figure 35:
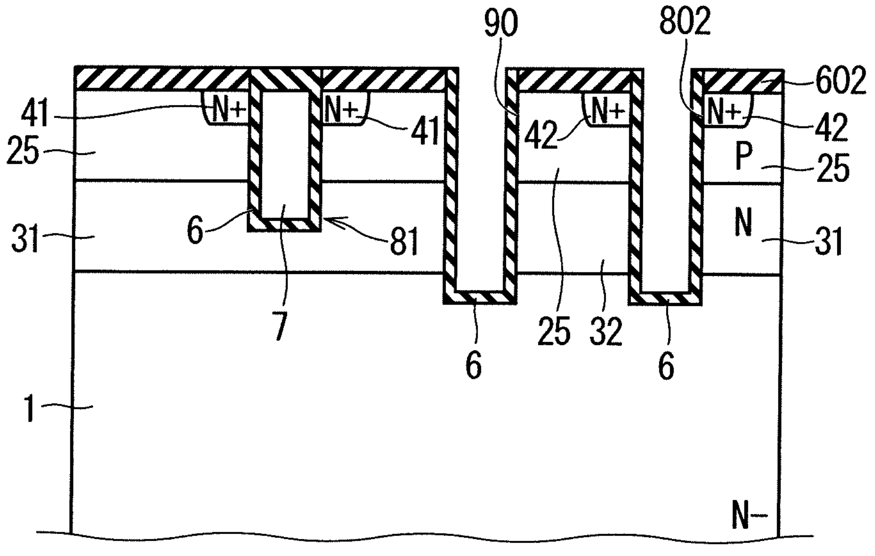

The dielectric film 6 is formed on portions of the semiconductor layers 31, 32, 42, and 25 and the semiconductor substrate 1 exposed at inner walls of the trenches 90 and 802 (FIG. 35). The dielectric film 6 in the trench 802 is responsible for insulation at the surface of the trench electrode 82 later. The dielectric film 6 in the trench 90 is responsible for insulation at the surface of the trench electrode 9 later. Thermal oxidation is used for formation of the dielectric film 6, for example.

Figure 36:
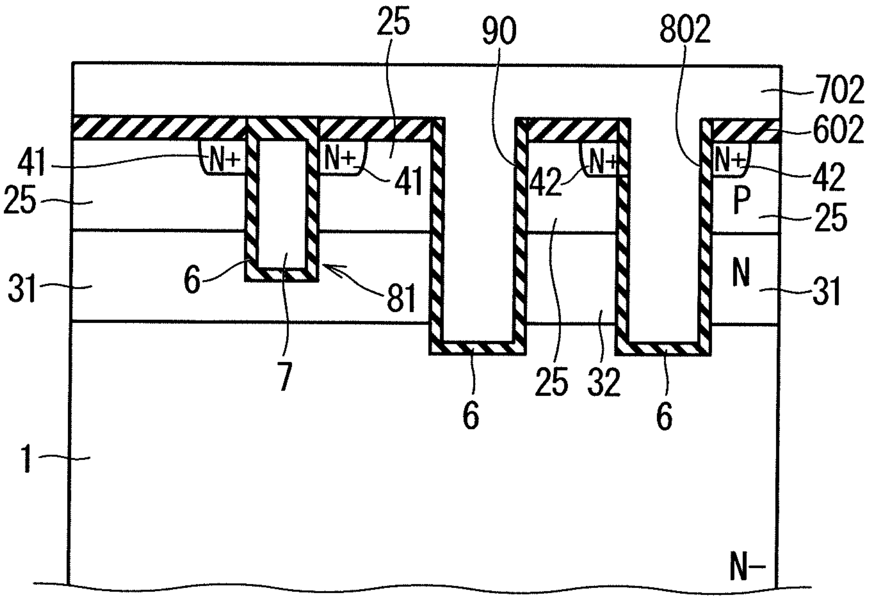

A conductor 702 is provided on an opposite side of the dielectric film 6 in the trenches 90 and 802 and the dielectric film 602 from the semiconductor substrate 1 (FIG. 36). The trenches 90 and 802 are each filled with the dielectric film 6 and the conductor 702. Polysilicon doped at a high impurity concentration is used as the conductor 702, for example.

Figure 37:
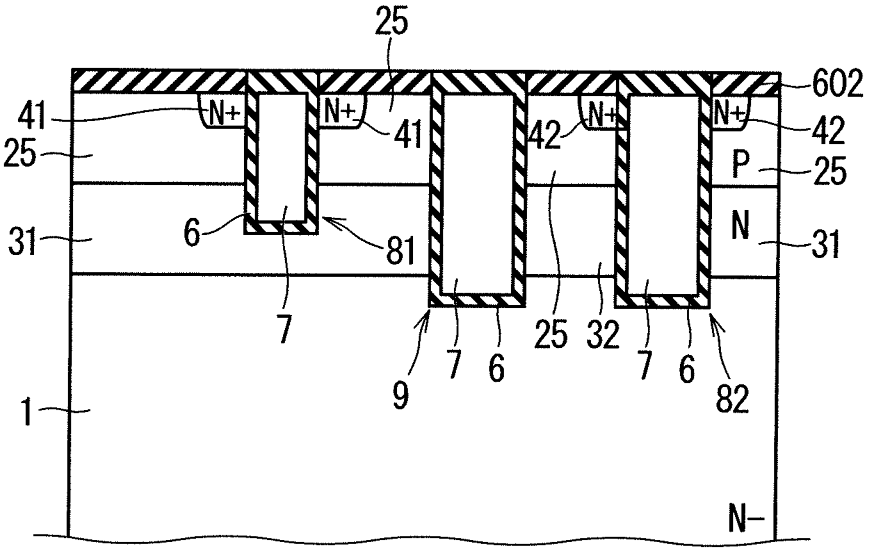

The conductor 702 remains only in the trenches 90 and 802 by etch-back from an opposite side from the semiconductor substrate 1 and becomes the conductor 7 to be exposed (FIG. 37). Surfaces of the conductor 702 exposed in the trenches 90 and 802 are then oxidized, for example, by oxidation processing to obtain the trench electrodes 9 and 82 respectively corresponding to the trenches 90 and 802. It can be said that the trench electrode 82 is embedded in the trench 802 and the trench electrode 9 is embedded in the trench 90 in view of the above-mentioned manufacturing steps.

Figure 34:
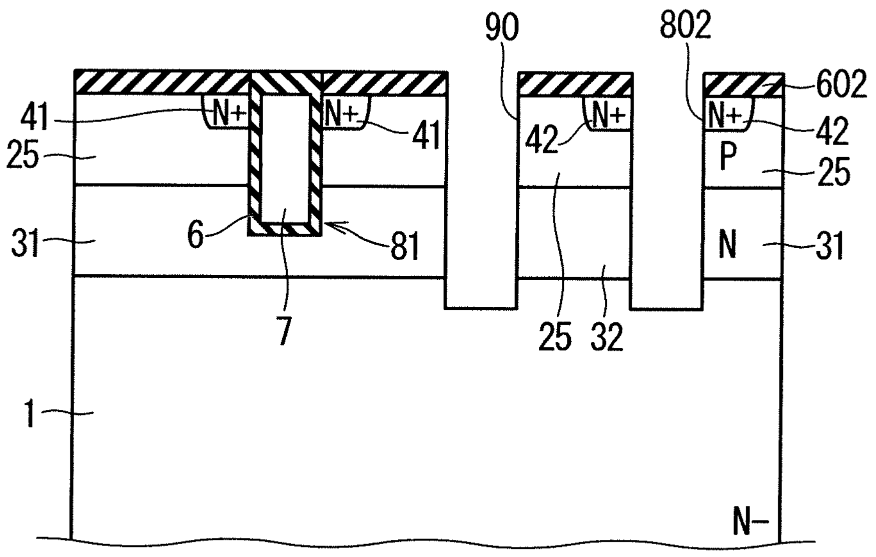

The trenches 90 and 802 are formed in parallel processing (see FIG. 34). The position of the bottom of the trench electrode 82 (e.g., the depth d2) and the position of the bottom of the trench electrode 9 (e.g., the depth d9) matching each other contributes to use of the processing. Use of the parallel processing contributes to simplification of formation of the trench electrodes 82 and 9 and further to simplification of the steps of manufacturing the semiconductor device 100A. Simplification of the manufacturing steps contributes to reduction in cost of manufacturing the semiconductor device 100A.

The above-mentioned formation of the trenches 802 and 90 can be described as follows: prior to formation of the trench electrodes 82 and 9, the trench 802 in which the trench electrode 82 is embedded and the trench 90 in which the trench electrode 9 is embedded are formed in parallel by selective etching using the mask 503 having the openings 503*a* and 503*b*.

Formation of the trenches 90 and 802 may precede formation of the trench 801. Formation of the trench 801 may precede formation of the semiconductor layer 41. Formation of the trenches 90 and 802 may precede formation of the semiconductor layer 42.

<Second Method of Manufacturing Semiconductor Device 100A>

FIGS. 38 to 41 are cross-sectional views illustrating part of a second method of manufacturing the semiconductor device 100A, in particular, steps of manufacturing the trench electrodes 81, 82, and 9 in order of the steps.

Figure 38:
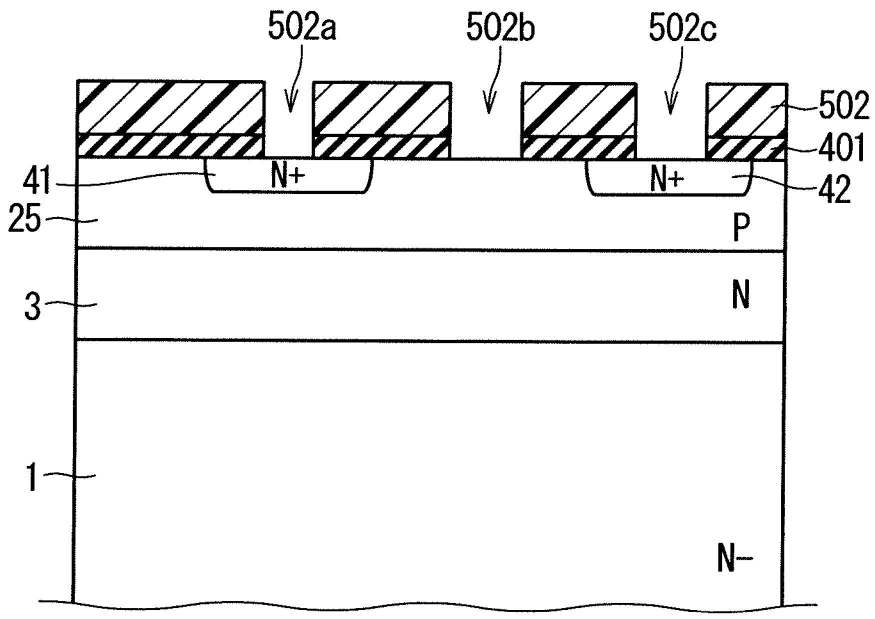
FIGS. 38 to 41 are cross-sectional views illustrating part of a second method of manufacturing the semiconductor device according to Embodiment 1 in order of steps.

Similarly to the first manufacturing method, after the structure illustrated in FIG. 27 is obtained, the mask 502 is provided on an opposite side of the dielectric film 401 from the semiconductor substrate 1 (FIG. 38). The mask 502 has the opening 502*a* and openings 502*b* and 502*c*. The openings 502*a*, 502*b*, and 502*c* are formed in the mask 502 to correspond to the positions at which the trench electrodes 81, 9, and 82 (see FIG. 1) are formed. By etching of the dielectric film 401 via the mask 502, holes corresponding to the openings 502*a*, 502*b*, and 502*c* are formed in the dielectric film 401 to partially expose the semiconductor layers 41 and 42.

Figure 39:
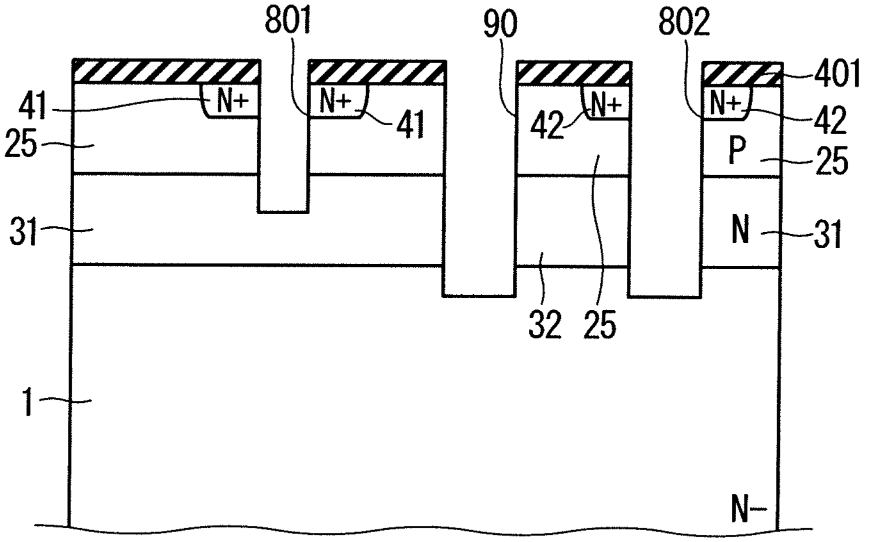

The semiconductor layers 25, 3, 41, and 42 and the semiconductor substrate 1 are selectively etched using the mask 502 and the dielectric film 401 opening as described above as a mask to form the trenches 801, 90, and 802 (FIG. 39).

The position of the trench 801 corresponds to the position at which the trench electrode 81 is provided. The trench 801 extends through the semiconductor layers 41 and 25 to reach the semiconductor layer 3. The position of the trench 802 corresponds to the position at which the trench electrode 82 is provided. The trench 802 extends through the semiconductor layers 42, 25, and 3 to reach the semiconductor substrate 1. The position of the trench 90 corresponds to the position at which the trench electrode 9 is provided. The trench 90 extends through the semiconductor layers 25 and 3 to reach the semiconductor substrate 1.

The semiconductor layer 3 is divided into the semiconductor layers 31 and 32 by formation of the trenches 90 and 802.

The trenches 90 and 802 are respectively used for formation of the trench electrodes 9 and 82. The dielectric film 6 used for insulation of the surfaces of the trench electrodes 9, 81, and 82 serves as a so-called gate dielectric film, and thus thicknesses of the dielectric film 6 in the trenches 90, 801, and 802 are substantially equal. The trench electrodes 9 and 82 are formed to be deeper than the trench electrode 81, so that the trenches 90 and 802 are formed to be deeper than the trench 801.

Parallel formation of the deep trenches 90 and 802 and the shallow trench 801 as described above is facilitated by opening the trenches 90 and 802 more widely than the trench 801. For example, with increasing width of an opening of a mask used for selective etching, the width of an opening of an obtained trench increases, and an etching speed increases.

Figure 42:
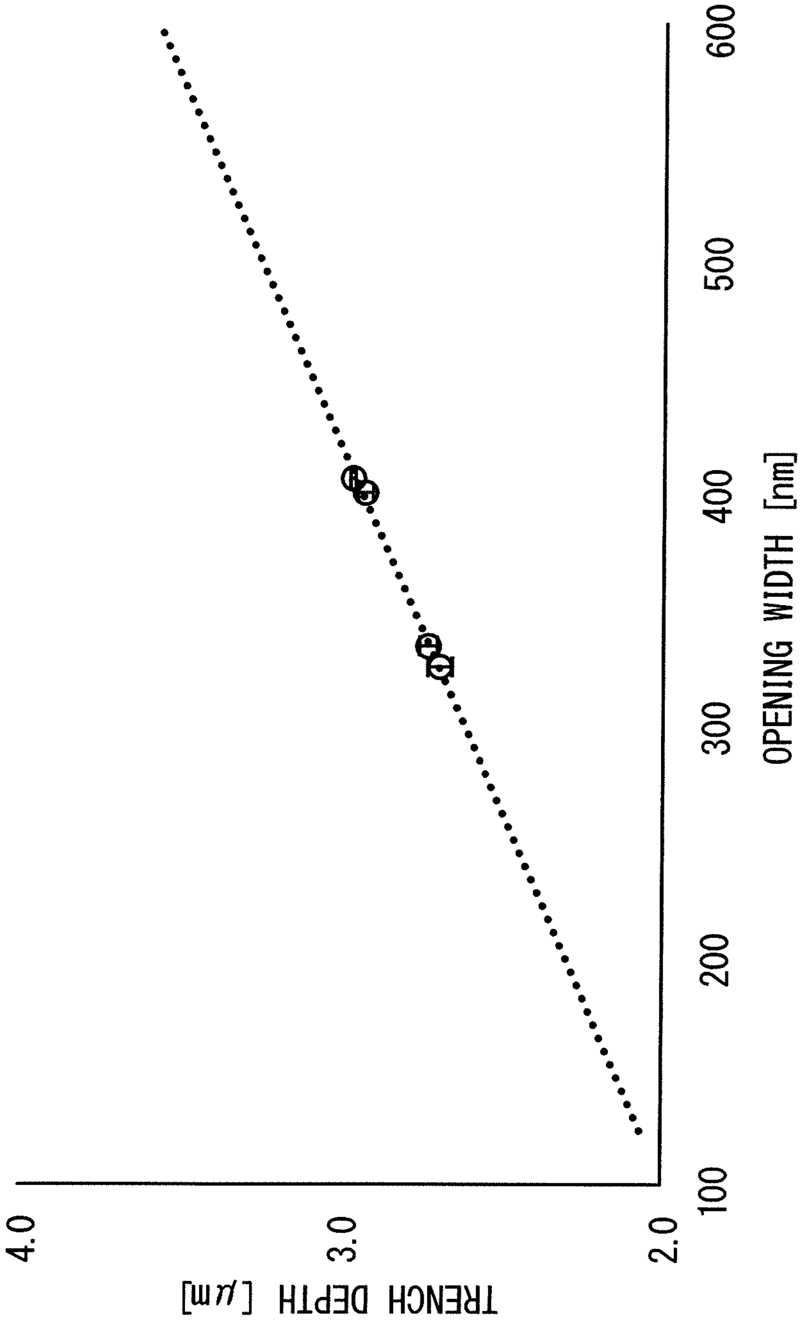
FIG. 42 is a graph illustrating a relationship between a trench depth and an opening width of a mask.

FIG. 42 is a graph illustrating a relationship between a trench depth and an opening width of the mask when the trench is formed by selective etching using the mask having an opening. A horizontal axis represents a minimum width of the opening of the mask as the opening width [nm]. For example, when the opening is rectangular, the length of a short side of the rectangle is used as the opening width. A vertical axis represents the trench depth [μm].

As is observed from FIG. 42, the depth of the formed trench increases with increasing opening width of the mask.

Since the trench electrodes 81, 82, and 9 are respectively embedded in the trenches 801, 802, and 90, the depths of the trenches 801, 802, and 90 can substantially be treated as the depths d1, d2, and d9.

The openings 502*b* and 502*c* wider than the opening 502*a* contribute to parallel formation of the deep trenches 90 and 802 and the shallow trench 801 and further to simplification of processing to form the trench electrodes 81, 82, and 9.

For example, widths w2 and w3 of the trench electrodes 82 and 9 extending to be deeper than the trench electrode 81 are each greater than a width w1 of the trench electrode 81 (see FIG. 1). The widths w1, w2, and w3 are sizes of the trench electrodes 81, 82, and 9 in a direction (left-right direction in the page of FIG. 1) orthogonal to the direction (a top-bottom direction in the page of FIG. 1) of extension of the trench electrodes 81, 82, and 9.

The width of the formed trench typically increases with increasing opening width of the mask. Since the trench electrodes 81, 82, and 9 are respectively embedded in the trenches 801, 802, and 90, the widths of the trenches 801, 802, and 90 can substantially be treated as the widths w1, w2, and w3. Formation of the trench electrodes 81, 82, and 9 having the above-mentioned relationship of the width (w1<w2, w1<w3) contributes to parallel formation of the deep trenches 90 and 802 and the shallow trench 801 and contributes to the above-mentioned simplification and further to suppression of the manufacturing cost. The same applies to the semiconductor devices 100B, 100C, and 100D and methods of manufacturing them (see FIGS. 21, 23, and 24).

The above-mentioned formation of the trenches 801, 802, and 90 can be described as follows: prior to formation of the trench electrodes 81, 82, and 9, the trench 801 in which the trench electrode 81 is embedded, the trench 802 in which the trench electrode 82 is embedded, and the trench 90 in which the trench electrode 9 is embedded are formed in parallel by selective etching using the mask 502 having the openings 502*a*, 502*b* and 502*c*. The opening 502*b* used for etching to form the trench 802 and the opening 502*c* used for etching to form the trench 90 are each wider than the opening 502*a* used for etching to form the trench 801.

Figure 40:
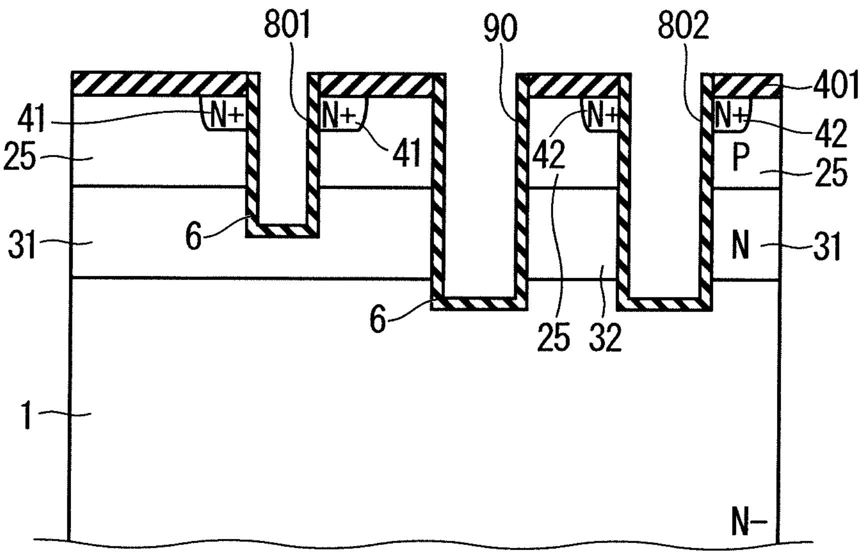

The dielectric film 6 is formed on the portions of the semiconductor layers 41, 25, and 31 exposed at the inner wall of the trench 801 and the portions of the semiconductor substrate 1 and the semiconductor layers 42, 25, 31, and 32 exposed at the inner walls of the trenches 802 and 90 (FIG. 40). Thermal oxidation is used for formation of the dielectric film 6, for example.

Figure 41:
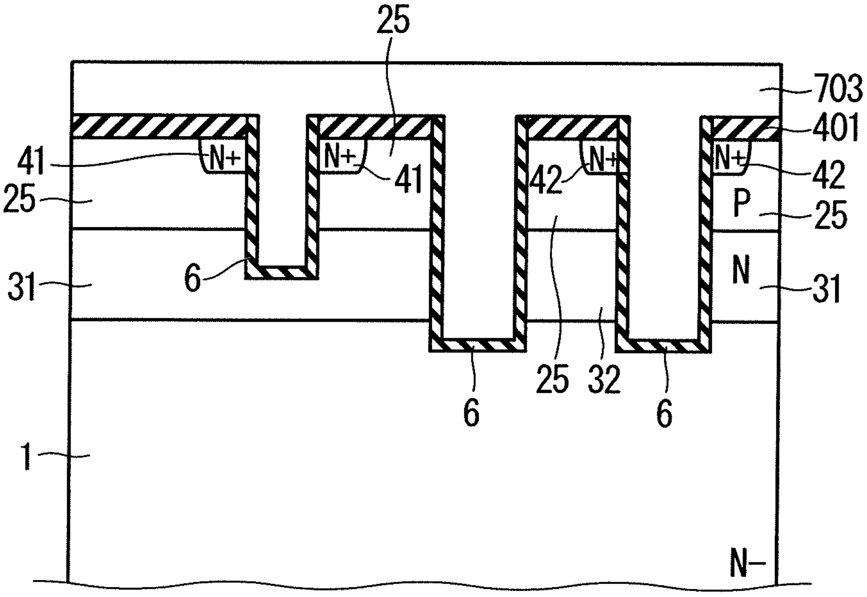

A conductor 703 is provided on an opposite side of the dielectric film 6 in the trenches 90, 801, and 802 and the dielectric film 401 from the semiconductor substrate 1 (FIG. 41). The trenches 90, 801, and 802 are each filled with the dielectric film 6 and the conductor 703. Polysilicon doped at a high impurity concentration is used as the conductor 703, for example.

The conductor 703 remains only in the trenches 90, 801, and 802 as the conductor 7 by etch-back from an opposite side from the semiconductor substrate 1. Surfaces of the conductor 703 exposed in the trenches 90, 801, and 802 are then oxidized, for example, by oxidation processing to obtain the trench electrodes 9, 81, and 82. A structure in which the dielectric film 602 in FIG. 37 has been replaced with the dielectric film 401 can thereby be obtained. It can be said that the trench electrodes 81, 82, and 9 are embedded in the respective trenches 801, 802, and 90 in view of such manufacturing steps.

In the second method of manufacturing, formation of the trenches 90, 801, and 802 may precede formation of the semiconductor layers 41 and 42.

<Method of Manufacturing Semiconductor Device 100B>

The semiconductor device 100B according to Embodiment 2 differs from the semiconductor device 100A in that the semiconductor layer 42 is not present. The method of manufacturing the semiconductor device 100B differs from the first method of manufacturing the semiconductor device 100A in that the mask 501 does not have the opening 501*b*. Due to the absence of the opening 501*b*, the semiconductor layer 41 is formed, but the semiconductor layer 42 is not formed when the N type impurities are introduced and the drive-in is performed.

<First Method of Manufacturing Semiconductor Device 100D>

FIGS. 43 to 47 are cross-sectional views illustrating part of a first method of manufacturing the semiconductor device 100D according to Embodiment 4, in particular, steps of manufacturing the semiconductor layers 31 and 32 in order of the steps. As will be described below, description on the manufacturing method can be incorporated into description of the methods of manufacturing the semiconductor device 100A according to Embodiment 1, the semiconductor device 100B according to Embodiment 2, and the semiconductor device 100C according to Embodiment 3.

FIGS. 43 to 47 illustrate formation of the semiconductor layer 31 on a left side of a break line and formation of the semiconductor layer 32 on a right side of the break line.

Figure 43:
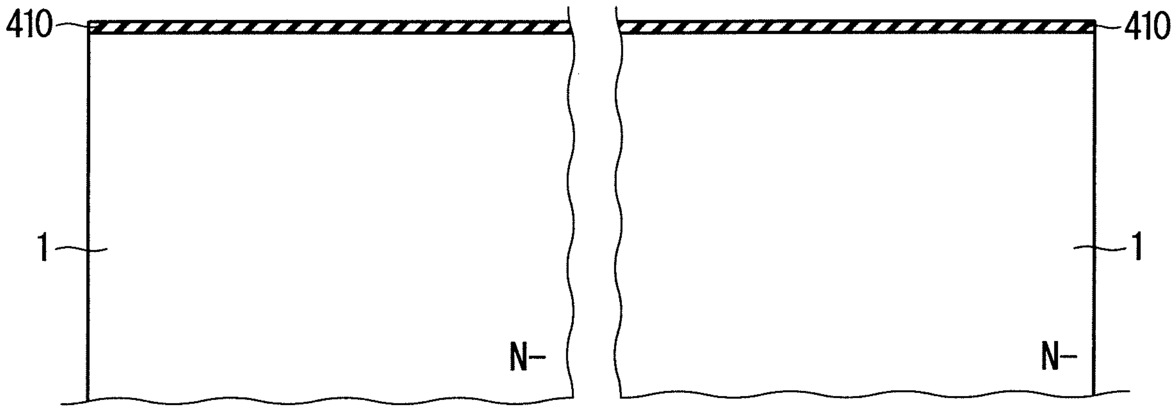
FIGS. 43 to 47 are cross-sectional views illustrating part of a first method of manufacturing the semiconductor device according to Embodiment 4 in order of steps.

A dielectric film 410 is provided on a main surface of the semiconductor substrate 1 (FIG. 43). When silicon is used for the semiconductor substrate 1, for example, the dielectric film 410 is achieved by a silicon oxide film obtained by oxidizing the main surface of the semiconductor substrate 1.

Figure 44:
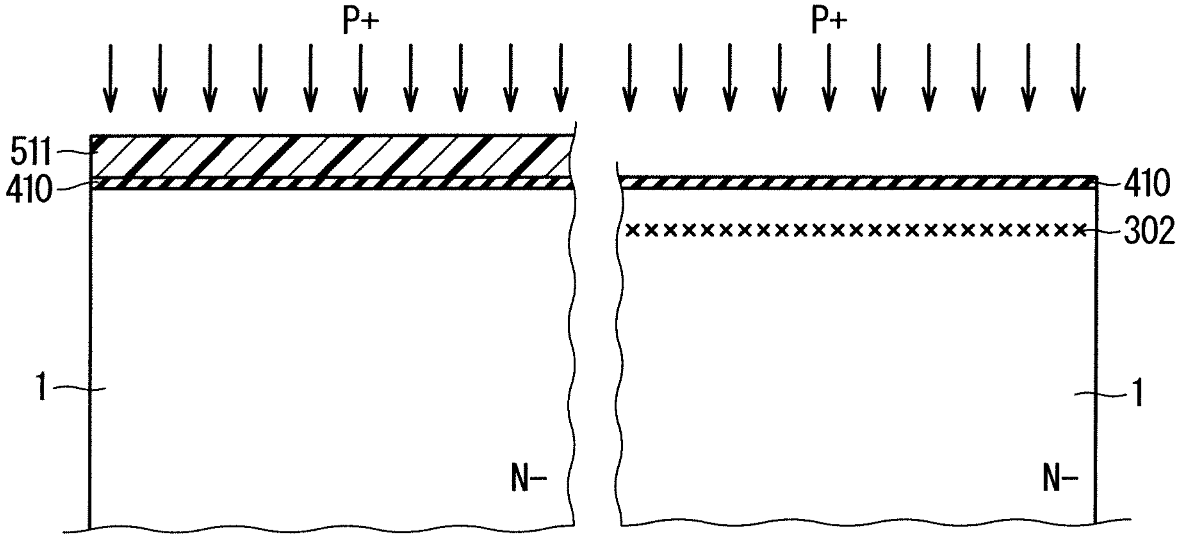

A mask 511 selectively covers the dielectric film 410 (FIG. 44). The mask 511 covers the dielectric film 410 in a region in which the semiconductor layer 31 is formed later while avoiding a region in which the semiconductor layer 32 is formed later. It can be said that the dielectric film 410 is covered with the mask 511 opening in the region in which the semiconductor layer 32 is formed later.

A patterned photoresist film is used as the mask 511, for example. The N type impurities are introduced into the semiconductor substrate 1 via the dielectric film 410 and the mask 511 opening as described above. As the N type impurities, phosphorus (P) is introduced, for example.

FIG. 44 illustrates a case where ion implantation using phosphorus ions (P+: a sign "+" herein does not indicate the magnitude of the impurity concentration but indicates that the ions are positive ions) is used in introduction of the N type impurities.

Cross signs in the semiconductor substrate 1 schematically show positions at which the N type impurities are introduced. FIG. 44 shows a region 302 into which the N type impurities are introduced.

Figure 45:
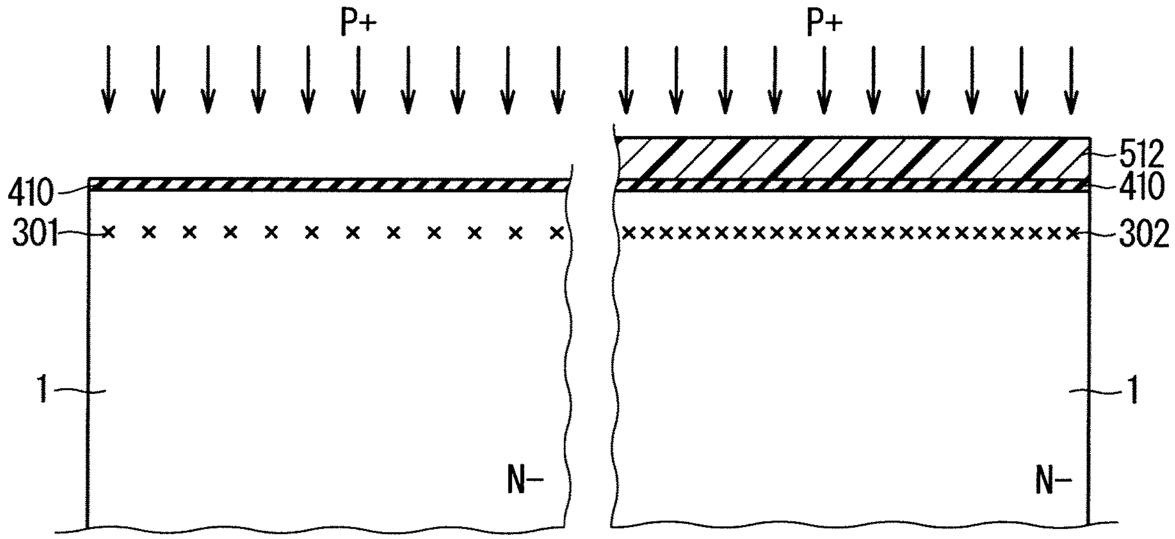

After the mask 511 is removed by known technology, a mask 512 selectively covers the dielectric film 410 (FIG. 45). The mask 512 covers the dielectric film 410 in the region in which the semiconductor layer 32 is formed later while avoiding the region in which the semiconductor layer 31 is formed later. It can be said that the dielectric film 410 is covered with the mask 512 opening in the region in which the semiconductor layer 31 is formed later.

A patterned photoresist film is also used as the mask 512, for example. The N type impurities are introduced into the semiconductor substrate 1 via the dielectric film 410 and the mask 512 opening as described above. As the N type impurities, phosphorus (P) is introduced, for example.

FIG. 45 illustrates a case where ion implantation using phosphorus ions is used in introduction of the N type impurities. FIG. 45 shows a region 301 into which the N type impurities are introduced.

In the semiconductor device 100D, the semiconductor layer 31 has a lower peak impurity concentration, for example, a lower peak concentration than the semiconductor layer 32. As one scheme of obtaining the semiconductor layers 31 and 32 differing in peak impurity concentration as described above, the N type impurities are introduced into the regions 302 and 301 respectively using the masks 511 and 512 as described above.

FIG. 45 schematically shows that an introduction amount at the peak N type impurity concentration is greater in the region 302 than in the region 301 by arranging cross signs more densely in the region 302 than in the region 301.

Figure 46:
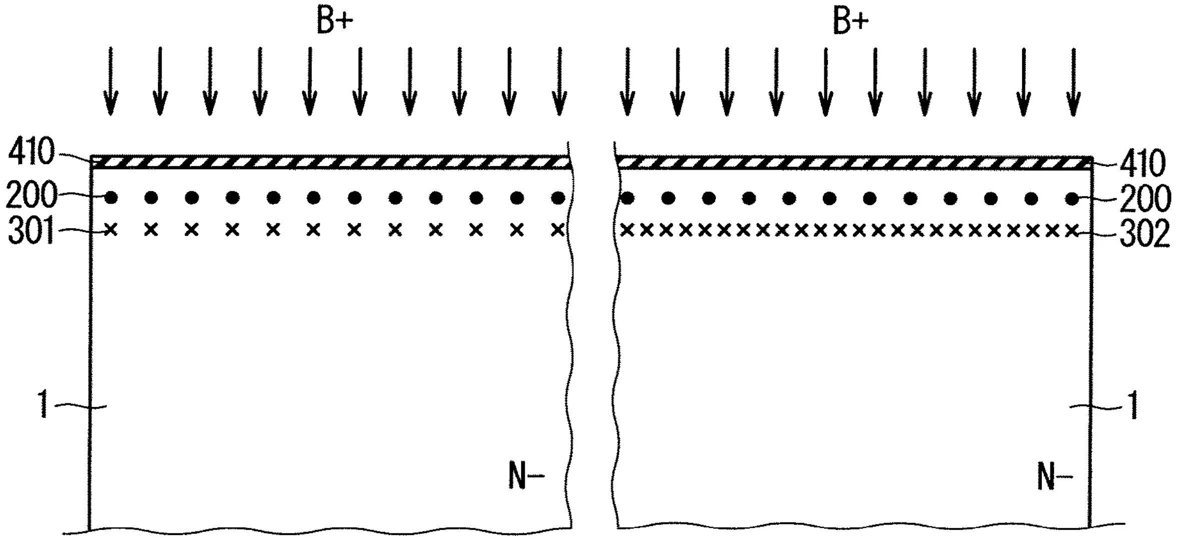

After the mask 512 is removed, P type impurities are introduced into the semiconductor substrate 1 via the dielectric film 410 (FIG. 46). More specifically, the P type impurities are introduced via an unillustrated mask opening in a region in which the semiconductor layer 2 is formed later.

As the P type impurities, boron (B) is introduced, for example. FIG. 46 illustrates a case where ion implantation using boron ions (B+: a sign "+" herein does not indicate the magnitude of the impurity concentration but indicates that the ions are positive ions) is used in introduction of the P type impurities.

Black dot signs in the semiconductor substrate 1 schematically show positions at which the P type impurities are introduced. FIG. 46 shows a region 200 into which the P type impurities are introduced on a side of the dielectric film 410 of each of the regions 301 and 302.

Figure 47:
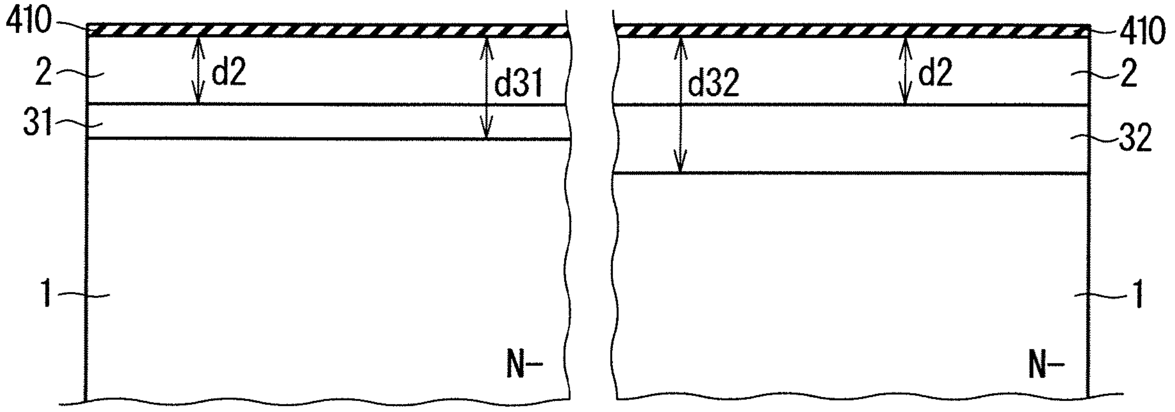

After introduction of the P type impurities into the semiconductor substrate 1, the semiconductor layers 2, 31, and 32 are obtained by the drive-in. The P type impurities are introduced into the region 200 independently of positions of the regions 301 and 302. The semiconductor layer 2 is attributable to the P type impurities introduced into the region 200. The semiconductor layer 2 is formed on a side of the dielectric film 410 of each of the semiconductor layers 31 and 32 to have the depth d2 (FIG. 47).

The N type impurities introduced into the region 301 have a lower concentration than the N type impurities introduced into the region 302. The N type impurities introduced into the region 301 and the N type impurities introduced into the region 302 are subjected to the drive-in in parallel to respectively form the semiconductor layers 31 and 32. Reflecting the above-mentioned magnitude of the peak impurity concentration, the depth d31 of the semiconductor layer 31 is smaller than the depth d32 of the semiconductor layer 32 (d31<d32: see also FIG. 24).

A step of forming the semiconductor layers 31 and 32 can be described by being roughly divided into an introduction step and a diffusion step as follows:

prior to formation of the semiconductor layers 31 and 32, the N type impurities are introduced into the region 301 of the semiconductor substrate 1 in a first introduction amount and into the region 302 of the semiconductor substrate 1 in a second introduction amount greater than the first introduction amount (introduction step); and the N type impurities introduced into the region 301 and the N type impurities introduced into the region 302 are diffused in parallel to form the semiconductor layers 31 and 32 (diffusion step).

The semiconductor layer 5 is then formed by a known scheme, and the semiconductor layers 41 and 42 and the trench electrodes 81, 82, and 9 are formed by a method similar to the first and second methods of manufacturing the semiconductor device 100A and the method of manufacturing the semiconductor device 100B to obtain the semiconductor device 100D.

The P type impurities may be introduced prior to introduction of the N type impurities.

When each of the semiconductor devices 100A and 100B is manufactured, the semiconductor layer 2 shown collectively with the semiconductor layer 5 as the semiconductor layer 25 and the semiconductor layer 3 are formed in the steps illustrated in FIGS. 43 to 47, for example. In a case where the peak impurity concentrations of the semiconductor layers 31 and 32 match each other in the semiconductor device 100A, for example, the N type impurities are not required to be introduced in two divided stages using the masks 511 and 512 (see FIGS. 44 and 45). For example, similarly to introduction of the P type impurities (see FIG. 46), the N type impurities are introduced into the regions 301 and 302 in parallel using a mask opening in a region in which the semiconductor layer 3 is to be formed.

In the semiconductor device 100C, the semiconductor layer 31 is considered as a portion of the semiconductor substrate 1. When the semiconductor device 100C is manufactured, the N type impurities in the region 301 are not needed. In this case, introduction of the N type impurities using the mask 512 is not needed. In manufacturing of the semiconductor device 100C, processing is simplified compared with that in manufacturing of the semiconductor devices 100A, 100B, and 100D.

<Second Method of Manufacturing Semiconductor Device 100D>

Figure 48:
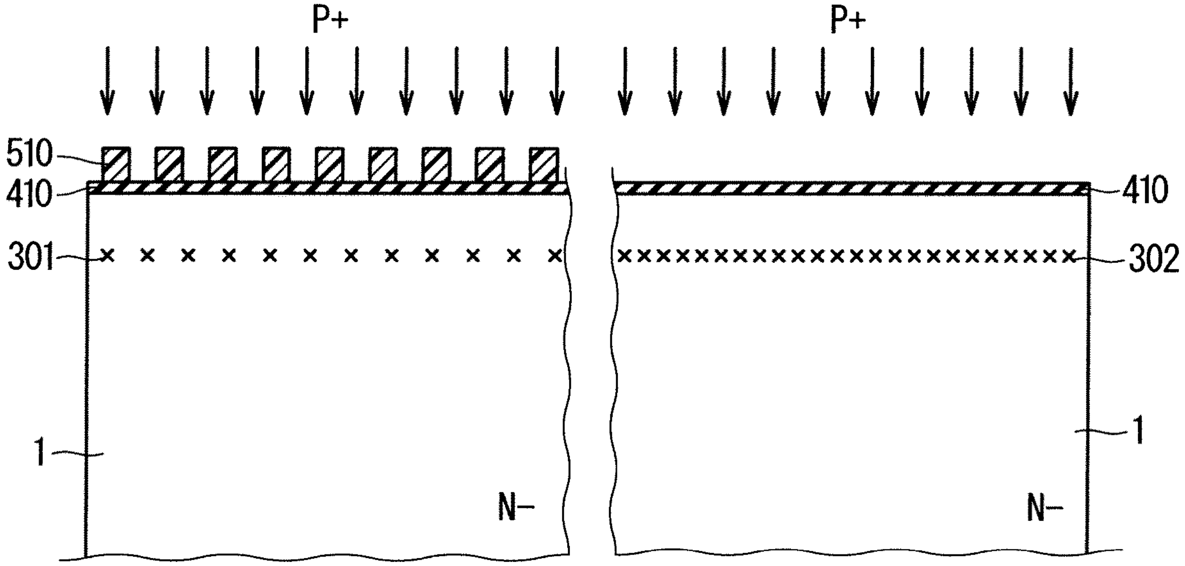
FIG. 48 is a cross-sectional view illustrating part of a second method of manufacturing the semiconductor device according to Embodiment 4.

FIG. 48 is a cross-sectional view illustrating part of a second method of manufacturing the semiconductor device 100D, in particular, part of the steps of manufacturing the semiconductor layers 31 and 32.

In the second method of manufacturing the semiconductor device 100D, the dielectric film 410 is provided on the semiconductor substrate 1 similarly to the first method of manufacturing the semiconductor device 100D (see FIG. 43).

A mask 510 selectively covers the dielectric film 410. As with the mask 511 (see FIG. 44), the mask 510 covers the dielectric film 410 in the region in which the semiconductor layer 31 is formed later while avoiding the region in which the semiconductor layer 32 is formed later. It can be said that the dielectric film 410 is covered with the mask 510 opening in the region in which the semiconductor layer 32 is formed later.

The mask 510, however, has a lower capability of inhibiting introduction of the N type impurities than the mask 511. For example, the mask 510 has a stripe pattern or a dot pattern in the region in which the semiconductor layer 31 is formed later.

A patterned photoresist film is used as the mask 510, for example. The N type impurities are introduced into the semiconductor substrate 1 via the dielectric film 410 and the mask 510 opening as described above. As the N type impurities, phosphorus (P) is introduced, for example.

The N type impurities are introduced into the region 301 via the stripe pattern or the dot pattern of the mask 510 in a smaller introduction amount than that into the region 302. The N type impurities are introduced into the region 302 not covered with the mask 510 in a greater introduction amount than that into the region 301. In FIG. 48, the density of cross signs schematically shows an introduction amount of the N type impurities as in FIG. 45.

The N type impurities are introduced into the regions 301 and 302 in parallel using the mask 510, and the regions 301 and 302 differ in introduction amount. An effective implantation amount of the N type impurities introduced into the region 301 is smaller than that into the region 302.

After introduction of the N type impurities into the regions 301 and 302, the P type impurities are introduced as illustrated in FIG. 46. After introduction of the P type impurities, a structure illustrated in FIG. 47 is obtained by the drive-in. Subsequent processing is performed as in the first method of manufacturing the semiconductor device 100D.

In view of the "introduction step" described already, in the introduction step, the N type impurities are introduced into the region 301 and the region 302 in parallel by ion implantation using the mask 510 having the stripe pattern or the dot pattern.

The second method of manufacturing the semiconductor device 100D includes a smaller number of steps of introducing the N type impurities than the first method of manufacturing the semiconductor device 100D, contributing to simplification of the steps of manufacturing the semiconductor device 100D. Simplification of the manufacturing steps contributes to reduction in cost of manufacturing the semiconductor device 100D.

Embodiment 5

In description of <Spacing between Trench Electrodes 81, 82, and 9> above, the spacing between the trench electrode 82 and the trench electrode 9 adjacent to each other along the direction in which they are arranged and the spacing between the trench electrodes 9 adjacent to each other via the trench electrode 81 are shown as examples of the trench spacing. The emitter regions are not shared between the trench electrodes 81 and 82.

When the semiconductor layer 31 that the trench electrode 81 is opposite and the semiconductor layer 32 that the trench electrode 82 is opposite are separated by a plurality of trench electrodes 9, the increase in forward conduction loss due to expansion of the depletion layer is suppressed, and further the allowable range of the time difference dt to reduce loss increases.

Figure 49:
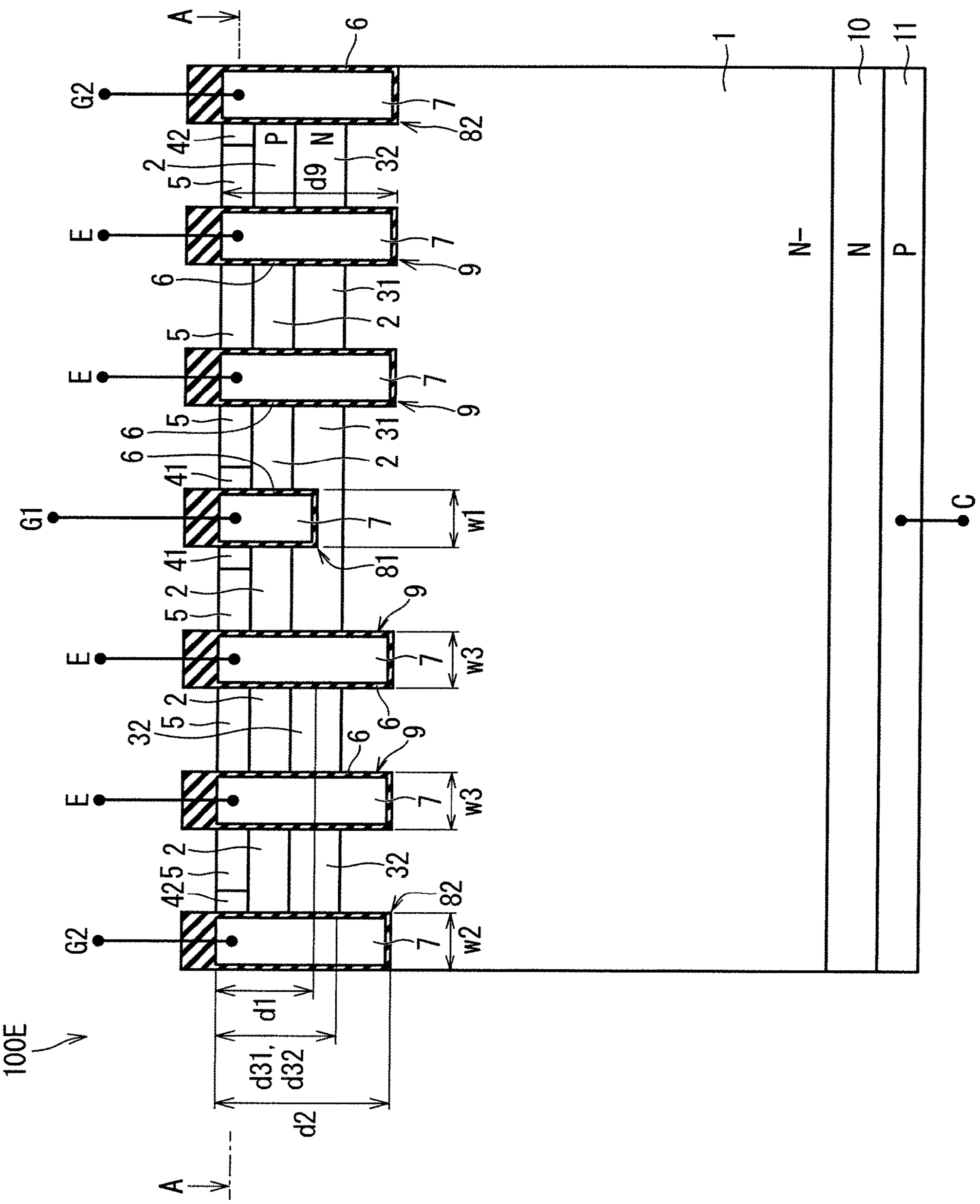
FIG. 49 is a cross-sectional view illustrating one example of a configuration of a semiconductor device according to Embodiment 5.
Figure 50:
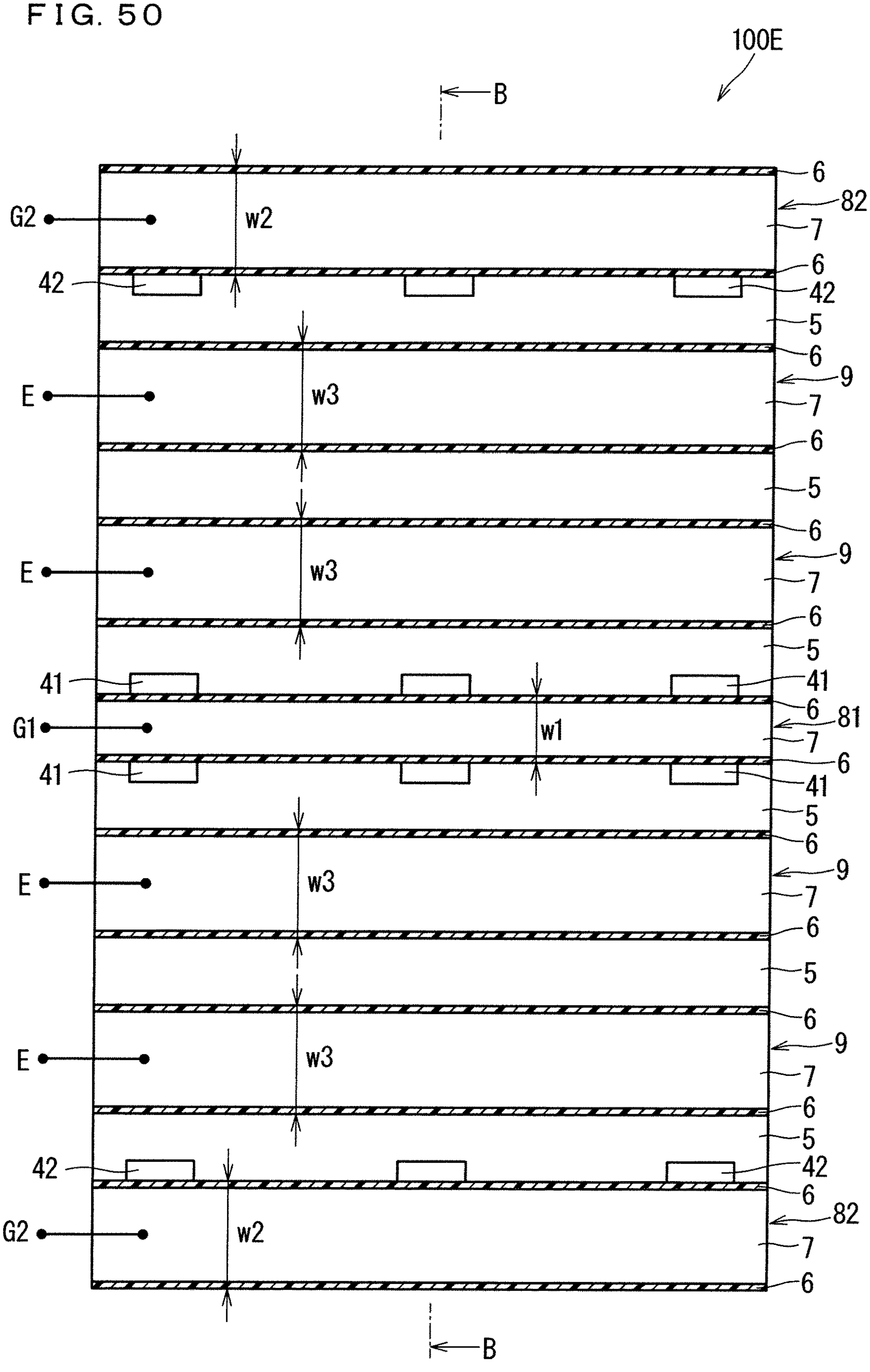
FIG. 50 is a cross-sectional view illustrating another example of the configuration of the semiconductor device according to Embodiment 5.

FIG. 49 is a cross-sectional view illustrating a configuration of a semiconductor device 100E according to Embodiment 5. FIG. 50 is a cross-sectional view illustrating one example of the configuration of the semiconductor device 100E, and FIG. 51 is a cross-sectional view illustrating another example of the configuration of the semiconductor device 100E.

Figure 51:
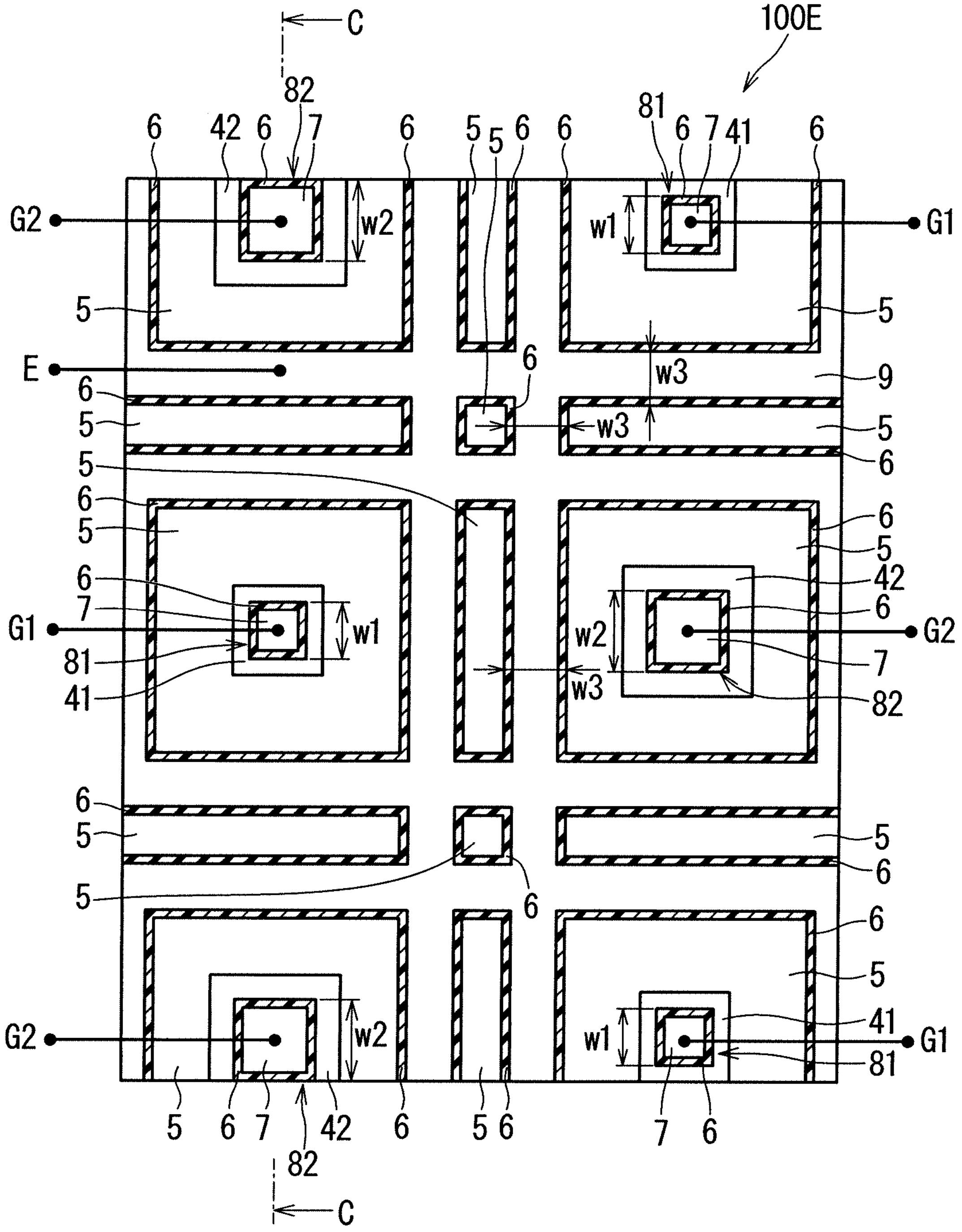
FIG. 51 is a cross-sectional view illustrating yet another example of the configuration of the semiconductor device according to Embodiment 5.

A cross section illustrated in FIG. 50 and a cross section illustrated in FIG. 51 are each taken along the line AA of FIG. 49. A cross section illustrated in FIG. 49 is a cross section taken along the line BB of FIG. 50 and is a cross section taken along the line CC of FIG. 51. The configuration illustrated in FIG. 50 contributes to suppression of multilayering of wiring including polysilicon, for example, and further to improvement in productivity.

It is understood that the semiconductor device 100E has a configuration in which the trench electrode 9 is divided into two trench electrodes 9 in a direction in which the trench electrodes 81 and 82 are arranged compared with the semiconductor device 100A (see FIGS. 1, 2, and 3). Between the two trench electrodes 9 resulting from the division, the semiconductor layers 31, 2, and 5 are stacked in this order as viewed from a side of the semiconductor substrate 1, and the semiconductor layers 41 and 42 are not present.

Spacing between the trench electrodes 9 adjacent to each other not via the trench electrode 81 as in the semiconductor device 100E is also considered to correspond to the trench spacing. In view of FIG. 25 and description with reference to FIG. 25, spacing between the adjacent trench electrodes 9 of the semiconductor device 100E of less than 15 μm contributes to the breakdown voltage of the semiconductor device 100E that is 90% or more of the target breakdown voltage.

The semiconductor device 100E can be manufactured similarly to the semiconductor device 100A. Specifically, a plurality of openings 503*a* (see FIG. 33) are formed in the mask 503 in the first method of manufacturing the semiconductor device 100A to be closer to the trench electrode 81 than the opening 503*b* is. Alternatively, a plurality of openings 502*b* (see FIG. 38) are formed in the mask 502 in the second method of manufacturing the semiconductor device 100A to be located between the openings 502*a* and 502*c*.

In the semiconductor device 100E, the semiconductor layer 31 may have a lower peak impurity concentration than the semiconductor layer 32 as in the semiconductor device 100D. Furthermore, the semiconductor layer 31 may be thinner than the semiconductor layer 32, and the relationship expressed by the inequality d31<d32 may be satisfied. The semiconductor device 100E in this case can be manufactured similarly to the semiconductor device 100D, for example. Specifically, the first and second methods of manufacturing the semiconductor device 100D are applicable, for example.

Embodiment 6

The emitter regions are not shared between the trench electrodes 81 and 82 also when a plurality of trench electrodes 82 are sandwiched by a pair of trench electrodes 9. The increase in forward conduction loss due to expansion of the depletion layer is suppressed, and further the allowable range of the time difference dt to reduce loss increases.

Figure 52:
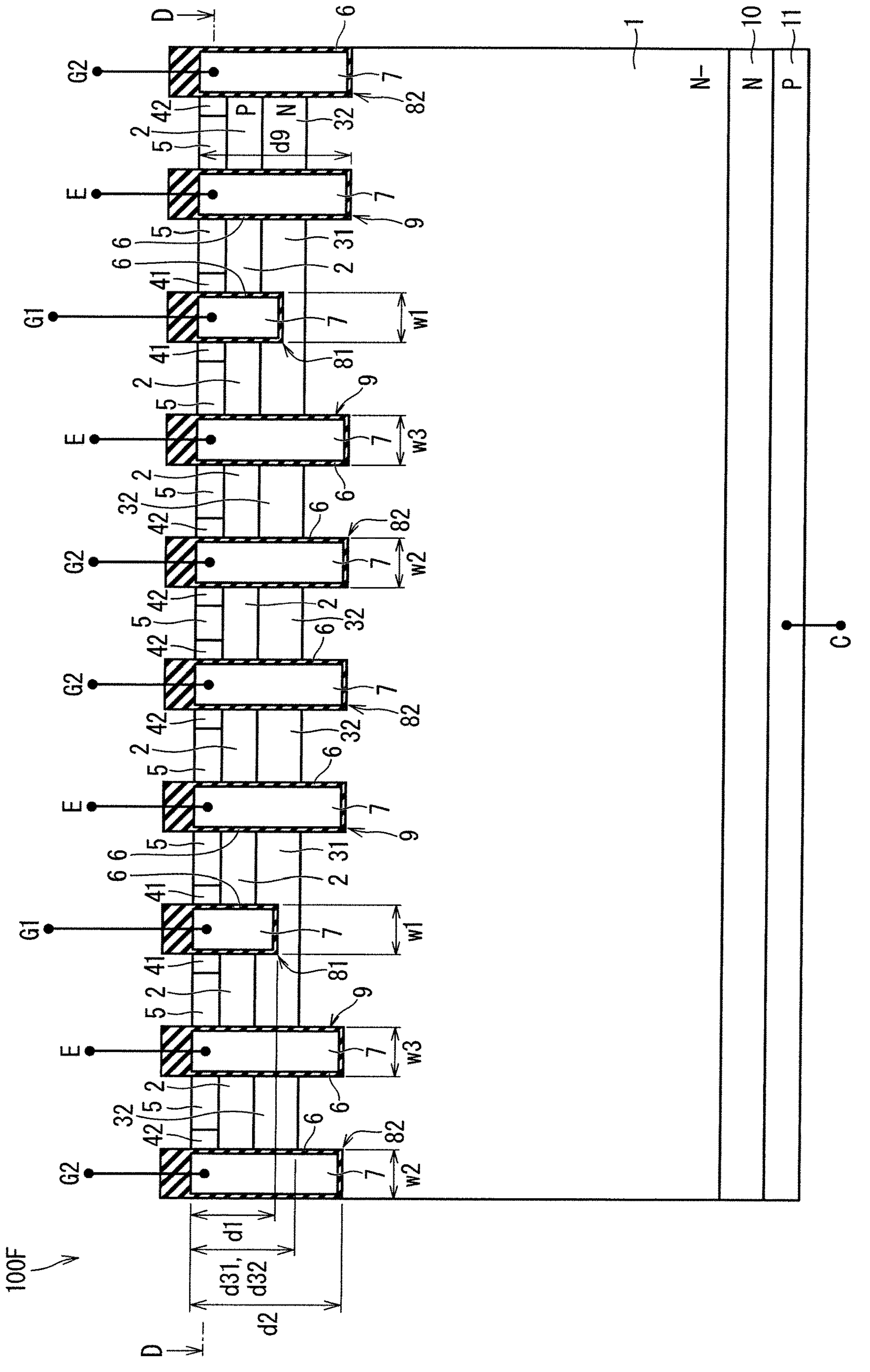
FIG. 52 is a cross-sectional view illustrating one example of a configuration of a semiconductor device according to Embodiment 6.
Figure 53:
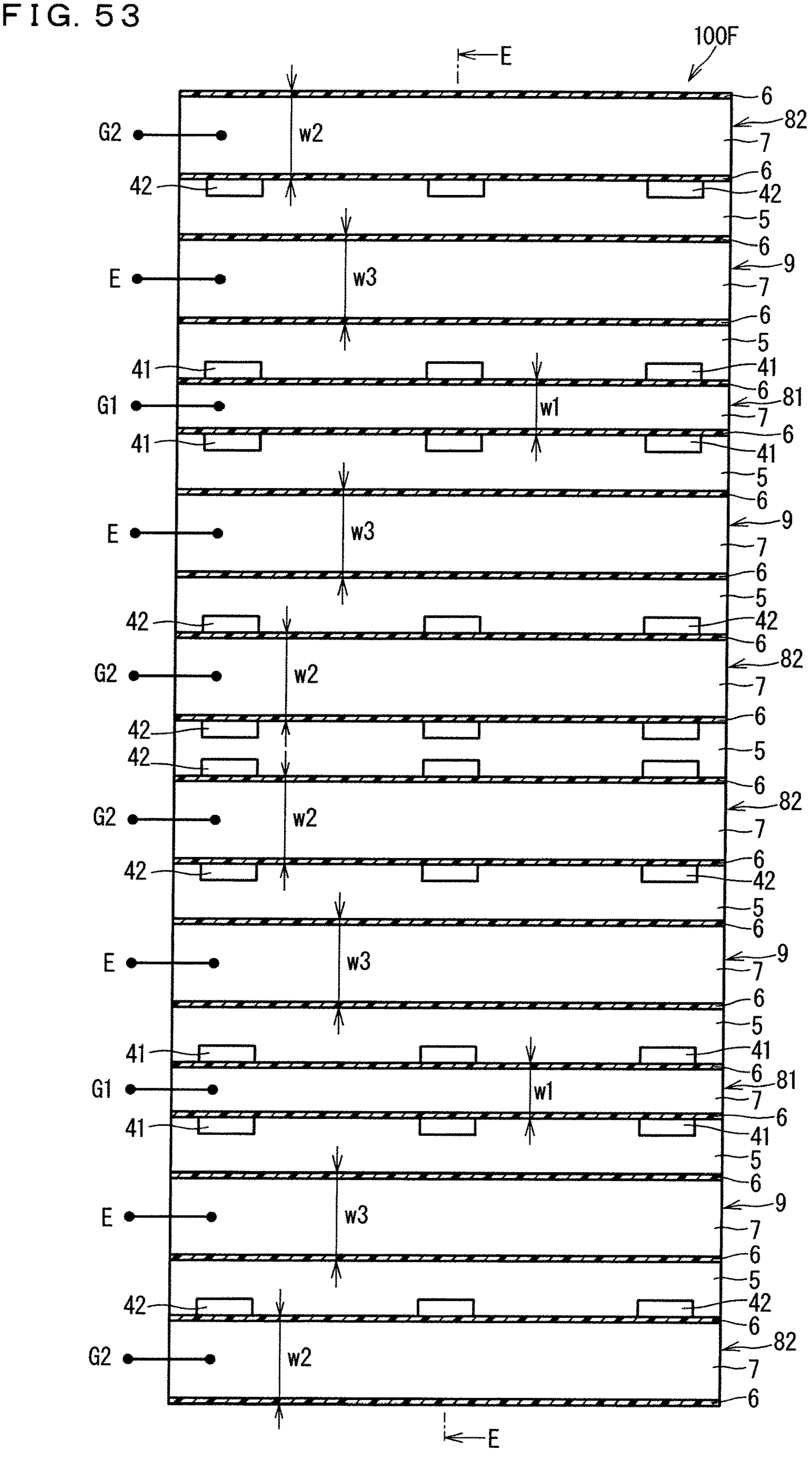
FIG. 53 is a cross-sectional view illustrating another example of the configuration of the semiconductor device according to Embodiment 6.

FIG. 52 is a cross-sectional view illustrating a configuration of a semiconductor device 100F according to Embodiment 6. FIG. 53 is a cross-sectional view illustrating one example of the configuration of the semiconductor device 100F, and FIG. 54 is a cross-sectional view illustrating another example of the configuration of the semiconductor device 100F.

Figure 54:
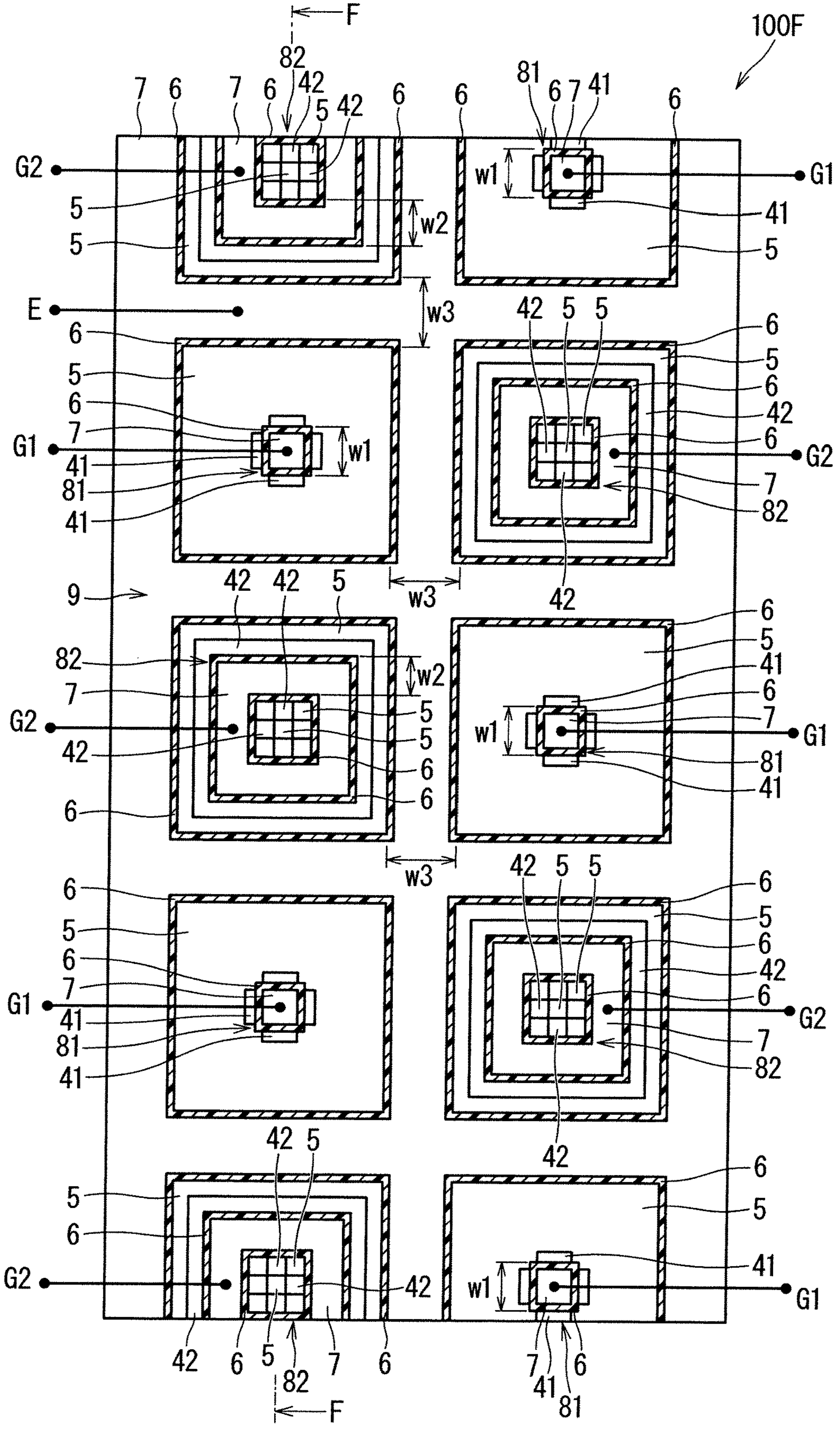
FIG. 54 is a cross-sectional view illustrating yet another example of the configuration of the semiconductor device according to Embodiment 6.

A cross section illustrated in FIG. 53 and a cross section illustrated in FIG. 54 are each taken along the line DD of FIG. 52. A cross section illustrated in FIG. 52 is a cross section taken along the line EE of FIG. 53 and is a cross section taken along the line FF of FIG. 54. The configuration illustrated in FIG. 53 contributes to suppression of multilayering of wiring including polysilicon, for example, and further to improvement in productivity.

It is understood that the semiconductor device 100F has a configuration in which two trench electrodes 82 are provided in a direction in which the trench electrodes 81 and 9 are arranged compared with the semiconductor device 100A (see FIGS. 1, 2, and 3). On both sides of each of the trench electrodes 82 in the arrangement direction, the semiconductor layers 32, 2, and 5 are stacked in this order as viewed from a side of the semiconductor substrate 1. On both sides of each of the trench electrodes 82 in the arrangement direction, the semiconductor layer 42 is present closer to the trench electrode 82 than the semiconductor layer 5 is.

Spacing between the trench electrodes 82 adjacent to each other via neither the trench electrode 81 nor the trench electrode 9 as in the semiconductor device 100F is also considered to correspond to the trench spacing. In view of FIG. 25 and description with reference to FIG. 25, spacing between the adjacent trench electrodes 82 of the semiconductor device 100F of less than 15 μm contributes to the breakdown voltage of the semiconductor device 100F that is 90% or more of the target breakdown voltage.

The semiconductor device 100F can be manufactured similarly to the semiconductor device 100A. Specifically, with reference FIG. 33, a pair of adjacent semiconductor layers 42 is provided in the first method of manufacturing the semiconductor device 100A, and the opening 503*b* of the mask 503 is formed for each of the semiconductor layers 42. Alternatively, with reference FIG. 38, a pair of adjacent semiconductor layers 42 is provided in the second method of manufacturing the semiconductor device 100A, and the opening 502*c* of the mask 502 is formed for each of the semiconductor layers 42.

In the semiconductor device 100F, the semiconductor layer 31 may have a lower peak impurity concentration than the semiconductor layer 32 as in the semiconductor device 100D. Furthermore, the semiconductor layer 31 may be thinner than the semiconductor layer 32, and the relationship expressed by the inequality d31<d32 may be satisfied. The semiconductor device 100F in this case can be manufactured similarly to the semiconductor device 100D, for example. Specifically, the first and second methods of manufacturing the semiconductor device 100D are applicable, for example.

Any technology described above can be used for a reverse conducting IGBT (an RC-IGBT).

Embodiments of the present invention can freely be combined with each other and can be modified or omitted as appropriate within the scope of the present invention.

Various aspects of the present disclosure will collectively be described below as appendices.

APPENDIX 1

A semiconductor device comprising:

- a semiconductor substrate of a first conductivity type;
- a first semiconductor layer of the first conductivity type located in a surface layer of the semiconductor substrate;
- a second semiconductor layer of the first conductivity type located in the surface layer of the semiconductor substrate to be excluded from the first semiconductor layer, the second semiconductor layer having a higher peak impurity concentration than the semiconductor substrate;
- a third semiconductor layer of a second conductivity type located on an opposite side of the first semiconductor layer and the second semiconductor layer from the semiconductor substrate;
- a fourth semiconductor layer of the second conductivity type selectively located on an opposite side of the third semiconductor layer from the semiconductor substrate, the fourth semiconductor layer having a higher peak impurity concentration than the third semiconductor layer;
- a fifth semiconductor layer of the first conductivity type located on an opposite side of the third semiconductor layer from the semiconductor substrate to be excluded from the fourth semiconductor layer, the fifth semiconductor layer having a higher peak impurity concentration than the second semiconductor layer;

- a sixth semiconductor layer of the second conductivity type located on an opposite side of the semiconductor substrate from the first semiconductor layer, the second semiconductor layer, the third semiconductor layer, the fourth semiconductor layer, and the fifth semiconductor layer;
- a first electrode extending through the fifth semiconductor layer and the third semiconductor layer to reach the first semiconductor layer at a position farther from the sixth semiconductor layer than a boundary between the second semiconductor layer and the semiconductor substrate is, the first electrode having an insulating surface;
- a second electrode extending through the second semiconductor layer, the fourth semiconductor layer, and the third semiconductor layer or through the second semiconductor layer, the fifth semiconductor layer, and the third semiconductor layer, to reach the semiconductor substrate, the second electrode being closer to the sixth semiconductor layer than the first semiconductor layer and the second semiconductor layer are, the second electrode having an insulating surface; and
- a third electrode extending through the fourth semiconductor layer and the third semiconductor layer to reach the semiconductor substrate, the third electrode being closer to the sixth semiconductor layer than the first semiconductor layer and the second semiconductor layer are, the third electrode separating the first semiconductor layer from the second semiconductor layer, the third electrode and the second electrode sandwiching the second semiconductor layer, the third electrode having an insulating surface.

APPENDIX 2

The semiconductor device according to Appendix 1, wherein the first semiconductor layer has a higher peak impurity concentration than the semiconductor substrate.

APPENDIX 3

The semiconductor device according to Appendix 2, wherein the second electrode extends through the fifth semiconductor layer and the third semiconductor layer.

APPENDIX 4

The semiconductor device according to Appendix 3, wherein the first semiconductor layer has a lower peak impurity concentration than the second semiconductor layer.

APPENDIX 5

The semiconductor device according to Appendix 4, wherein the first semiconductor layer is thinner than the second semiconductor layer.

APPENDIX 6

The semiconductor device according to Appendix 2, wherein the second electrode extends through the fourth semiconductor layer and the third semiconductor layer.

APPENDIX 7

The semiconductor device according to Appendix 1, wherein the first semiconductor layer is a portion of the semiconductor substrate.

APPENDIX 8

The semiconductor device according to Appendix 1, wherein the second electrode extends through the fifth semiconductor layer and the third semiconductor layer.

APPENDIX 9

The semiconductor device according to Appendix 1, wherein the second electrode extends through the fourth semiconductor layer and the third semiconductor layer.

APPENDIX 10

The semiconductor device according to any one of Appendices 1 to 9, wherein a length by which the second electrode protrudes from the second semiconductor layer to the semiconductor substrate in a direction of extension of the second electrode and a length by which the third electrode protrudes from the second semiconductor layer to the semiconductor substrate in a direction of extension of the third electrode are equal to each other.

APPENDIX 11

The semiconductor device according to any one of Appendices 1 to 10, wherein a size of the first electrode in a direction orthogonal to a direction of extension of the first electrode is smaller than each of a size of the second electrode in a direction orthogonal to a direction of extension of the second electrode and a size of the third electrode in a direction orthogonal to a direction of extension of the third electrode.

APPENDIX 12

The semiconductor device according to any one of Appendices 1 to 11, wherein spacing between the second electrode and the third electrode adjacent to each other, spacing between the second electrodes adjacent to each other, or spacing between the third electrodes adjacent to each other along a direction in which the second electrode and the third electrode are arranged is 15 μm or less.

APPENDIX 13

The semiconductor device according to any one of Appendices 1 to 11, wherein the third electrode is located on each of one side and the other side of the first electrode in a direction in which the first electrode and the third electrode are arranged, and spacing between the third electrode located on the one side of the first electrode and the third electrode located on the other side of the first electrode is 15 μm or less in the direction.

APPENDIX 14

A semiconductor device control method of controlling the semiconductor device according to any one of Appendices 1 to 13, wherein a first signal is provided to the first electrode, a second signal is provided to the second electrode, and when the semiconductor device is turned off by transition of each of the first signal and the second signal, the first signal transitions later than the second signal.

APPENDIX 15

The semiconductor device control method according to Appendix 14, wherein the first conductivity type is an N type, and the second signal transitions at a potential equal to or less than zero with respect to the third electrode.

APPENDIX 16

A semiconductor device manufacturing method of manufacturing the semiconductor device according to Appendix 5, wherein prior to formation of the first semiconductor layer and the second semiconductor layer, impurities of the first conductivity type are introduced into a first region of the semiconductor substrate in a first introduction amount and into a second region of the semiconductor substrate in a second introduction amount greater than the first introduction amount, and the impurities of the first conductivity type introduced into the first region and the impurities of the first conductivity type introduced into the second region are diffused in parallel to form the first semiconductor layer and the second semiconductor layer.

APPENDIX 17

The semiconductor device manufacturing method according to Appendix 16, wherein the impurities of the first conductivity type are introduced into the first region in the first introduction amount and into the second region in the second introduction amount in parallel by ion implantation using a mask having a stripe pattern or a dot pattern.

APPENDIX 18

A semiconductor device manufacturing method of manufacturing the semiconductor device according to Appendix 10, wherein prior to formation of the second electrode and the third electrode, a trench in which the second electrode is embedded and a trench in which the third electrode is embedded are formed in parallel by selective etching using an opening mask.

APPENDIX 19

A semiconductor device manufacturing method of manufacturing the semiconductor device according to Appendix 11, wherein prior to formation of the first electrode, the second electrode, and the third electrode, a first trench in which the first electrode is embedded, a second trench in which the second electrode is embedded, and a third trench in which the third electrode is embedded are formed in parallel by selective etching using an opening mask, and an opening used for etching to form the second trench and an opening used for etching to form the third trench are each wider than an opening used for etching to form the first trench.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate of a first conductivity type;

a first semiconductor layer of the first conductivity type located in a surface layer of the semiconductor substrate;

a second semiconductor layer of the first conductivity type located in the surface layer of the semiconductor substrate to be excluded from the first semiconductor layer, the second semiconductor layer having a higher peak impurity concentration than the semiconductor substrate;

a third semiconductor layer of a second conductivity type located on an opposite side of the first semiconductor layer and the second semiconductor layer from the semiconductor substrate;

a fourth semiconductor layer of the second conductivity type selectively located on an opposite side of the third semiconductor layer from the semiconductor substrate, the fourth semiconductor layer having a higher peak impurity concentration than the third semiconductor layer;

a fifth semiconductor layer of the first conductivity type located on an opposite side of the third semiconductor layer from the semiconductor substrate to be excluded from the fourth semiconductor layer, the fifth semiconductor layer having a higher peak impurity concentration than the second semiconductor layer;

a sixth semiconductor layer of the second conductivity type located on an opposite side of the semiconductor substrate from the first semiconductor layer, the second semiconductor layer, the third semiconductor layer, the fourth semiconductor layer, and the fifth semiconductor layer;

a first electrode extending through the fifth semiconductor layer and the third semiconductor layer to reach the first semiconductor layer at a position farther from the sixth semiconductor layer than a boundary between the second semiconductor layer and the semiconductor substrate is, the first electrode having an insulating surface;

a second electrode extending through the second semiconductor layer, the fourth semiconductor layer, and the third semiconductor layer or through the second semiconductor layer, the fifth semiconductor layer, and the third semiconductor layer, to reach the semiconductor substrate, the second electrode being closer to the sixth semiconductor layer than the first semiconductor layer and the second semiconductor layer are, the second electrode having an insulating surface; and a third electrode extending through the fourth semiconductor layer and the third semiconductor layer to reach the semiconductor substrate, the third electrode being closer to the sixth semiconductor layer than the first semiconductor layer and the second semiconductor layer are, the third electrode separating the first semiconductor layer from the second semiconductor layer, the third electrode and the second electrode sandwiching the second semiconductor layer, the third electrode having an insulating surface.

2. The semiconductor device according to claim 1, wherein the first semiconductor layer has a higher peak impurity concentration than the semiconductor substrate.

3. The semiconductor device according to claim 2, wherein the second electrode extends through the fifth semiconductor layer and the third semiconductor layer.

4. The semiconductor device according to claim 3, wherein the first semiconductor layer has a lower peak impurity concentration than the second semiconductor layer.

5. The semiconductor device according to claim 4, wherein the first semiconductor layer is thinner than the second semiconductor layer.

6. The semiconductor device according to claim 2, wherein the second electrode extends through the fourth semiconductor layer and the third semiconductor layer.

7. The semiconductor device according to claim 1, wherein the first semiconductor layer is a portion of the semiconductor substrate.

8. The semiconductor device according to claim 1, wherein the second electrode extends through the fifth semiconductor layer and the third semiconductor layer.

9. The semiconductor device according to claim 1, wherein the second electrode extends through the fourth semiconductor layer and the third semiconductor layer.

10. The semiconductor device according to claim 1, wherein a length by which the second electrode protrudes from the second semiconductor layer to the semiconductor substrate in a direction of extension of the second electrode and a length by which the third electrode protrudes from the second semiconductor layer to the semiconductor substrate in a direction of extension of the third electrode are equal to each other.

11. The semiconductor device according to claim 1, wherein a size of the first electrode in a direction orthogonal to a direction of extension of the first electrode is smaller than each of a size of the second electrode in a direction orthogonal to a direction of extension of the second electrode and a size of the third electrode in a direction orthogonal to a direction of extension of the third electrode.

12. The semiconductor device according to claim 1, wherein spacing between the second electrode and the third electrode adjacent to each other, spacing between the second electrodes adjacent to each other, or spacing between the third electrodes adjacent to each other along a direction in which the second electrode and the third electrode are arranged is 15 μm or less.

13. The semiconductor device according to claim 1, wherein the third electrode is located on each of one side and the other side of the first electrode in a direction in which the first electrode and the third electrode are arranged, and spacing between the third electrode located on the one side of the first electrode and the third electrode located on the other side of the first electrode is 15 μm or less in the direction.

14. A semiconductor device control method of controlling the semiconductor device according to claim 1, wherein a first signal is provided to the first electrode, a second signal is provided to the second electrode, and when the semiconductor device is turned off by transition of each of the first signal and the second signal, the first signal transitions later than the second signal.

15. The semiconductor device control method according to claim 14, wherein the first conductivity type is an N type, and the second signal transitions at a potential equal to or less than zero with respect to the third electrode.

16. A semiconductor device manufacturing method of manufacturing the semiconductor device according to claim 5, wherein prior to formation of the first semiconductor layer and the second semiconductor layer, impurities of the first conductivity type are introduced into a first region of the semiconductor substrate in a first introduction amount and into a second region of the semiconductor substrate in a second introduction amount greater than the first introduction amount, and the impurities of the first conductivity type introduced into the first region and the impurities of the first conductivity type introduced into the second region are diffused in parallel to form the first semiconductor layer and the second semiconductor layer.

17. The semiconductor device manufacturing method according to claim 16, wherein the impurities of the first conductivity type are introduced into the first region in the first introduction amount and into the second region in the second introduction amount in parallel by ion implantation using a mask having a stripe pattern or a dot pattern.

18. A semiconductor device manufacturing method of manufacturing the semiconductor device according to claim 10, wherein prior to formation of the second electrode and the third electrode, a trench in which the second electrode is embedded and a trench in which the third electrode is embedded are formed in parallel by selective etching using an opening mask.

19. A semiconductor device manufacturing method of manufacturing the semiconductor device according to claim 11, wherein prior to formation of the first electrode, the second electrode, and the third electrode, a first trench in which the first electrode is embedded, a second trench in which the second electrode is embedded, and a third trench in which the third electrode is embedded are formed in parallel by selective etching using an opening mask, and an opening used for etching to form the second trench and an opening used for etching to form the third trench are each wider than an opening used for etching to form the first trench.

* * * * *